United States Patent [19]

Matrone et al.

[11] Patent Number: 4,850,104

[45] Date of Patent: Jul. 25, 1989

[54] SYSTEM FOR CONFIGURING, AUTOMATING AND CONTROLLING OPERATIONS PERFORMED ON PCBS AND OTHER PRODUCTS

[75] Inventors: John L. Matrone, Schenectady; Ronald L. Stamp, Averill Park; Douglas M. Babcock, Latham, all of N.Y.

[73] Assignee: CIMM, Inc., Troy, N.Y.

[21] Appl. No.: 62,509

[22] Filed: Jun. 5, 1987

Related U.S. Application Data

[63] Continuation-in-part of Ser. No. 791,874, Oct. 28, 1985, abandoned.

[51] Int. Cl.$^4$ .......................... H05K 3/00; B23P 21/00
[52] U.S. Cl. .......................................... 29/829; 29/705; 29/710; 29/741; 29/742; 198/346.1; 198/803.11; 209/573; 414/786
[58] Field of Search .................. 29/705, 710, 741, 742, 29/829; 198/341, 346.1, 801.11, 803.01; 209/573; 414/786

[56] References Cited

U.S. PATENT DOCUMENTS

| | | | |
|---|---|---|---|
| 2,896,314 | 7/1959 | Godwin et al. | 29/705 X |
| 3,997,067 | 12/1976 | Murata . | |
| 4,014,428 | 3/1977 | Ossbahr et al. | 198/345 |
| 4,291,867 | 9/1981 | Williams et al. | 269/903 X |
| 4,348,276 | 9/1982 | Tateishi et al. | 209/573 |
| 4,357,575 | 11/1982 | Uren et al. | 324/158 |
| 4,483,651 | 11/1984 | Nakake et al. | 198/341 X |
| 4,484,289 | 11/1984 | Hemond | 198/341 X |
| 4,561,819 | 12/1985 | Wiernicki . | |

FOREIGN PATENT DOCUMENTS

| | | |
|---|---|---|
| 0050014 | 4/1982 | European Pat. Off. . |
| 3040340 | 5/1982 | Fed. Rep. of Germany . |
| 2136140 | 3/1984 | United Kingdom . |
| 80/02599 | 11/1980 | World Int. Prop. O. . |

OTHER PUBLICATIONS

Ironics, Inc. product literature.
MIT Industrial Liaison Report 10-40-84 "Performance of Hierachical Production Scheduling Policy" by R. Akella et al., limited distribution Feb. 1984.
Concurrent Euclid, The UNIX System and TUNIS by R. C. Holt, 1983 pp. 1-62, pp. 5-7 and 215-221.
Bar Code Identification in Automated Testing, B. R. Wray, ATE West Proceedings, Jan. 14-17, 1985, Anaheim, CA., pp. II-1 through II-8.
Justifying the Purchase of a Factory Data Collection System, S. L. Harari & K. Nazifi, ATE West Proceedings, Jan. 14-17, 1985, Anaheim, CA. pp. V-30 through V-36.

Primary Examiner—Howard N. Goldberg
Assistant Examiner—Carl J. Arbes
Attorney, Agent, or Firm—Heslin & Rothenberg

[57] ABSTRACT

A method and apparatus for configuring, automating and controlling the various operations performed on different products, e.g. the testing and/or repair of printed circuit boards, is presented. The apparatus includes one or more work stations and conveyor units to transport products and other components required to perform the operations on such products between such stations. The products are mounted in standardized carriers which facilitate intermixing different sizes and shapes of products without requiring adjustment to the conveyor units. The other components are adapted to also be transportable by the same conveyor units. The apparatus further includes buffering stages associated with each station for temporarily storing products and other components, and a distributed control system to facilitate the parallel processing of different types of products in accordance with a dynamic priority rating system and a preemptive scheduling technique.

18 Claims, 42 Drawing Sheets

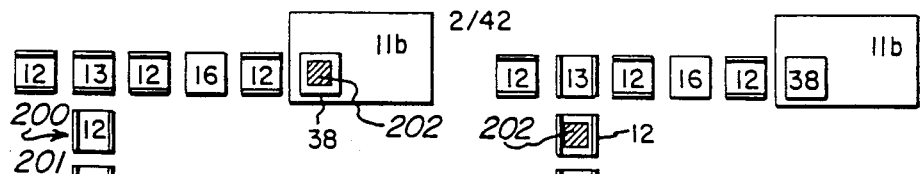
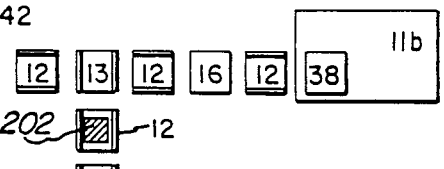
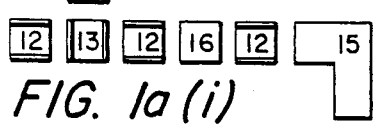
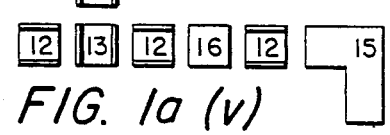
FIG. Ia(i)     FIG. Ia(v)
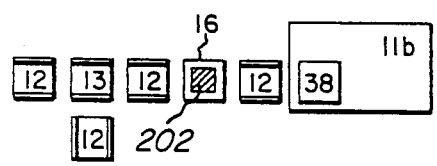
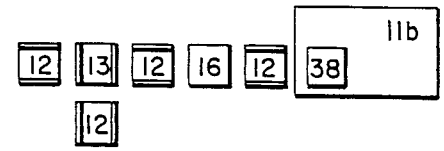
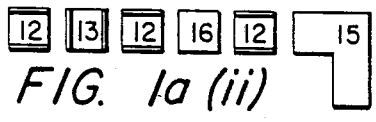
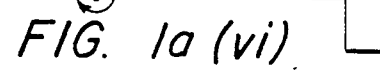
FIG. Ia(ii)     FIG. Ia(vi)
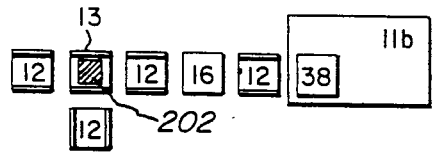
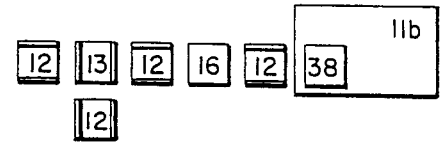
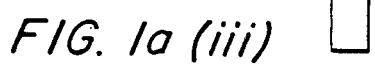
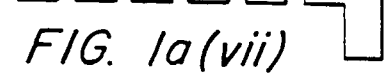
FIG. Ia(iii)     FIG. Ia(vii)
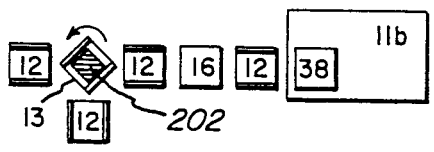
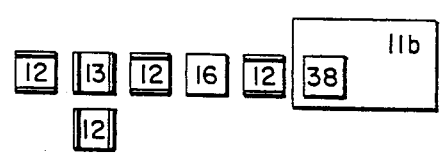
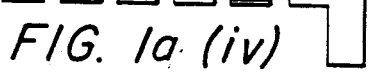
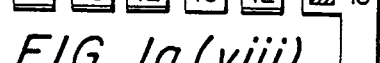
FIG. Ia(iv)     FIG. Ia(viii)

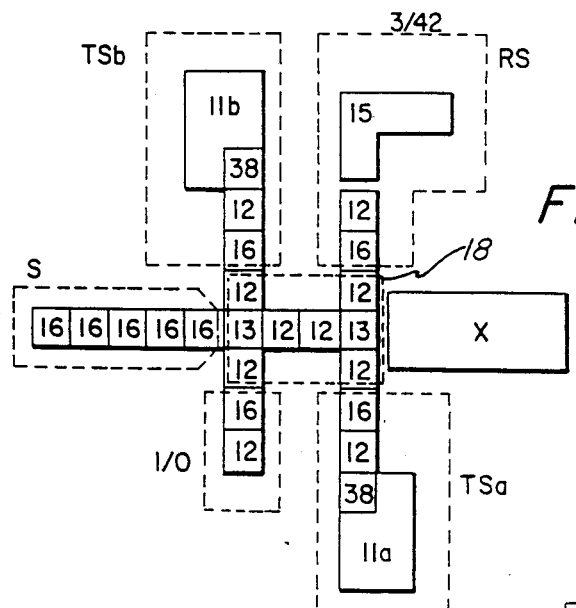
FIG. 1b (i)
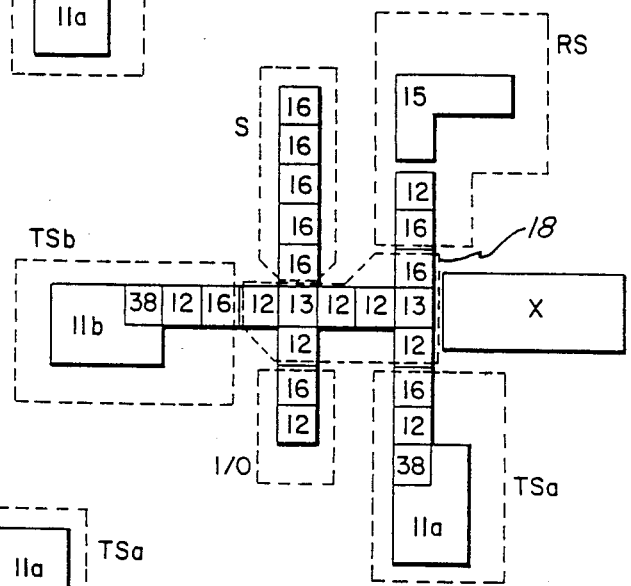
FIG. 1b (ii)
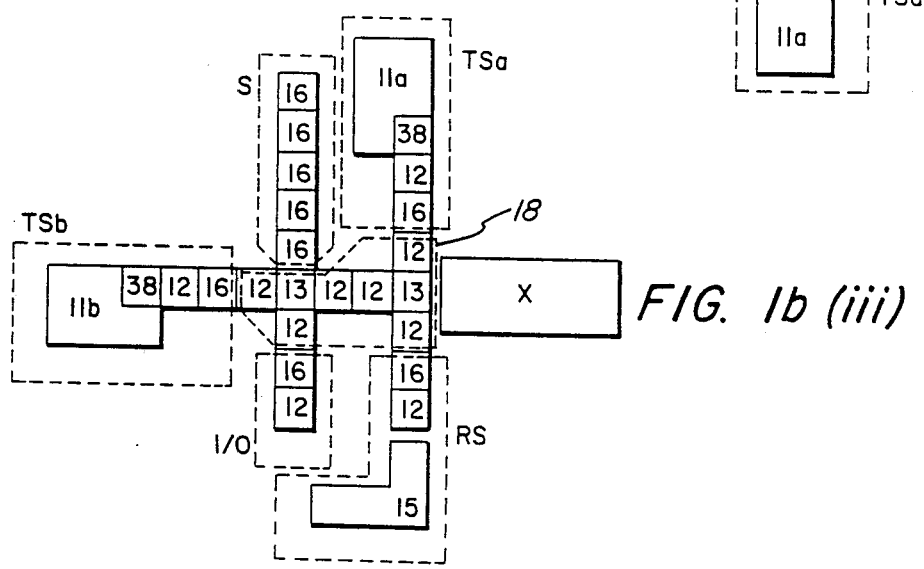
FIG. 1b (iii)

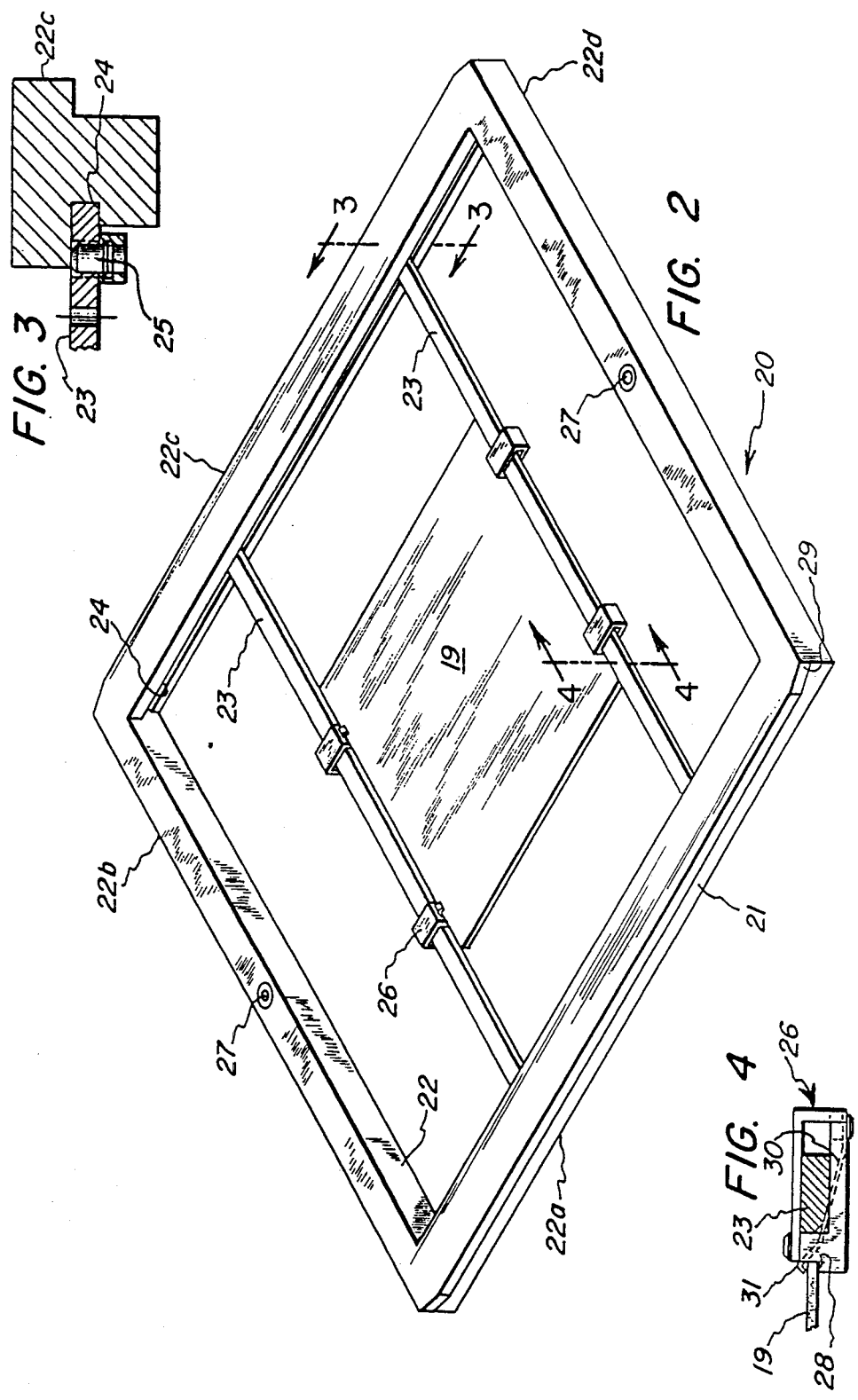

SECTION 5c—5c

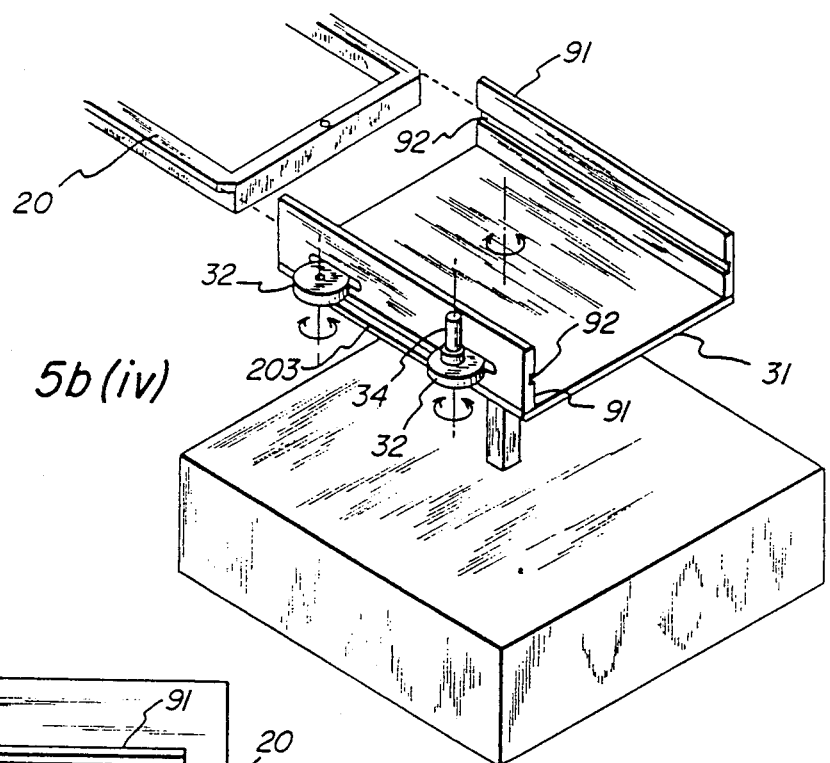
FIG. 5b(iv)
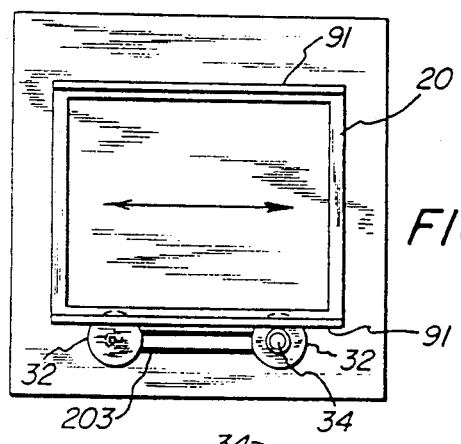
FIG. 5b(iii)
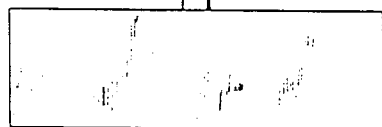
FIG. 5b(i)
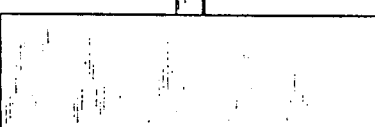
FIG. 5b(ii)

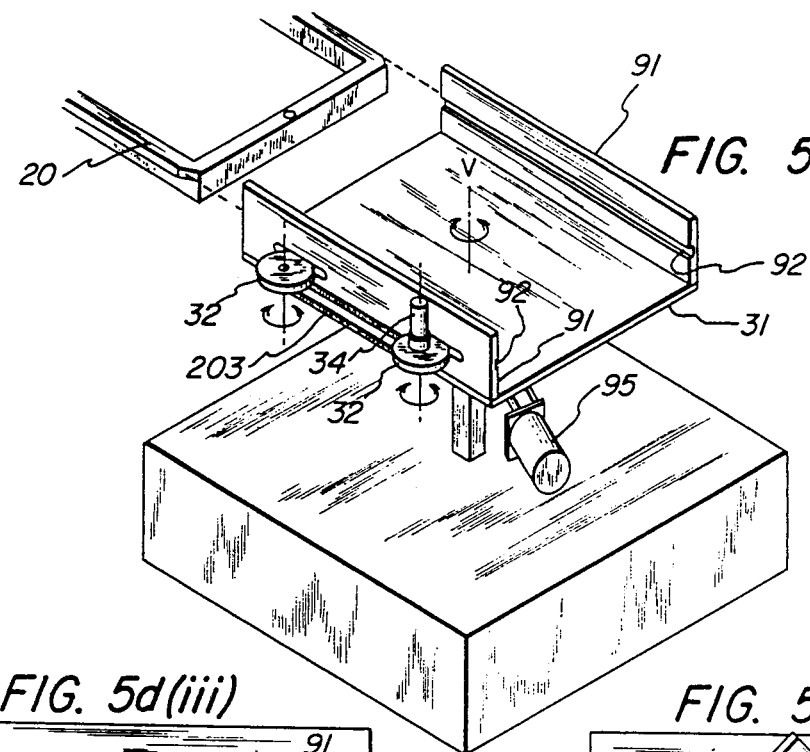
FIG. 5d(iv)
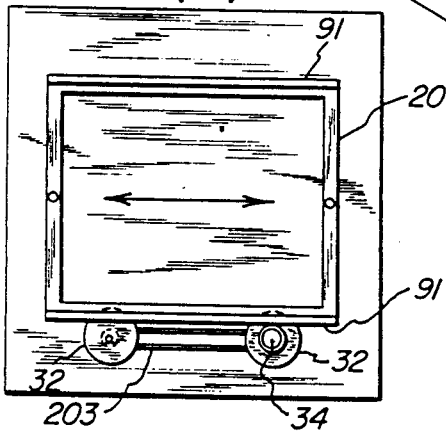
FIG. 5d(iii)
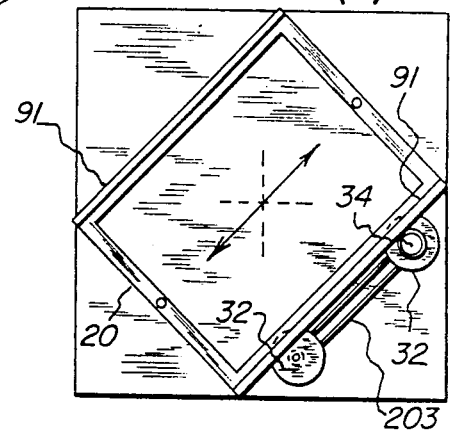
FIG. 5d(v)
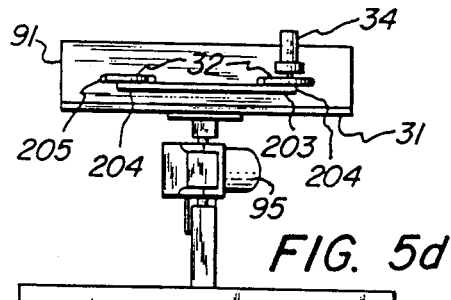
FIG. 5d(i)
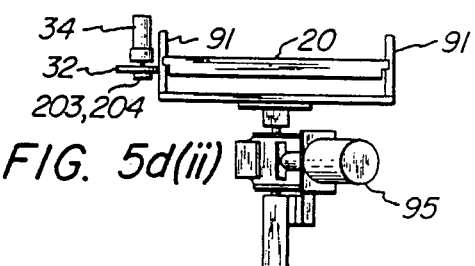
FIG. 5d(ii)

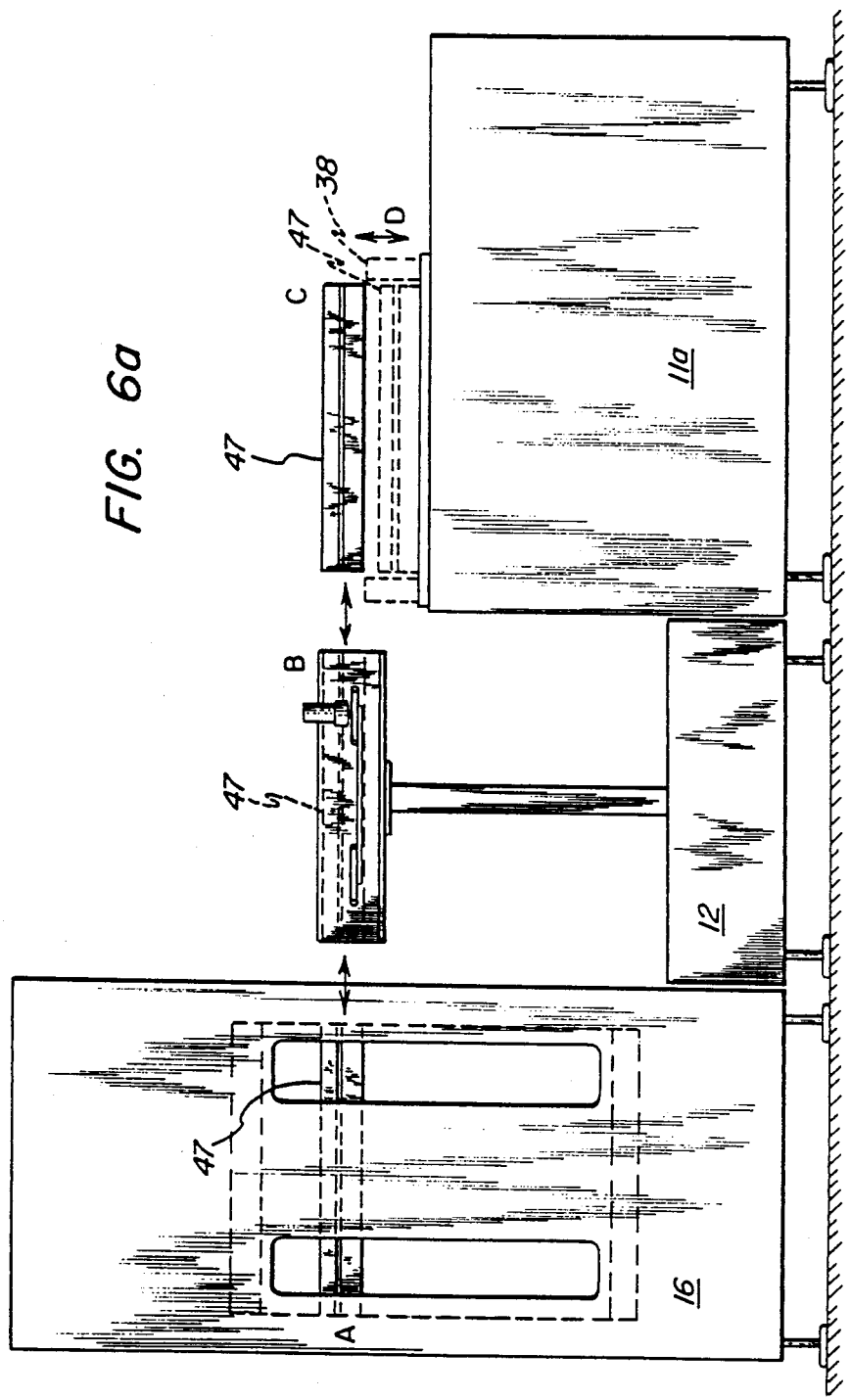

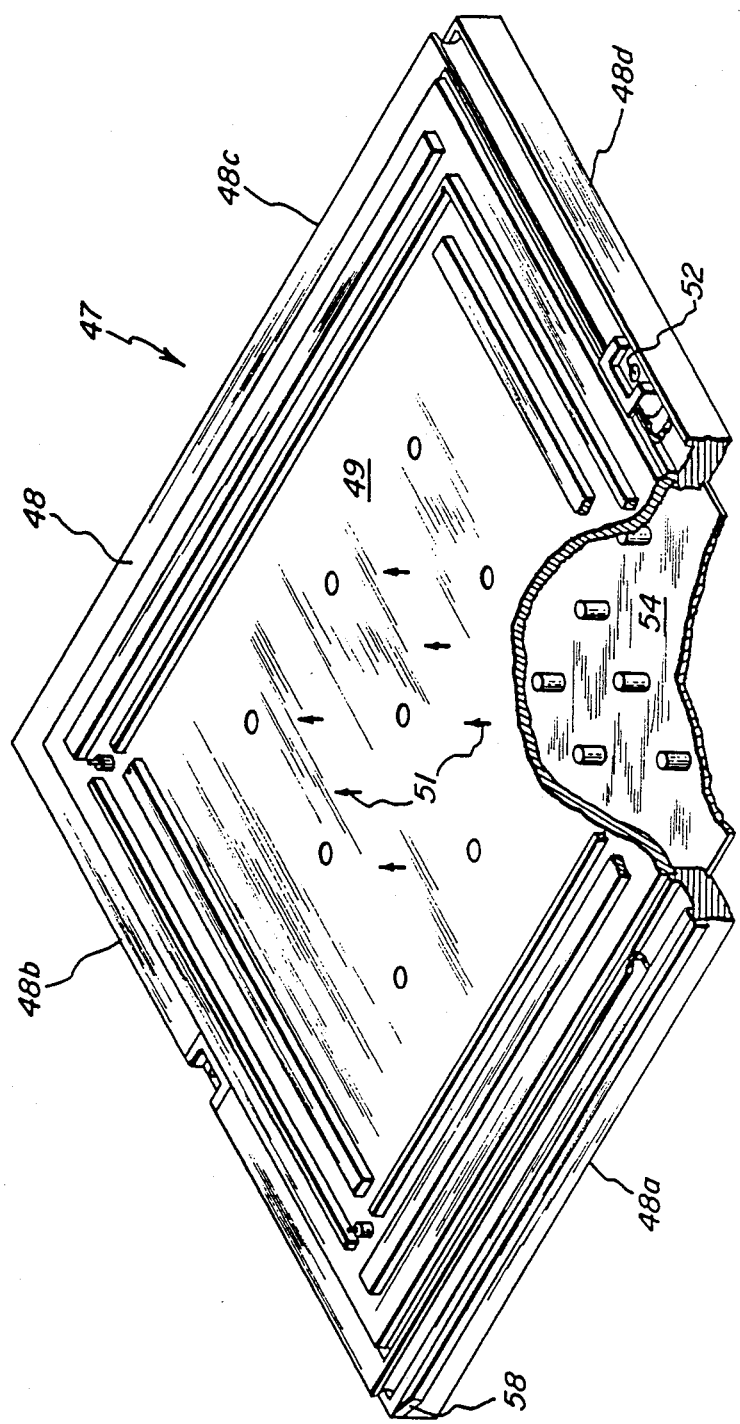

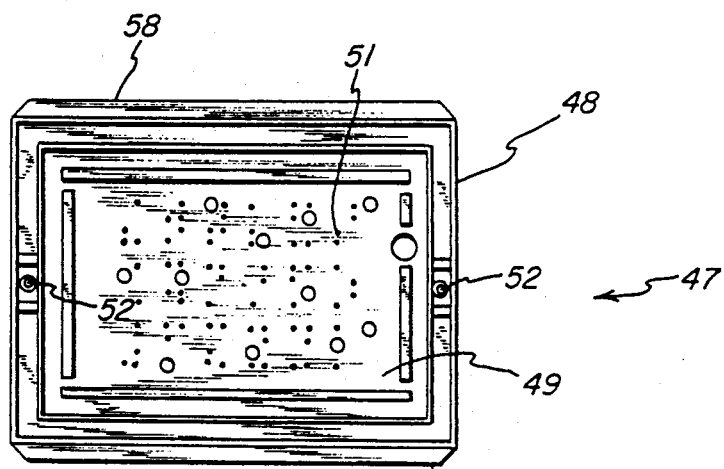
FIG. 9a(iv)
FIG. 9a(ii)
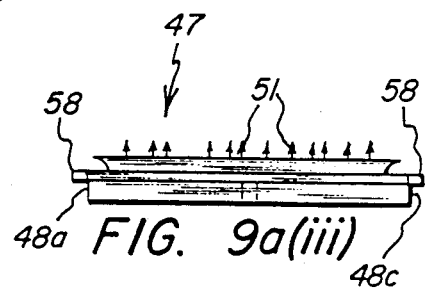
FIG. 9a(iii)
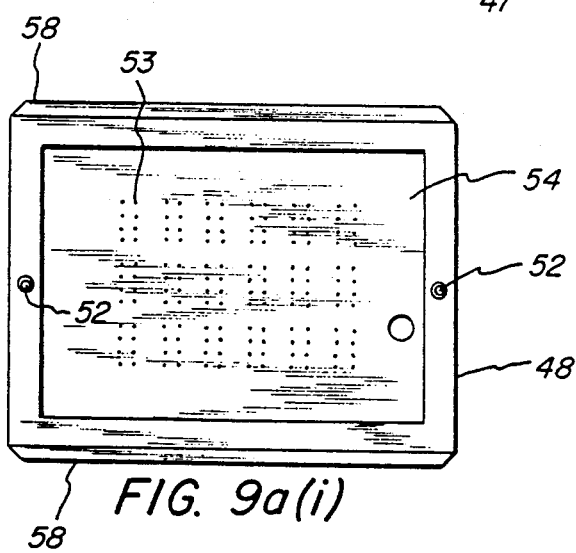
FIG. 9a(i)

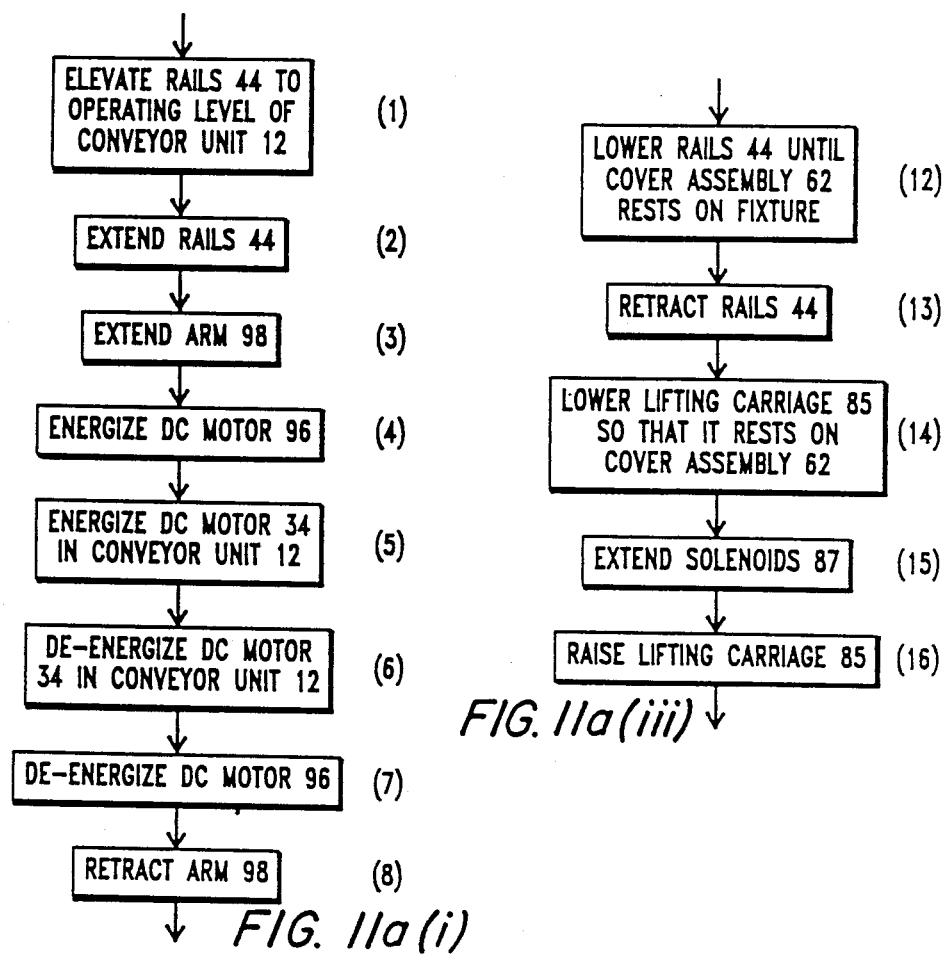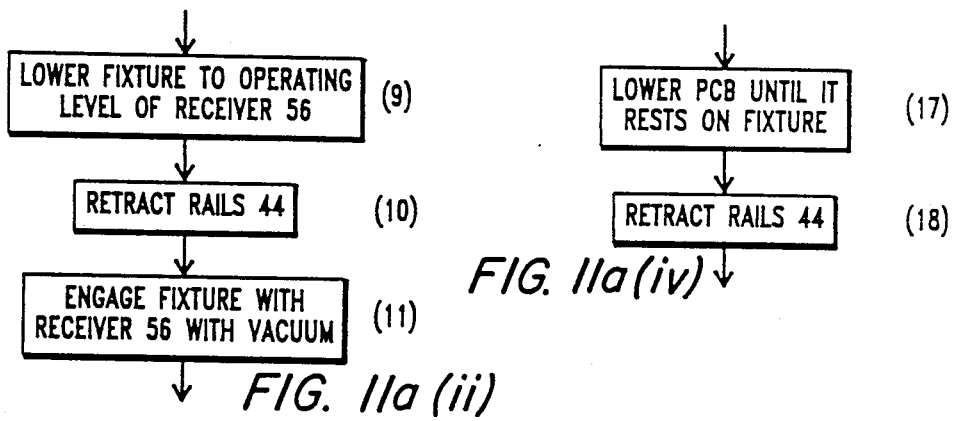

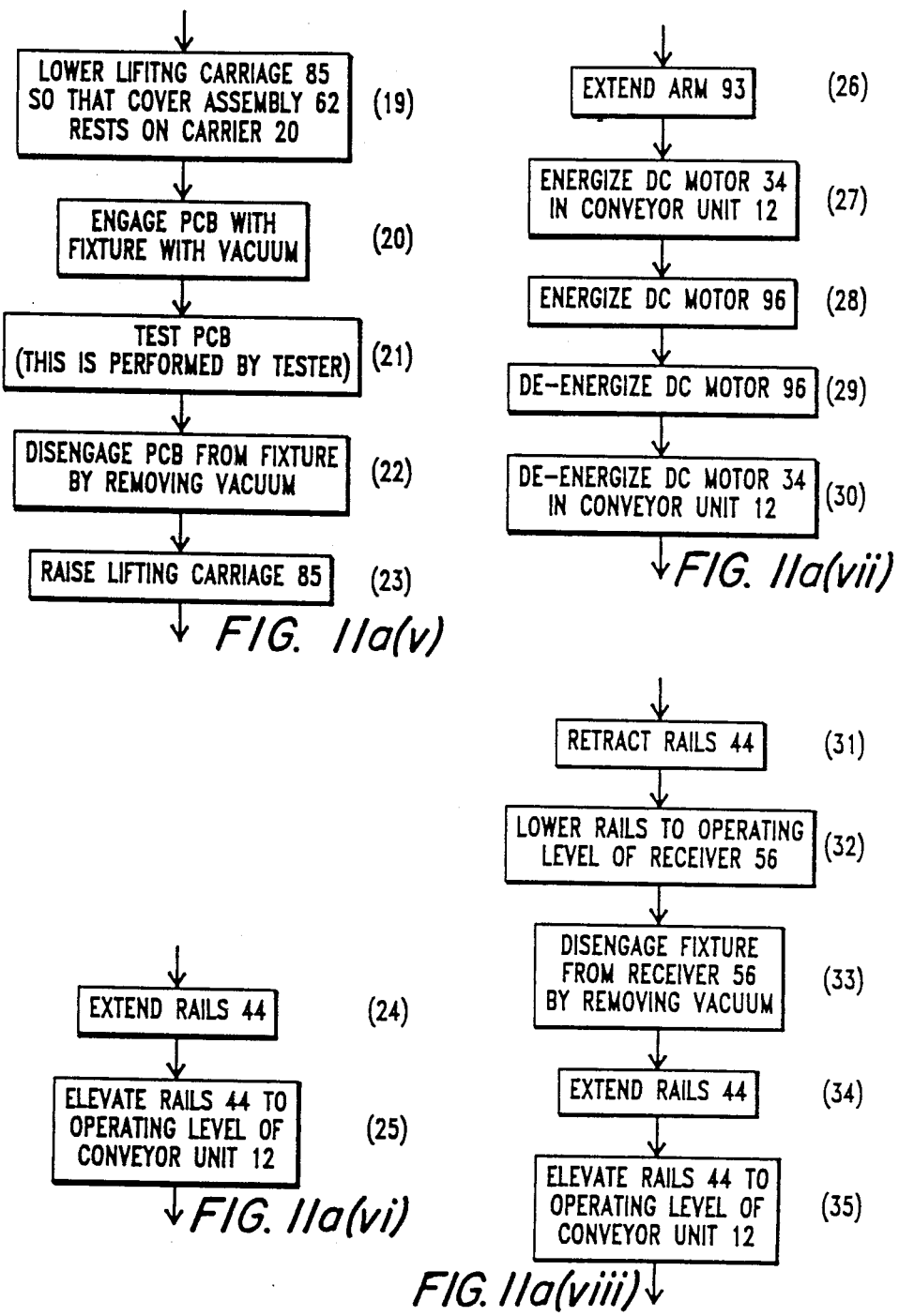

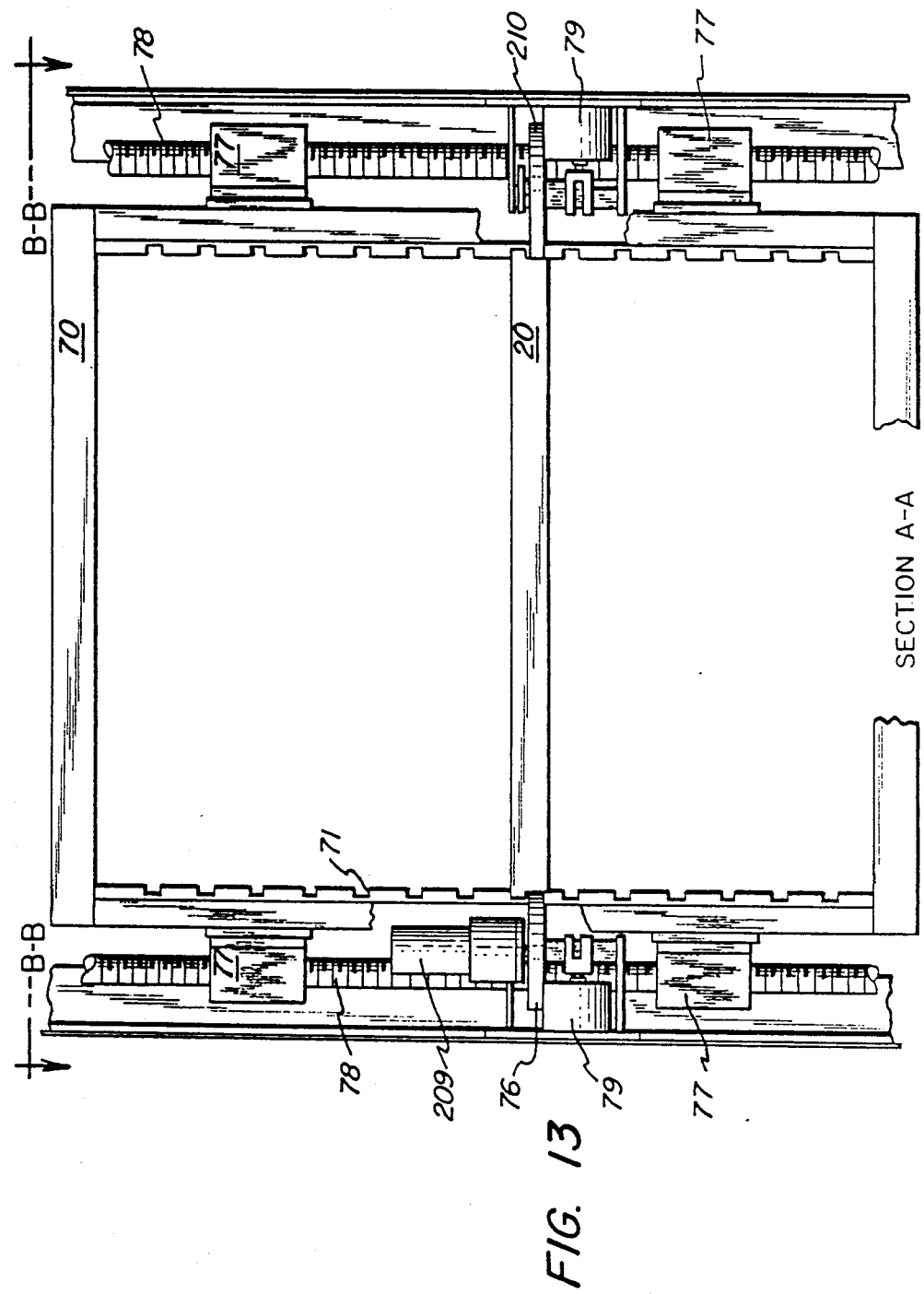

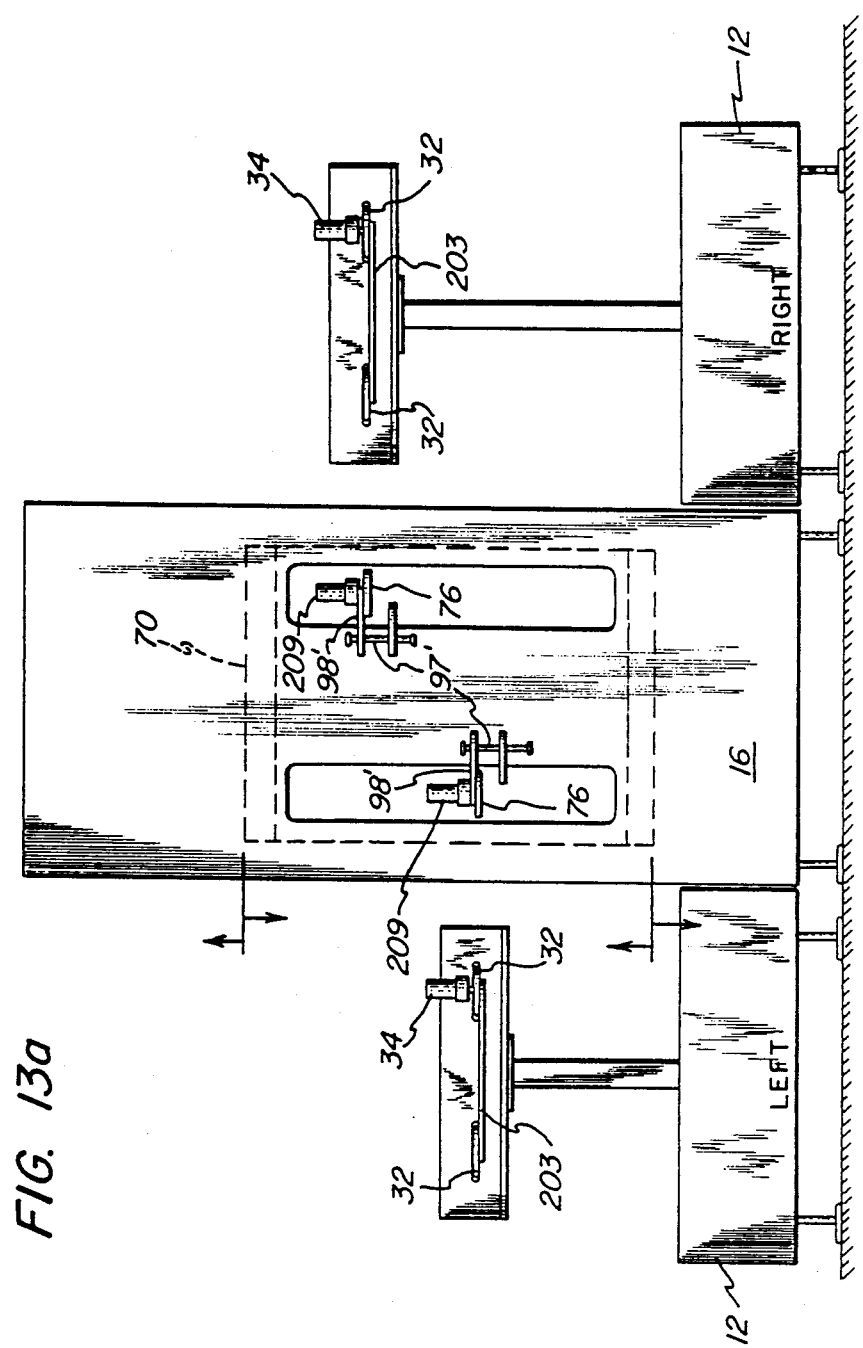

VIEW B-B

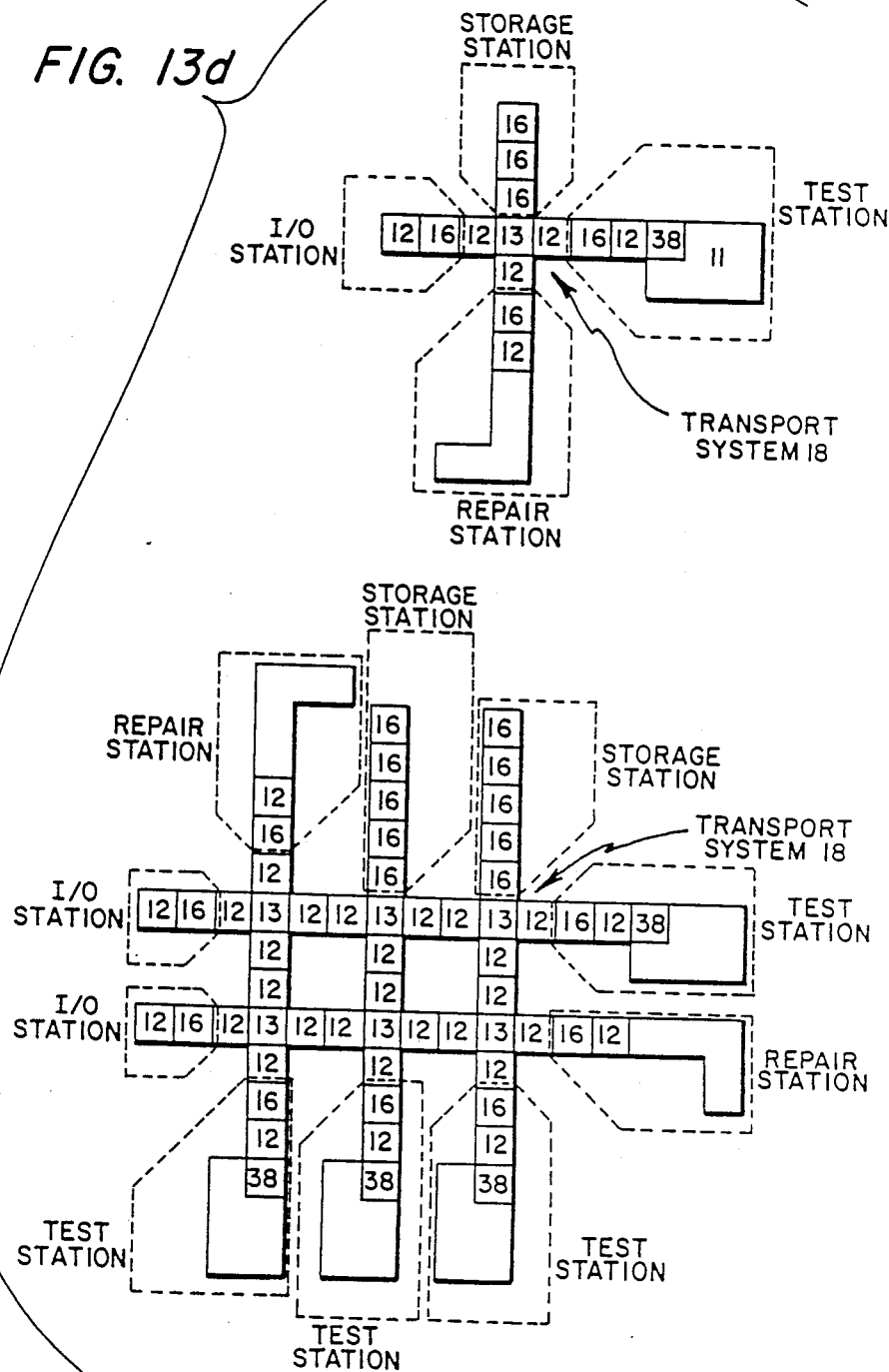

SYSTEM FOR CONFIGURING, AUTOMATING AND CONTROLLING OPERATIONS PERFORMED ON PCBS AND OTHER PRODUCTS

CROSS REFERENCE TO RELATED APPLICATION

This is a continuation-in-part of U.S. Application Ser. No. 791,874, filed Oct. 28, 1985 now abandoned.

BACKGROUND OF THE INVENTION

This invention relates generally to multistation systems for performing diverse operations on products and more particularly to the configuring, automation and control of such a multiple station facility. For purposes of explanation, the invention is described herein in the context of testing and/or repairing printed circuit boards but it should be understood that the principles of the invention are also applicable to these and other operations performed on other products. (The term printed circuit board as used herein refers generically to electrical circuits which are constructed on or within supporting strata. The use of this term is not intended to limit this invention to electrical circuits having conductive members formed by "printing" techniques nor to circuits formed on or within a supporting stratus of any specific construction).

In order to test such printed circuit boards (PCBs) it is necessary to establish electrical connection between the test equipment and selected nodes within the electrical circuits of the PCB. Conventionally this electrical connection is accomplished with a fixture assembly upon which the PCB is positioned. The fixture assembly incorporates a plurality of conductive probes (traditionally referred to as a bed of nails) which are selectively positioned therein to correspond to predetermined electrical nodes on the PCB. After the PCB is positioned upon the fixture assembly the probes are biased into electrical contact with such nodes. The various probes of the fixture assembly are in turn electrically connected to stimulus and measurement means within the test equipment which stimulate the nodes and which measure the responses which occur at the nodes of the PCB under test as a result of such stimulus. A separate fixture assembly is generally required for each different PCB to be tested due to the variation of the circuits of the PCB and of the electrical nodes located therein. Since the electrical connection between the electrical nodes of the PCB and the test system is very critical, since the trend is to design PCBs with electrical nodes which are very densely packed, and since there is such a variation in the size and configuration of the different PCBs, the accurate loading or positioning of a PCB with respect to the fixture assembly and the accurate loading and positioning of the fixture assembly as well as the electrical connection of the fixture assembly to the stimulus and measurement means of the test equipment have typically been manual processes which make up an excessively large proportion of the total test time. Attempts to automate such processes through the use of robotic arms or univeral fixtures have been limited due to the required accuracy, the inherent variability in the size, shape, complexity, and fragility of PCBs, and the associated cost and complexity of the robotic arms and the universal fixtures. Once a robotic arm is programmed it is also extremely difficult to alter the configuration of the operating modules between which the robotic arm is tasked to repetitively perform. Furthermore, neither the robotic arms nor the universal fixtures have achieved much success with reducing the amount of time required to load and position the fixture assembly, load and position the PCB with respect to the fixture assembly, make the electrical connection with the PCB, remove the PCB from the fixture assembly, and prepare the test equipment for testing the next PCB (especially if the next PCB has a different configuration). These concerns are compounded when multiple test and/or repair stations are employed in a test system

SUMMARY OF THE INVENTION

The present invention provides an apparatus and a method for quickly configuring, automating and controlling the routing, testing and/or repairing of PCBs (or other products) which substantially minimizes the aforementioned limitations and which can be used to automatically select, transport, and load the fixture assembly or comparable circuit means required to test or repair a given PCB; transport and position the PCB to be tested or repaired with respect to the circuit means; electrically connect the same to the circuitry adapted to selectively test the electrical circuits of the PCB; initiate the testing of the PCB; determine in view of an interpretation of the test results whether the PCB being tested is acceptable, defective, or requires additional testing or repair; conduct the additional tests or remove the PCB from the circuit means and transport the PCB to another area within the test or repair system corresponding to the determined status of the PCB; determine whether there are other PCBs to be tested or repaired which will utilize the same circuit means presently loaded within the test system, and if so, sequentially transport and position one of such PCBs with respect to the circuit means or otherwise unload the circuit means; and determine whether there are other PCBs to be tested or repaired which require a different circuit means, and if so, select and load the appropriate circuit means, etc. It should be emphasized that the system according to the present invention is not strictly limited to testing PCBs. As will become apparent, stages can be advantageously included within the system to manufacture or repair PCBs, e.g. to insert or remove parts, to make adjustments to parts, to solder or unsolder parts, to burn in parts, etc. or to perform other diverse operations on other products. To emphasize the availability of these alternative operations, this disclosure utilizes the terminology "test and/or repair" to generically refer to such operations. For the sake of brevity and readability such alternative language has not, however, been repeated in each and every instance. The failure, therefore, to specifically refer to both terms should not be viewed as intentionally limiting the reference, for example, to strictly test operations.

The testing and/or repair of a PCB may require multiple stages and, therefore, the movement of the PCB from one stage to another. According to the present invention, reconfigurable modular conveyor units and automation interfaces are provided to efficiently transport and accurately load a PCB, for example, onto a selected test stage prior to the test and for removing the PCB from the test stage after the test. In the preferred embodiment of the system according to the present invention, the system further includes control means to efficiently route the PCB through the various stages required to test and/or repair a given PCB. In its preferred embodiment the present invention further includes mounting the PCB within a carrier which is adapted to uniquely position and restrain the PCB therein. The carriers are adjustable to accommodate various shapes and sizes of PCBs and are adapted to facilitate the movement of the PCBs into and out of the various test stages of the test system by the automated conveyor means. The carriers include structure which in cooperation with other elements of the test system facilitate the precise positioning of the PCB with respect to the circuit means.

The invention further contemplates: the adaption of test fixture assemblies and vacuum cover assemblies (which assemblies along with other items useful in PCB test and/or repair, and the PCB carriers are referred to herein as "components") for transport by the same conveyor system; control means for coordinating, in accordance with a dynamic priority rating system and a preemptive scheduling technique, the transport of PCBs and associated components; an automation interface for loading, unloading, precisely positioning, and producing electrical engagement of a PCB and related components at a test stage; and buffering stages capable of holding and storing multiple PCBs and components. Other significant features of the invention are: its modularity which facilitates flexible configuring and extension of the test system; its ability to transport and automatically load test fixtures as well as printed circuit boards which significantly enhances the automation of the test process; and its automated programming capability which uses interactive graphics to lay out a configuration of the system and automatically generates the system interconnections and control programs needed to operate the so configured system.

DESCRIPTION OF THE ACCOMPANYING DRAWINGS

The present invention will be further descibed hereinafter with reference to the accompanying drawings wherein:

FIG. 1a illustrates transport of a component between stations in a test and/or repair system of the present invention;

FIG. 1b depicts alternate configurations of the system of FIG. 1.

FIG. 2 is a perspective view of a carrier according to the present invention;

Figure 6:
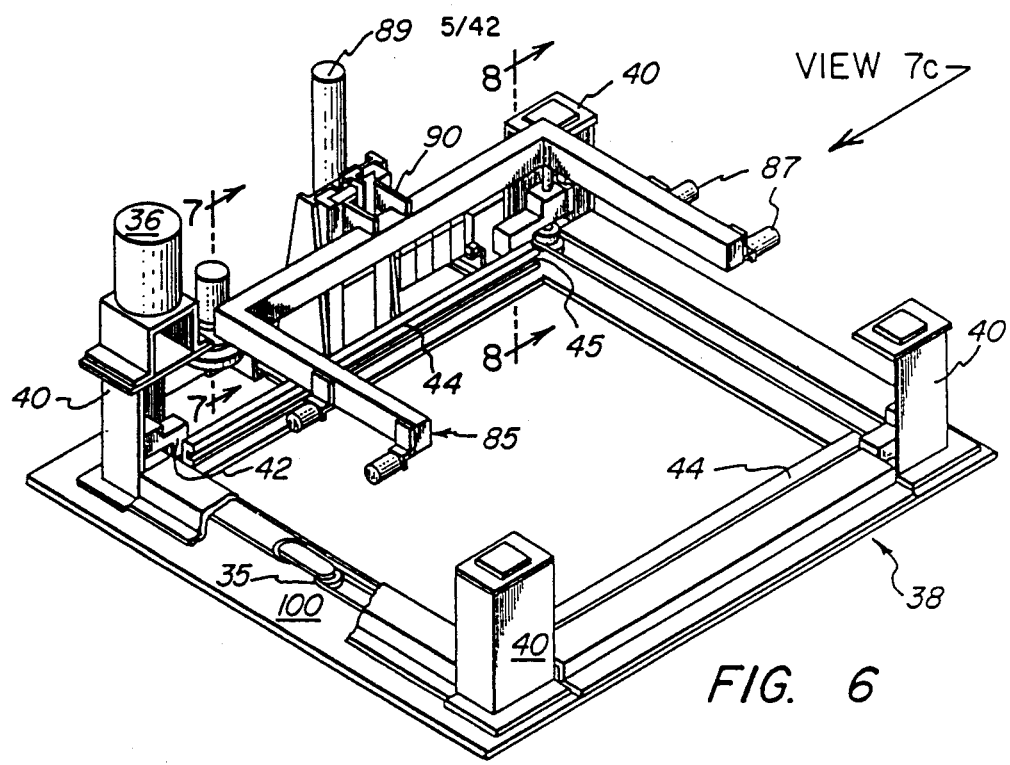
Figure 5:
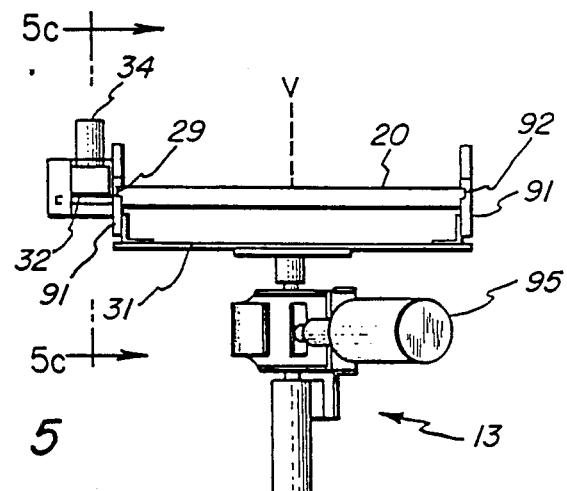
Figure 5A:
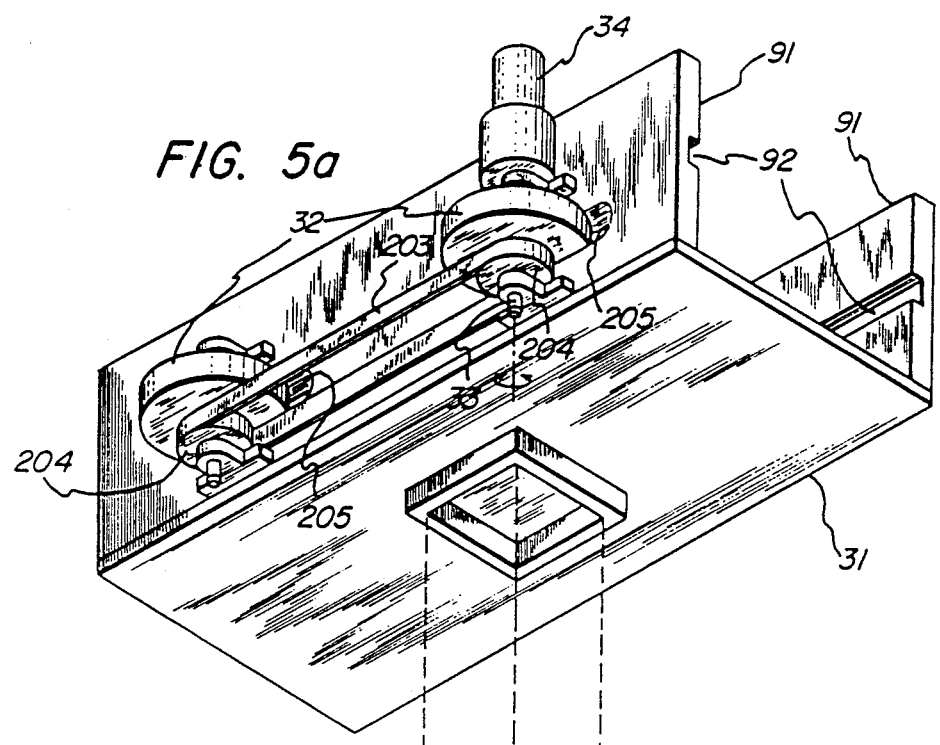
Figure 5C:
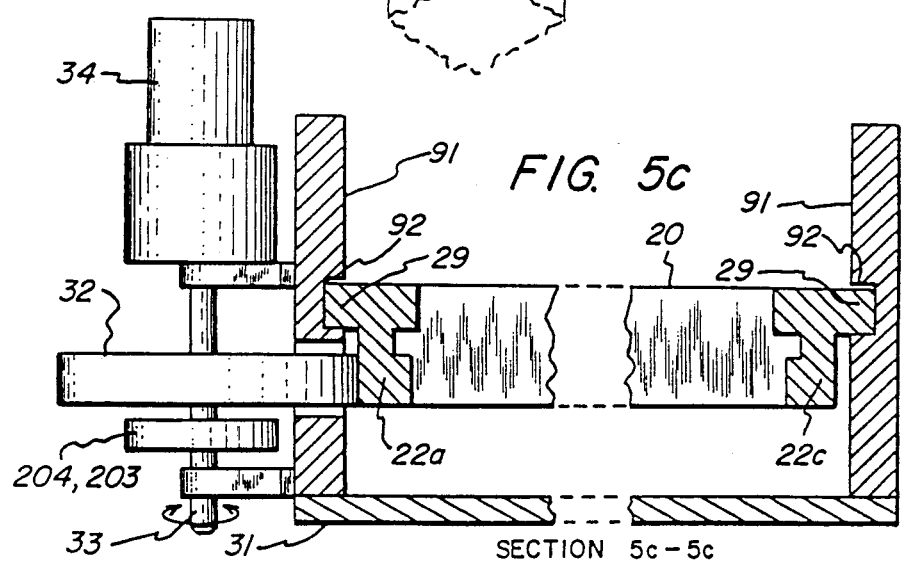
Figure 5E:
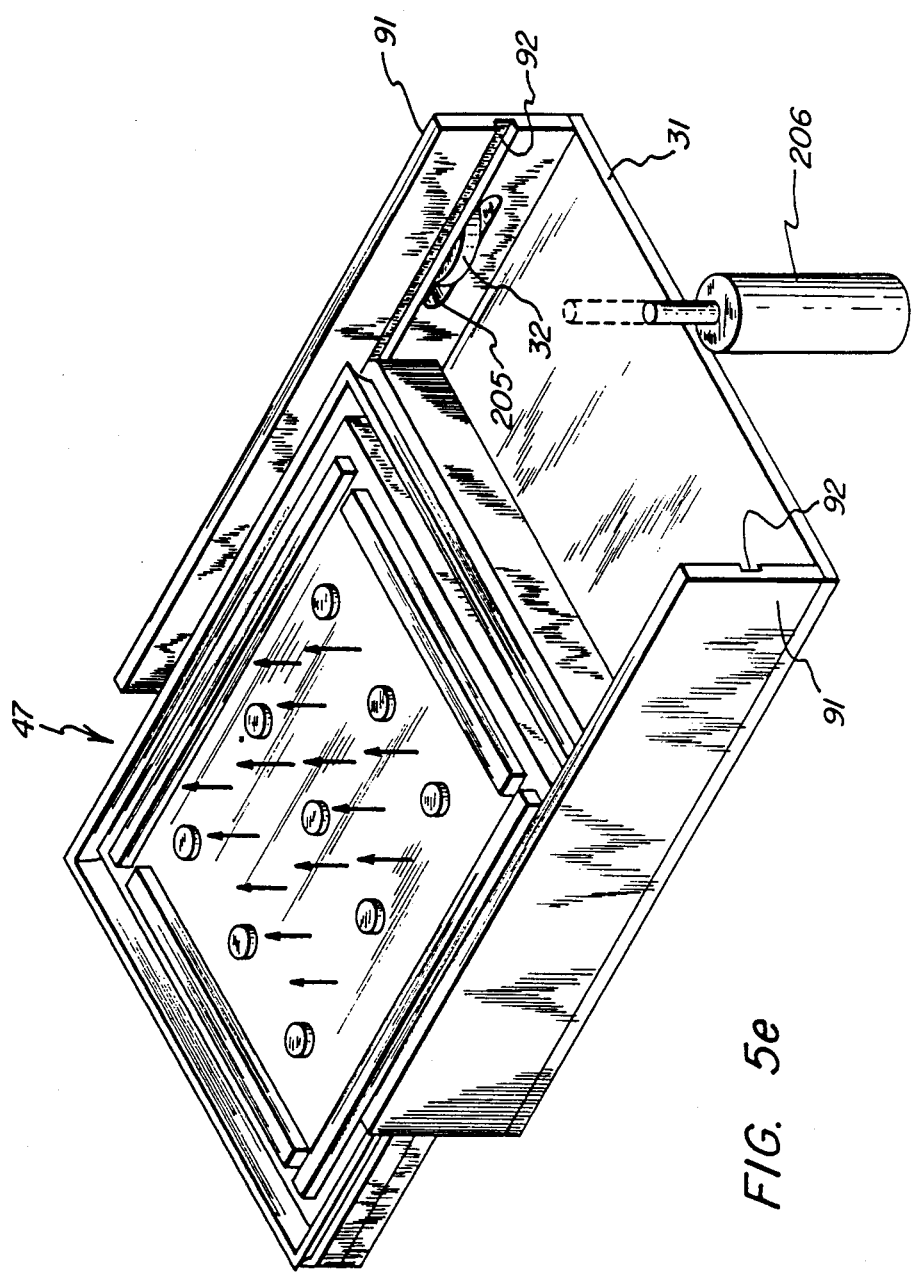
Figure 6B:
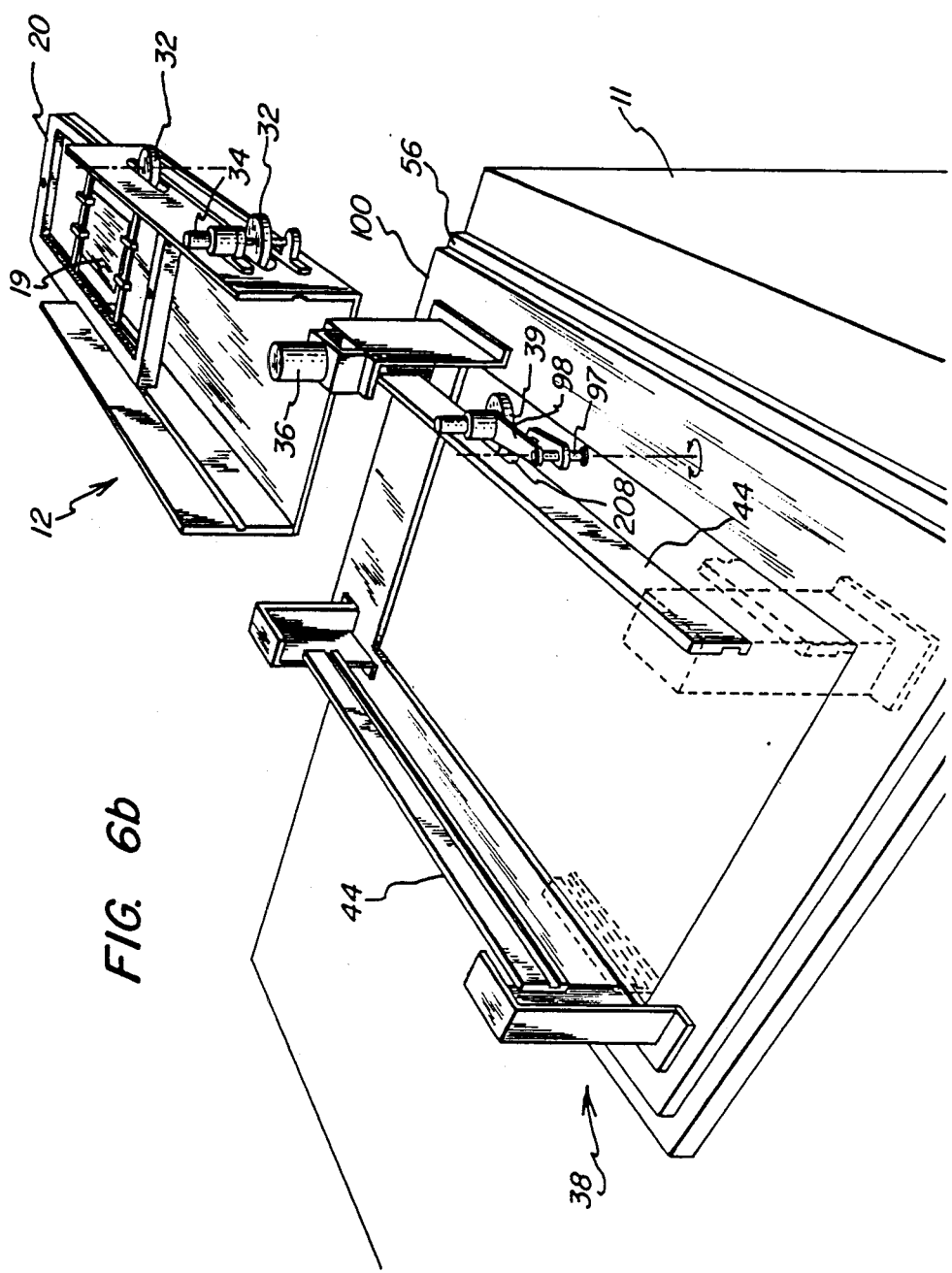
Figure 6C:
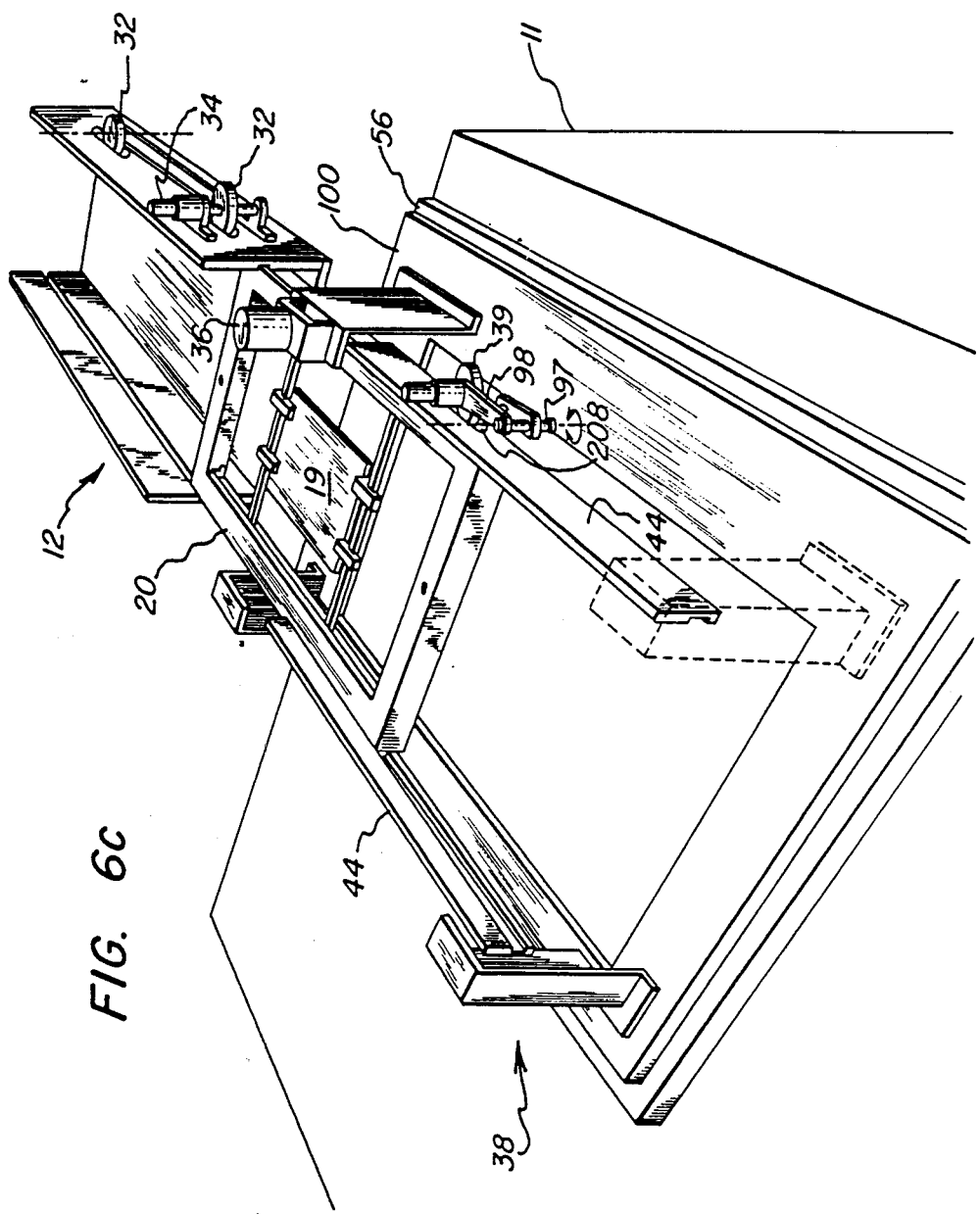
Figure 6D:
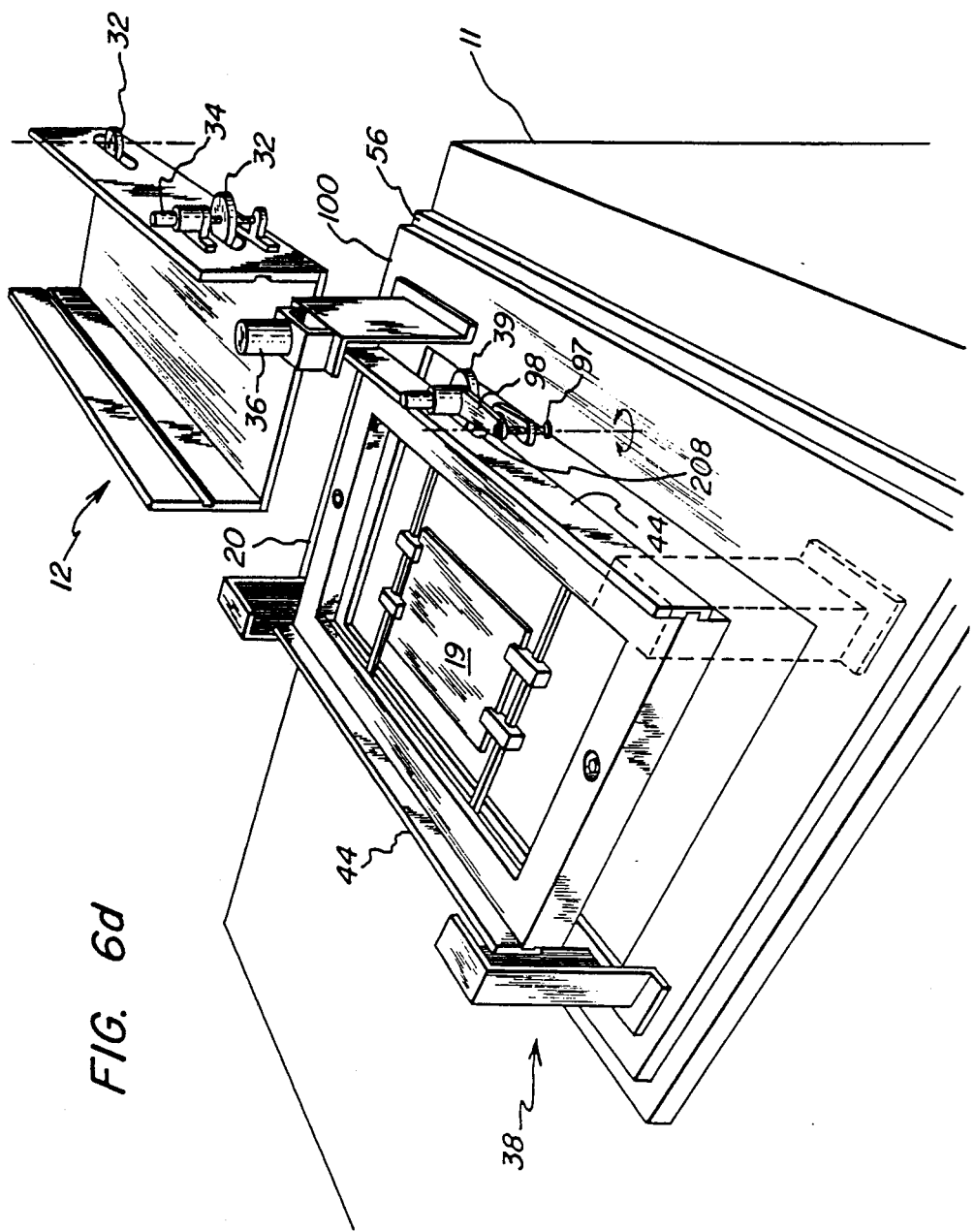
Figure 7:
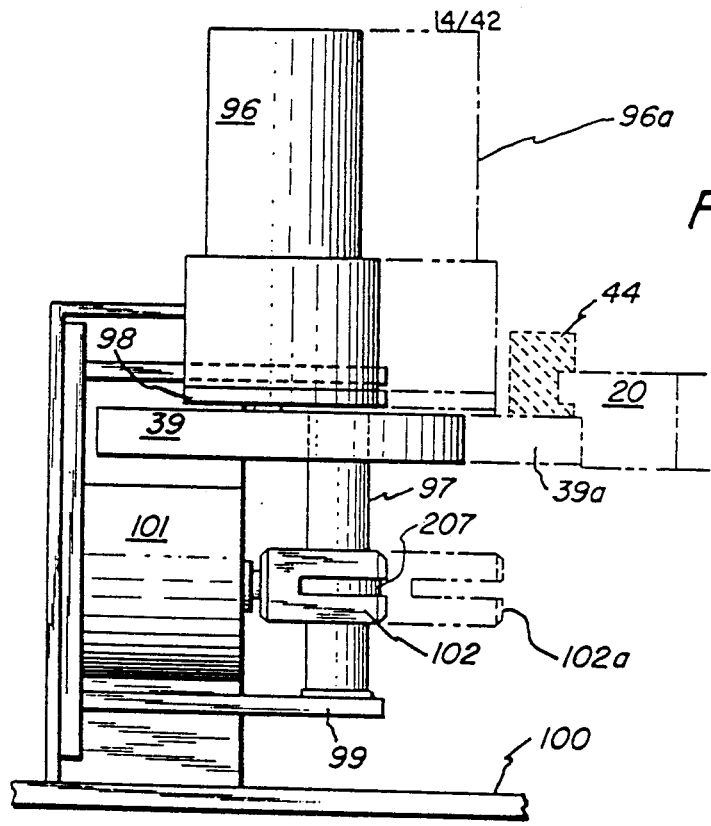
Figure 8:
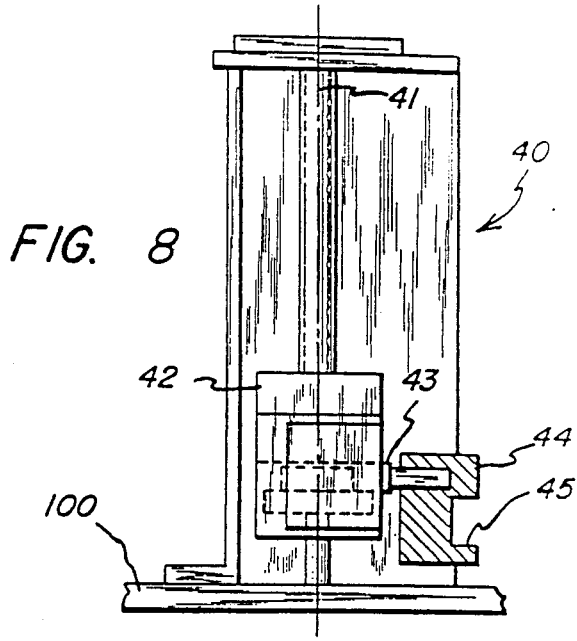
Figure 7A:
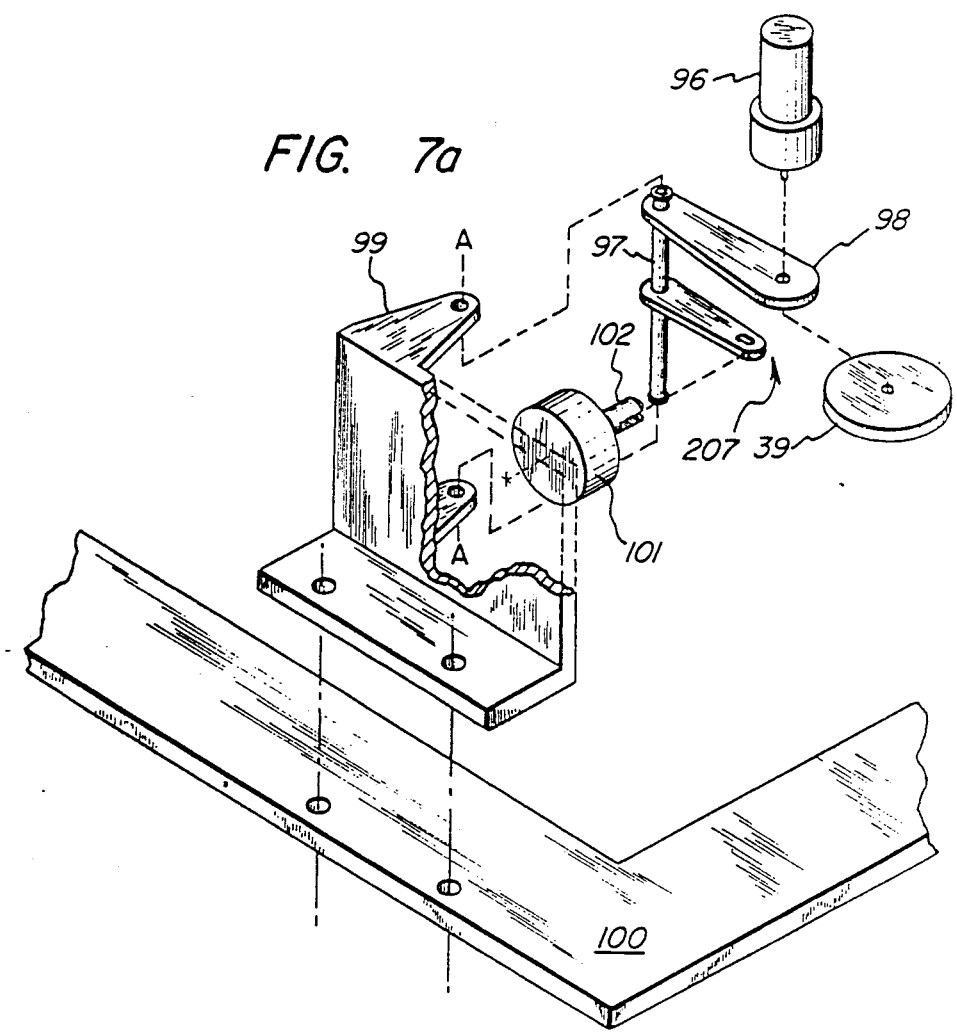
Figure 7B:
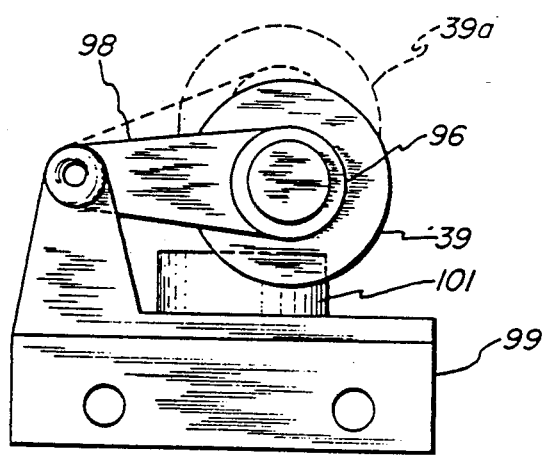
Figure 7C:
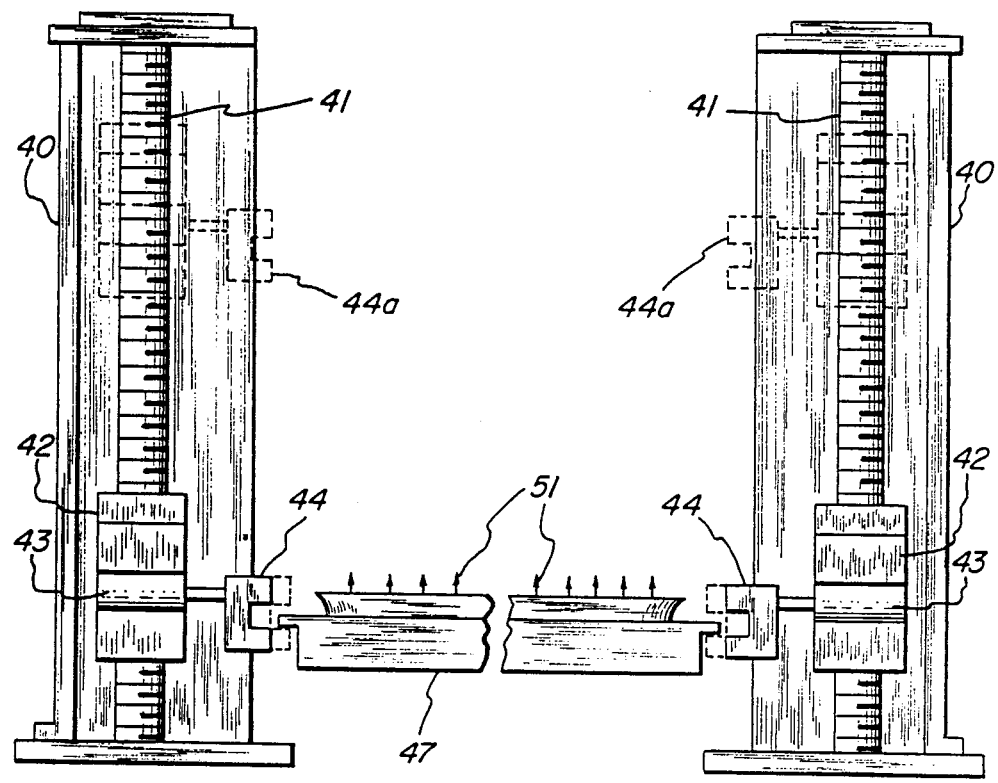
Figure 7D:
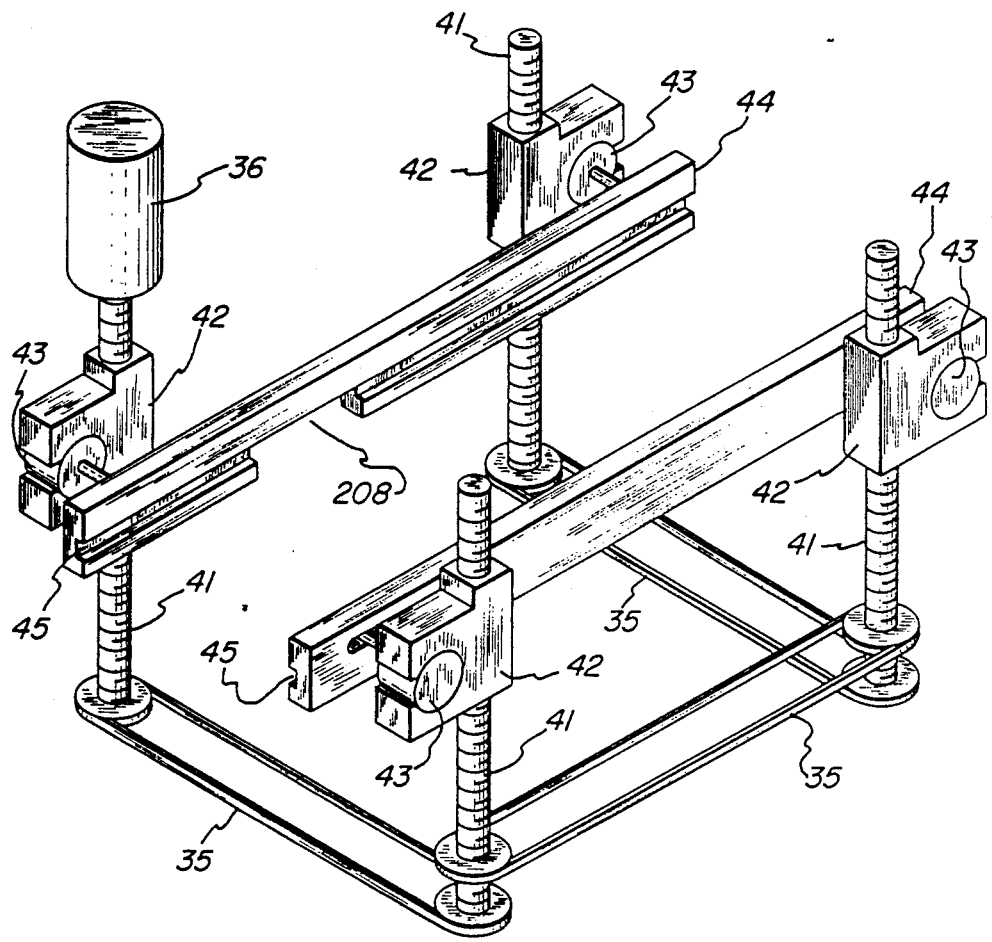
Figure 9B:
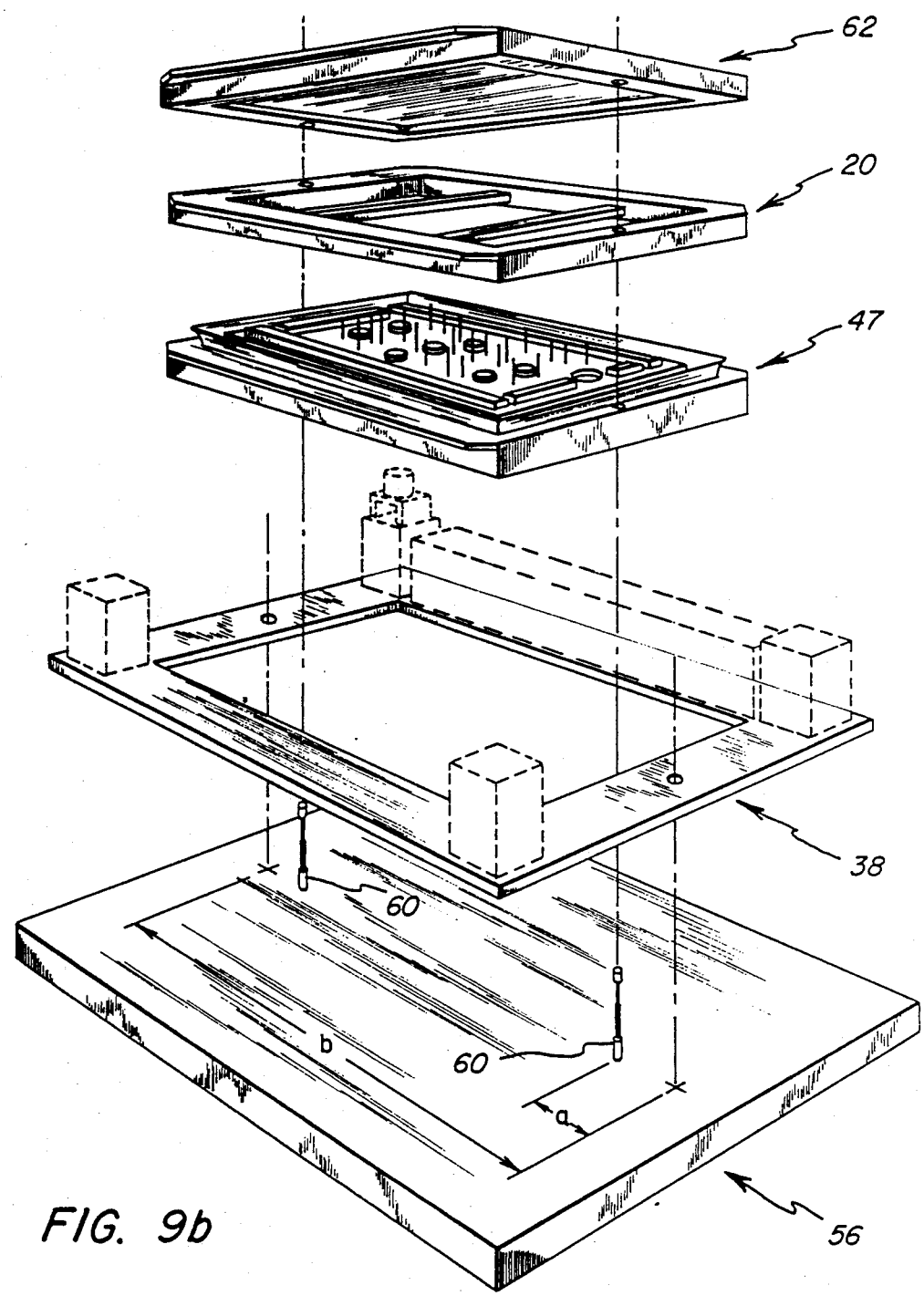
Figure 9C:
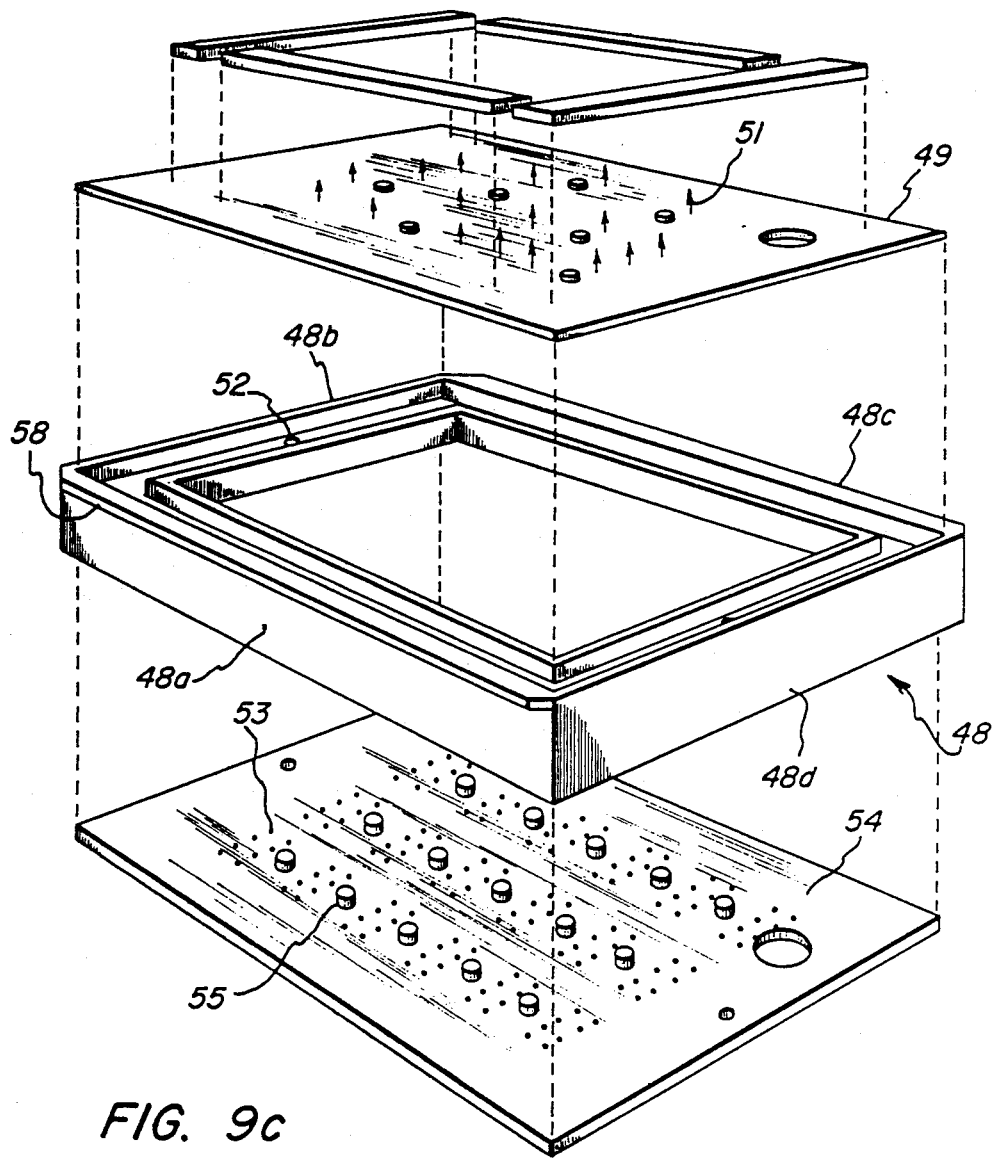
Figure 10:
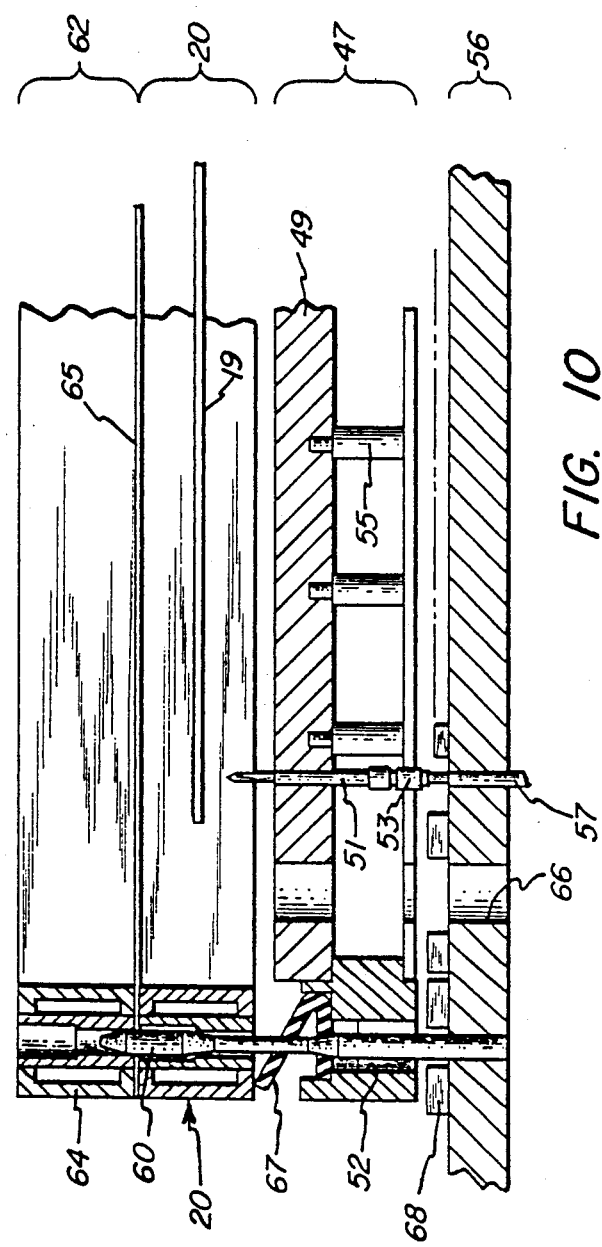
Figure 11:
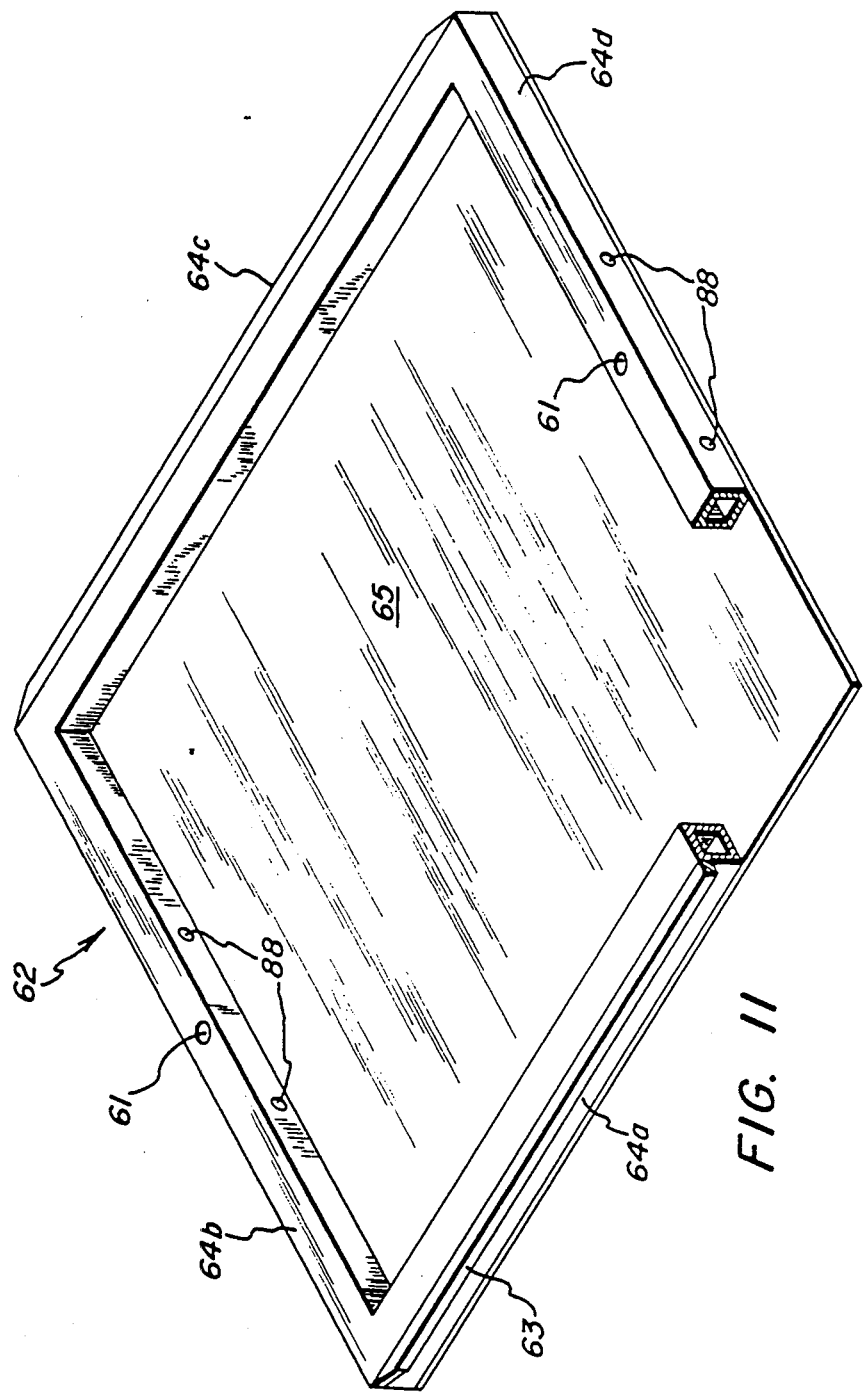
Figure 11A:
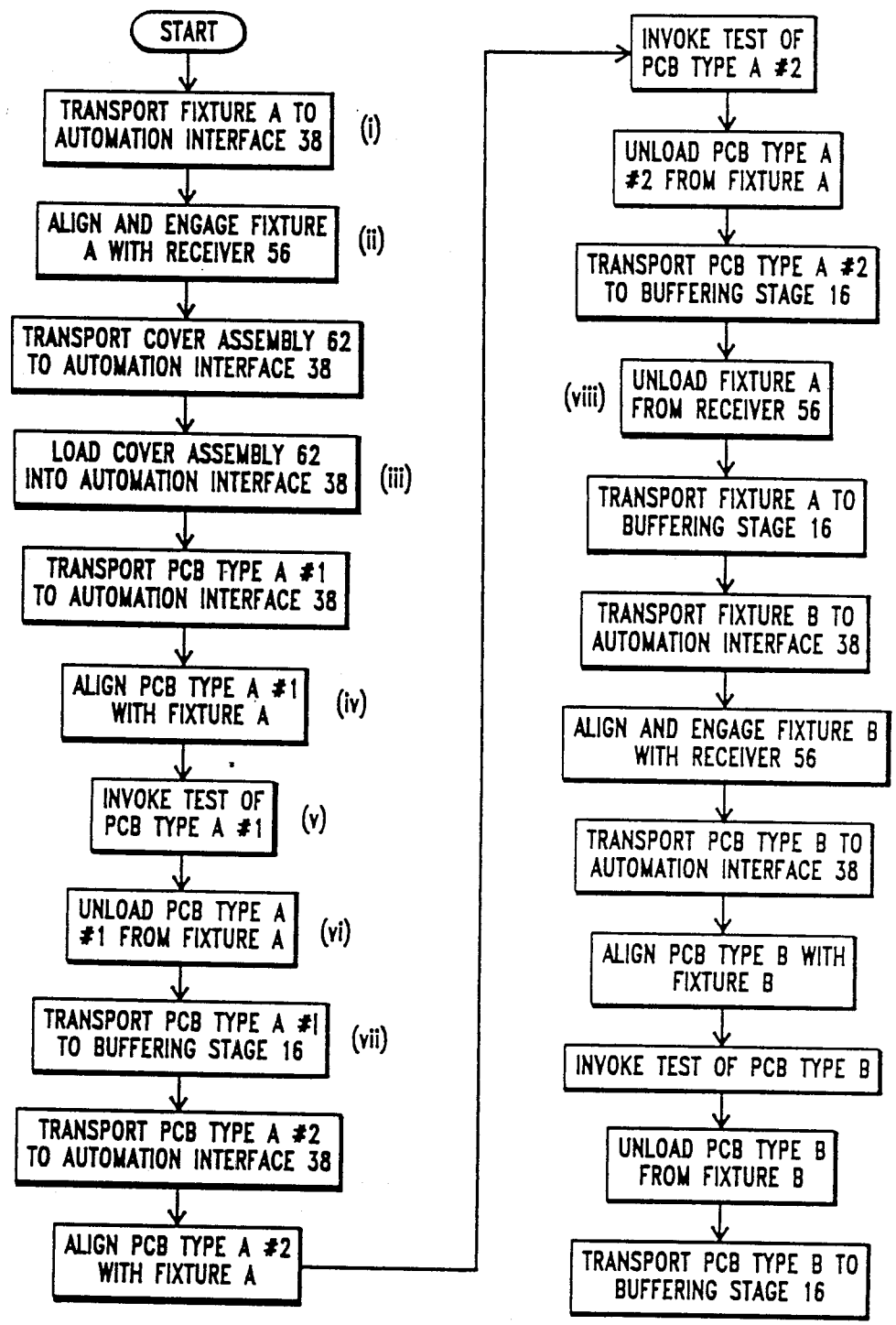
Figure 11B:
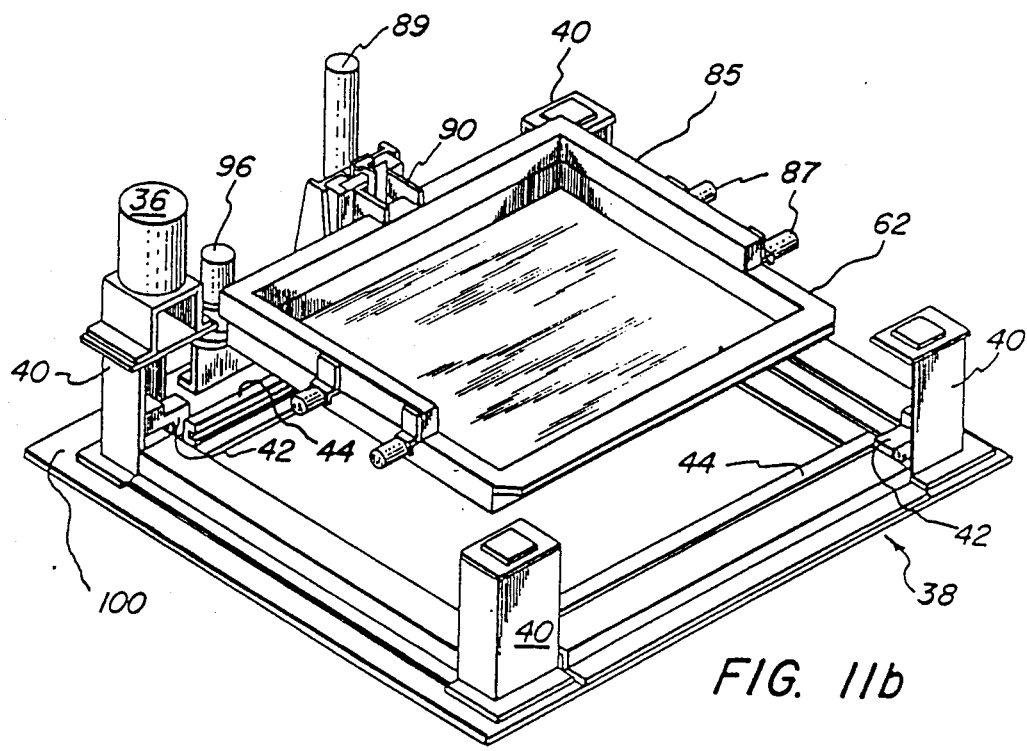
Figure 11C:
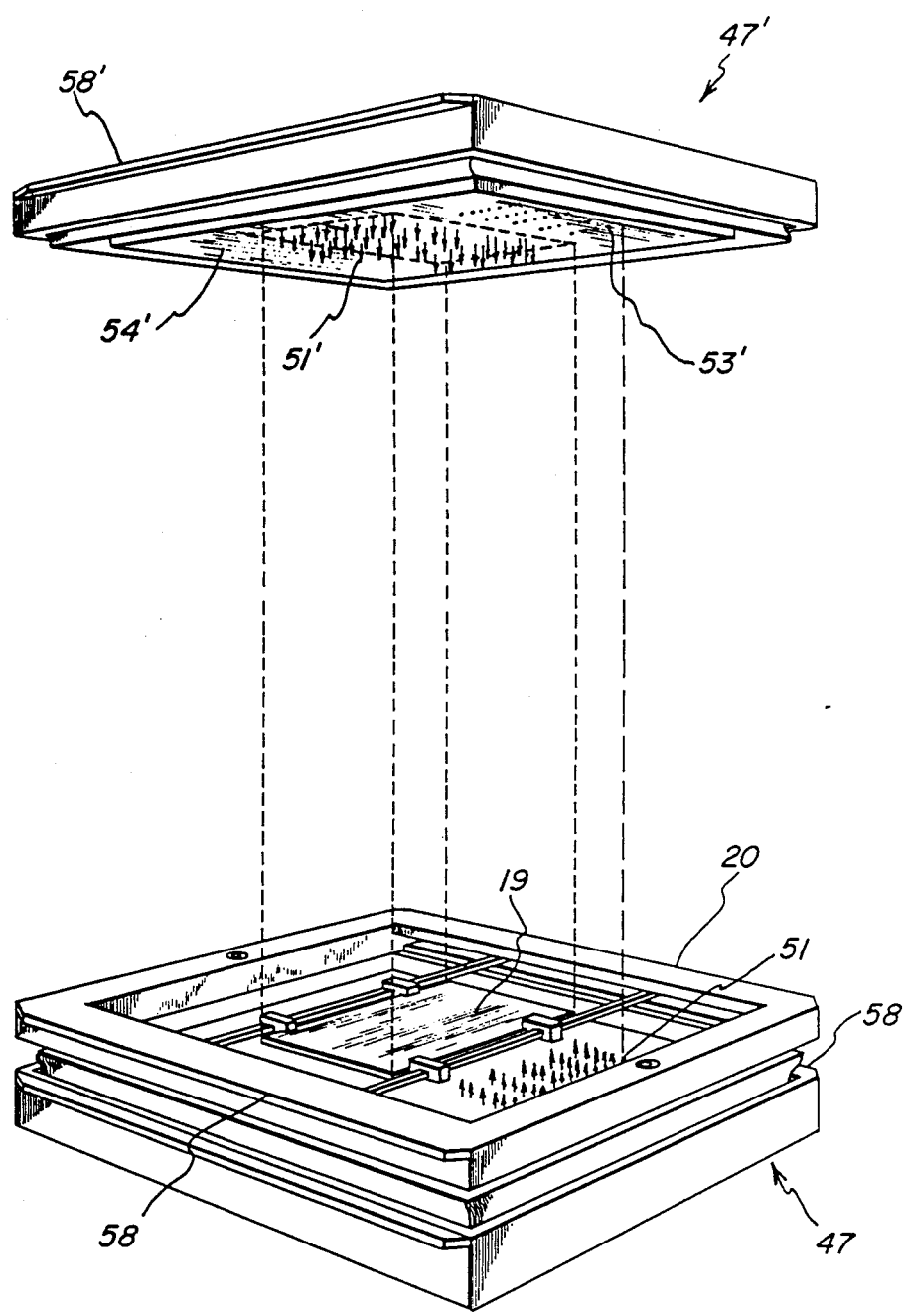
Figure 12:
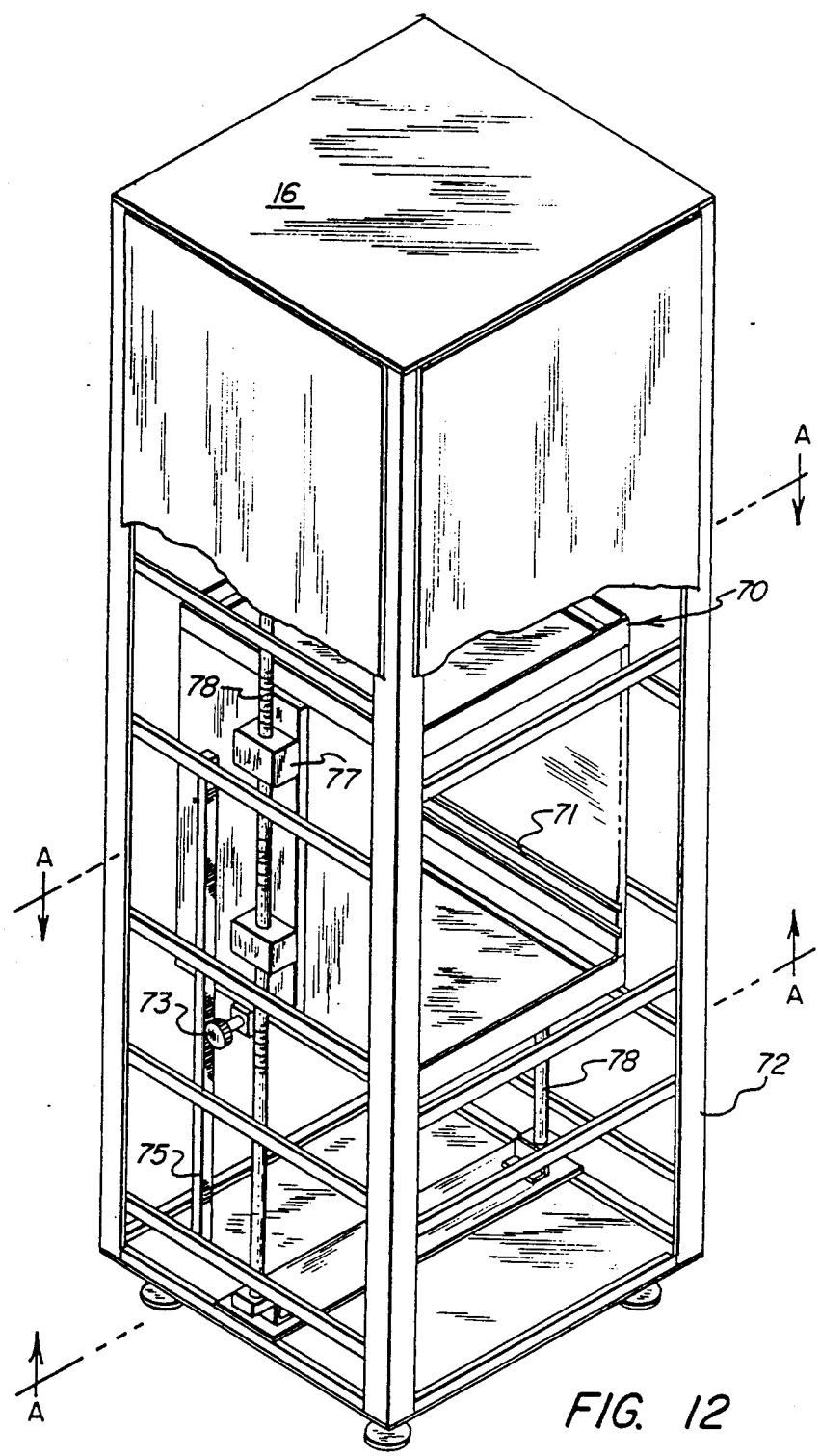
Figure 12A:
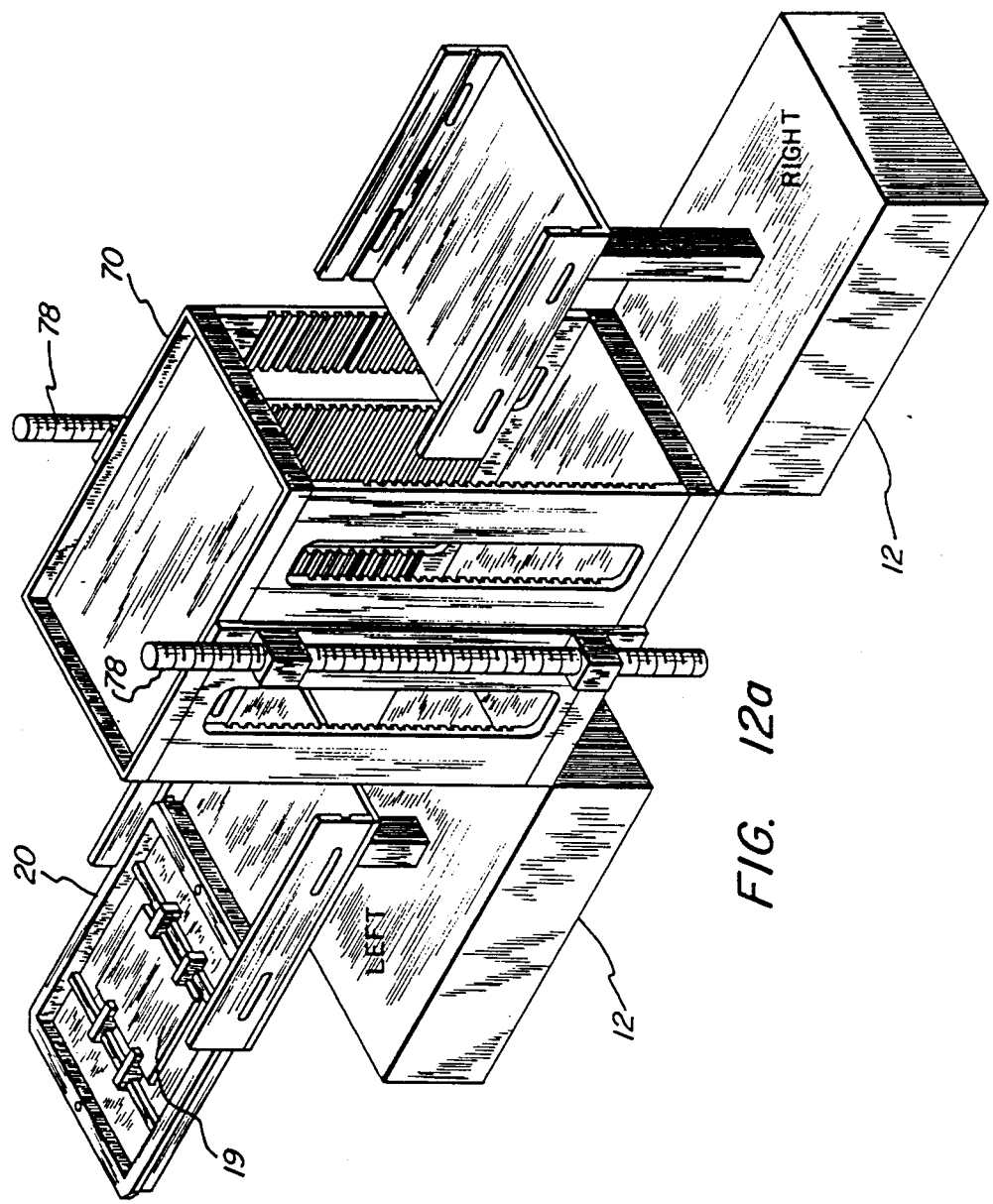
Figure 12B:
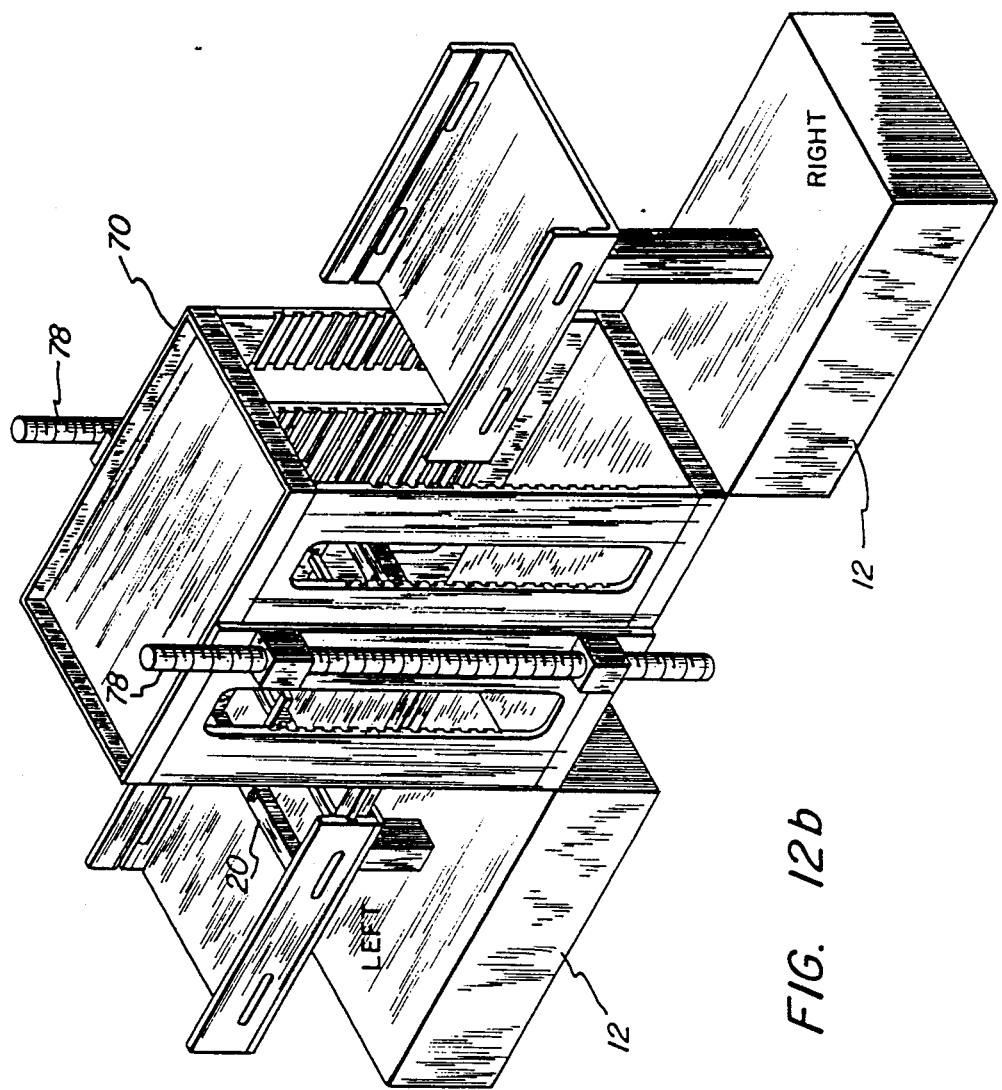
Figure 12C:
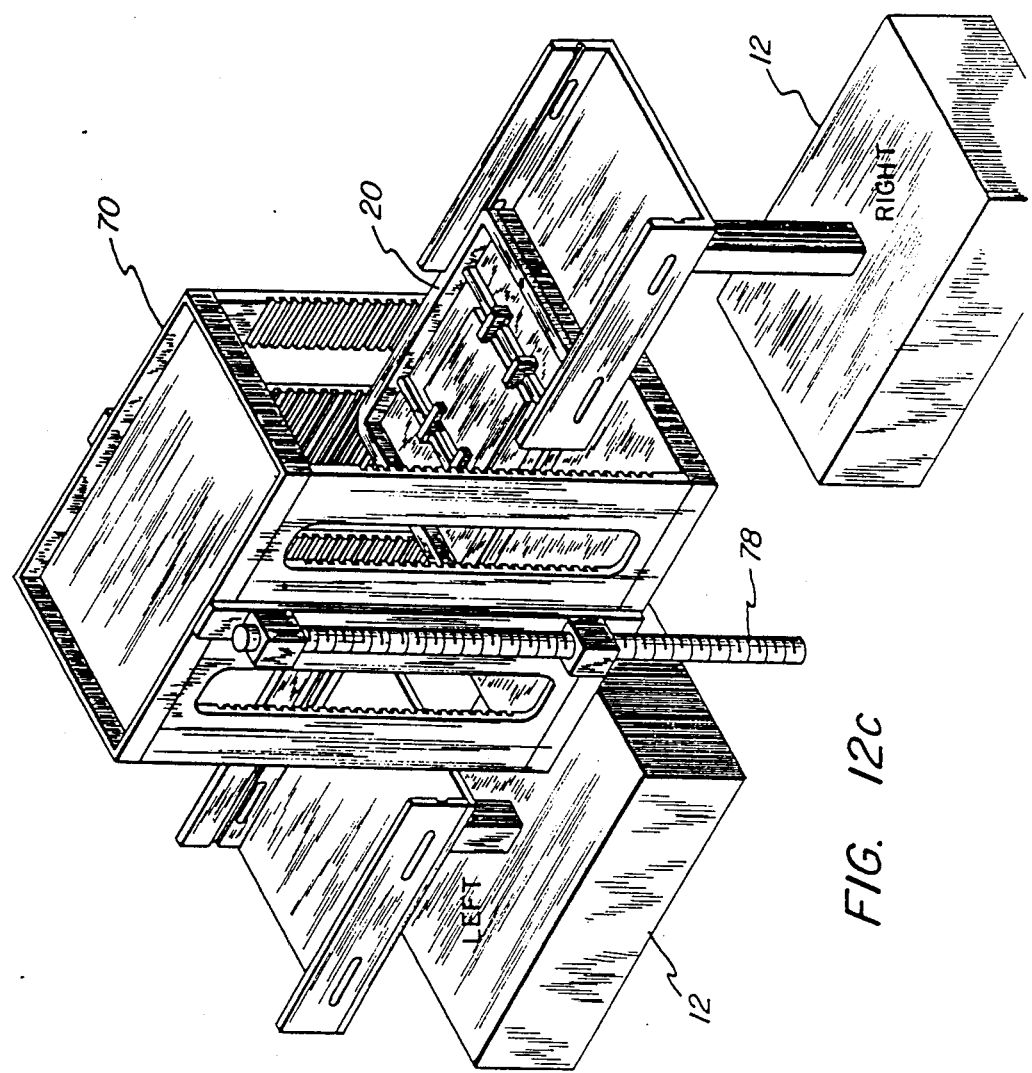
Figure 13B:
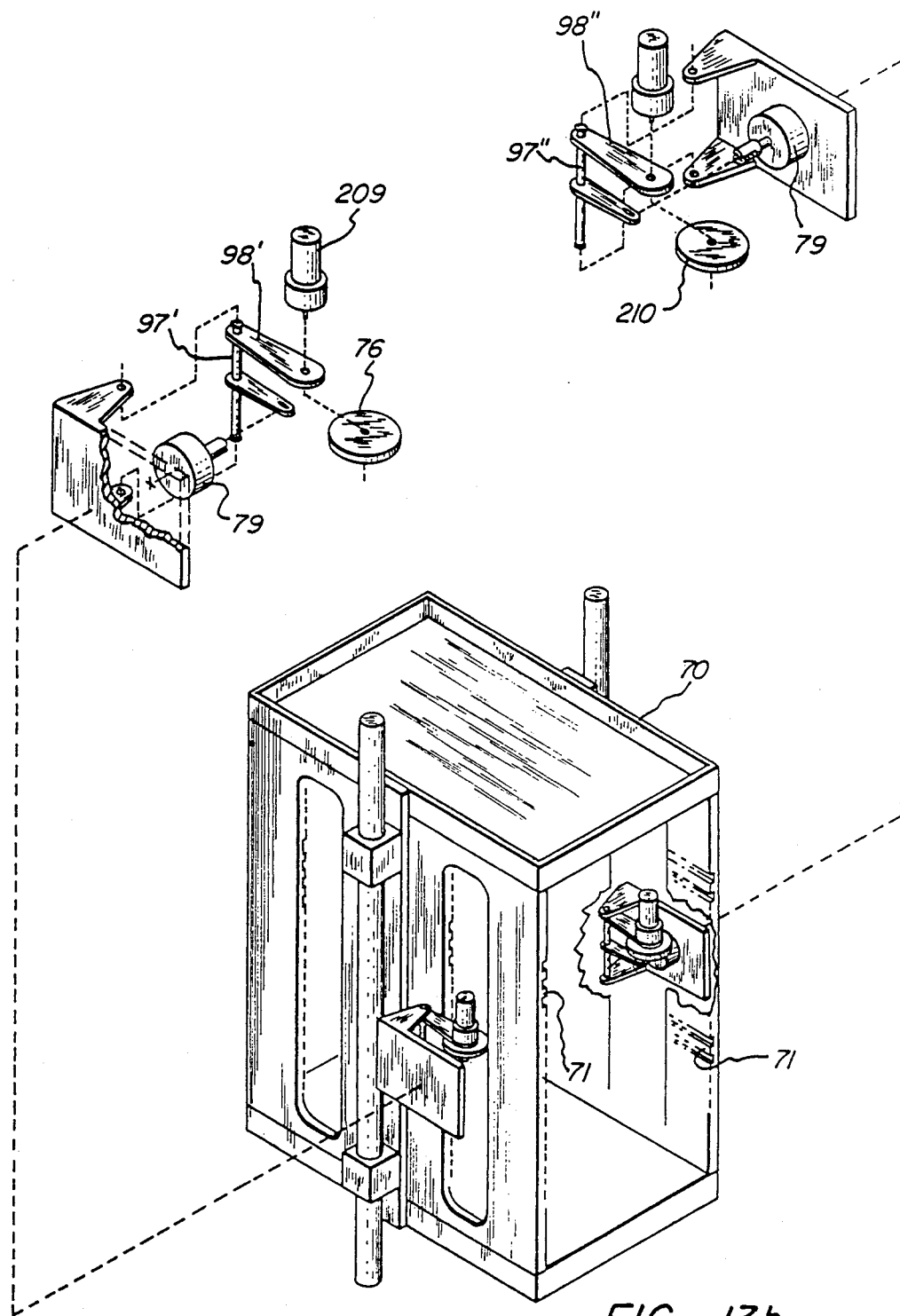
Figure 13C:
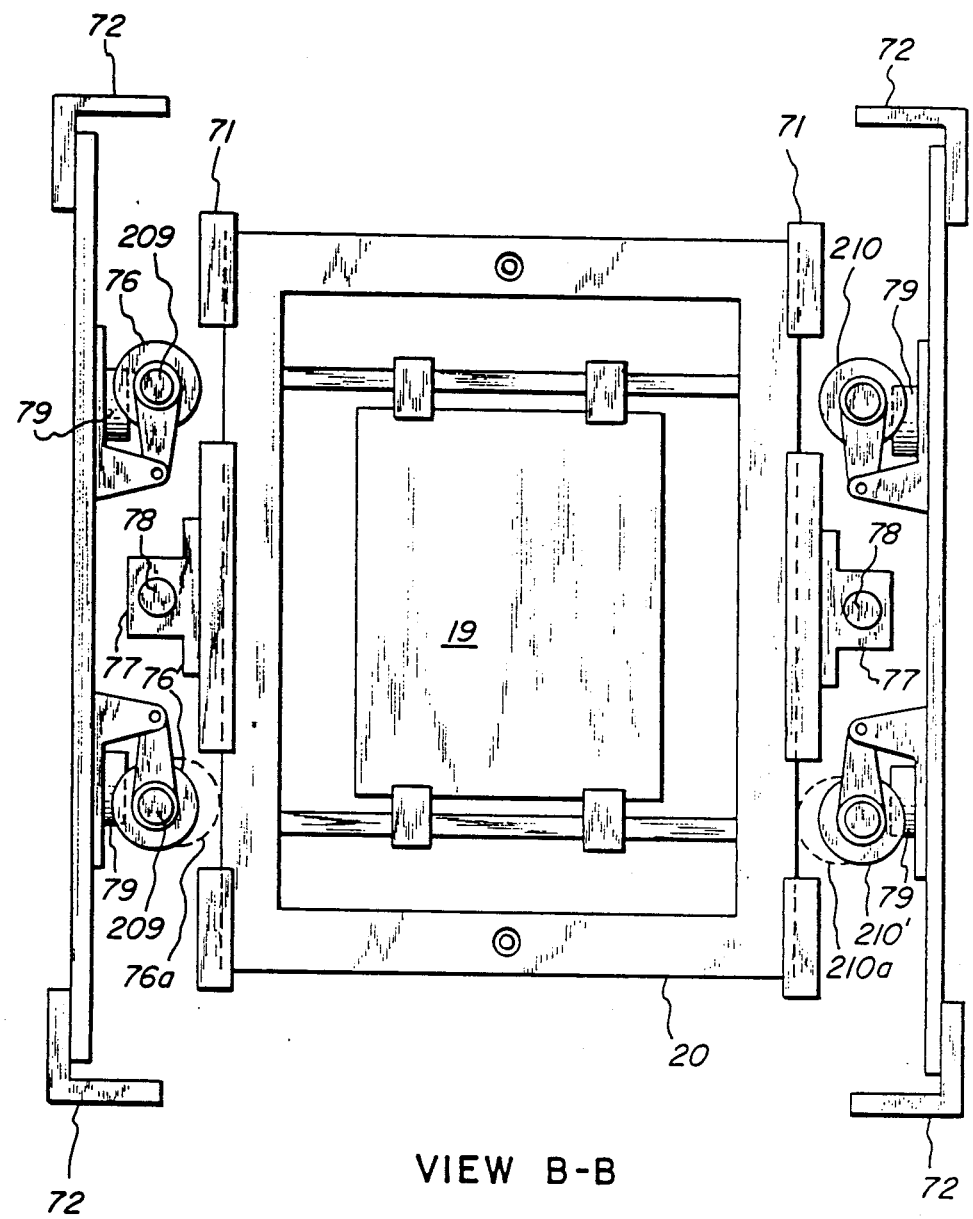
Figure 14:
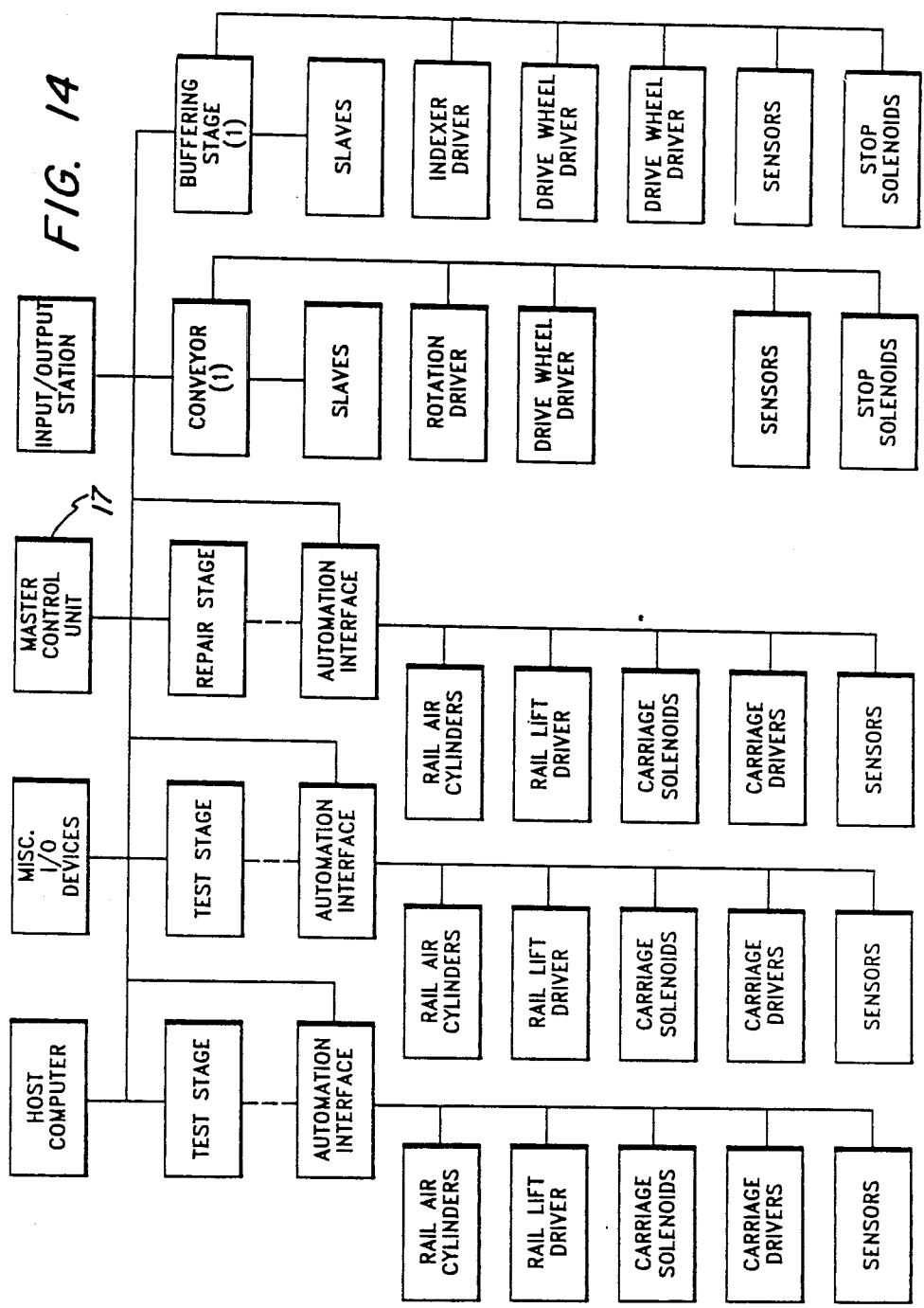
Figure 14A:
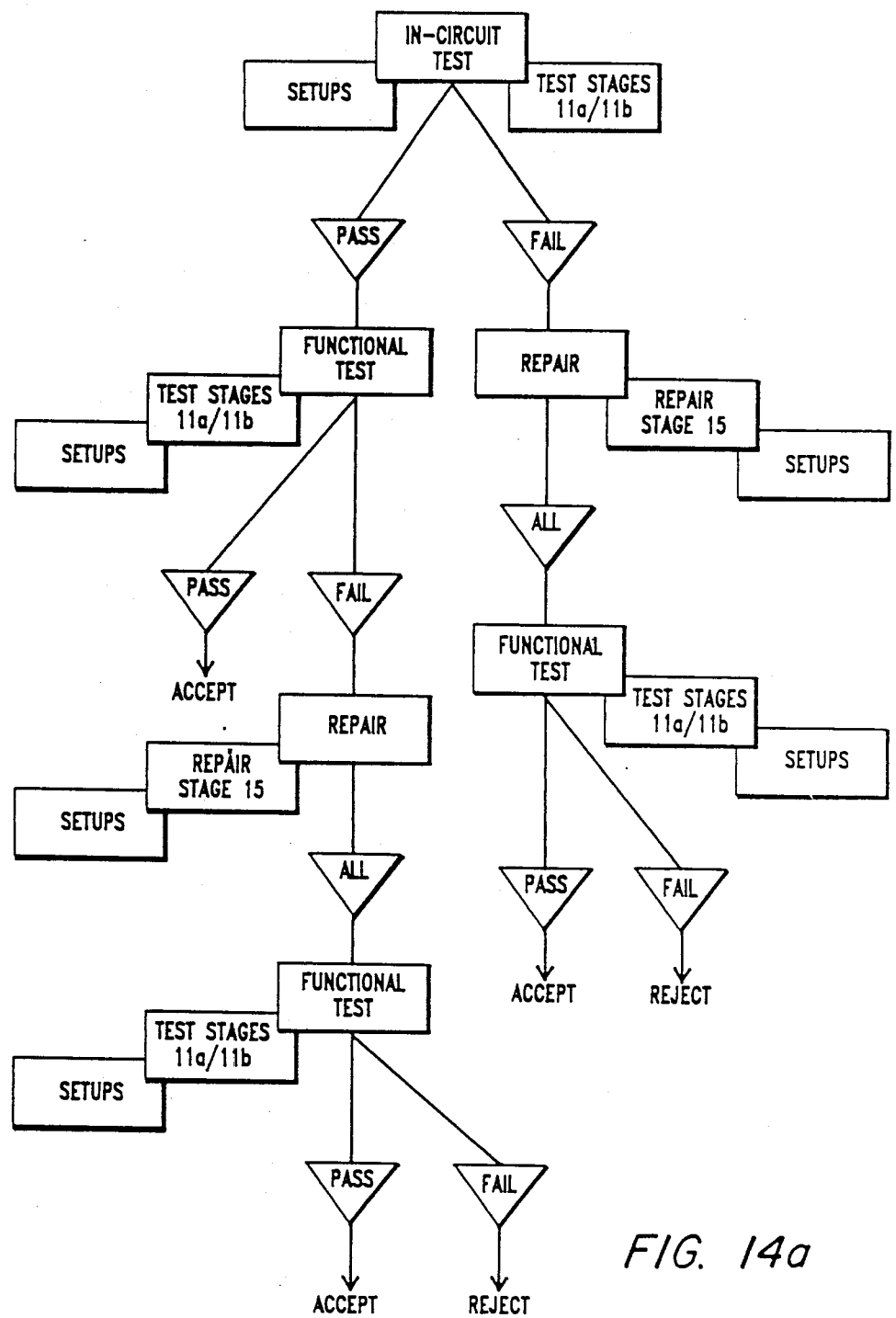
Figure 14B:
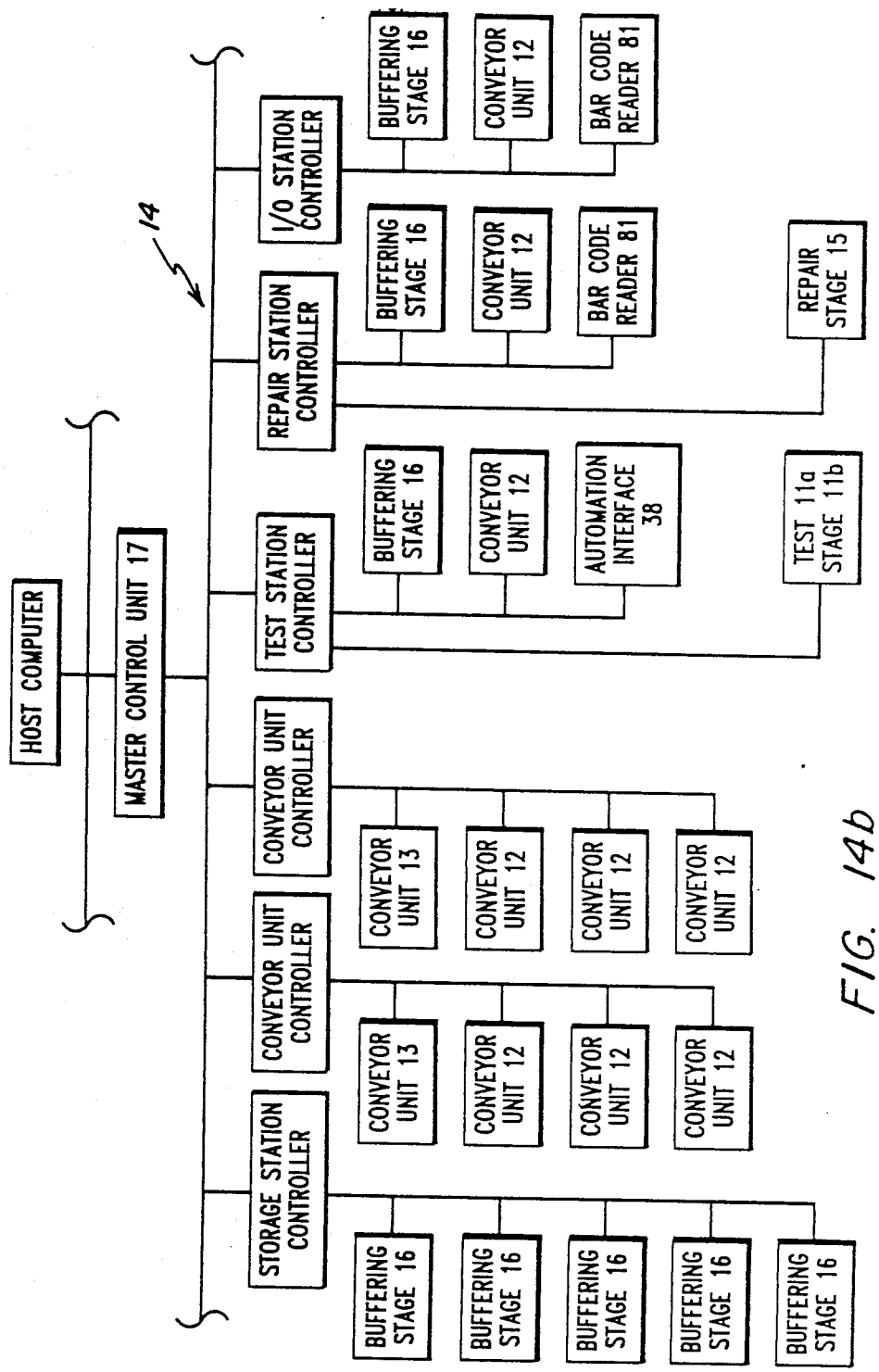
Figure 15:
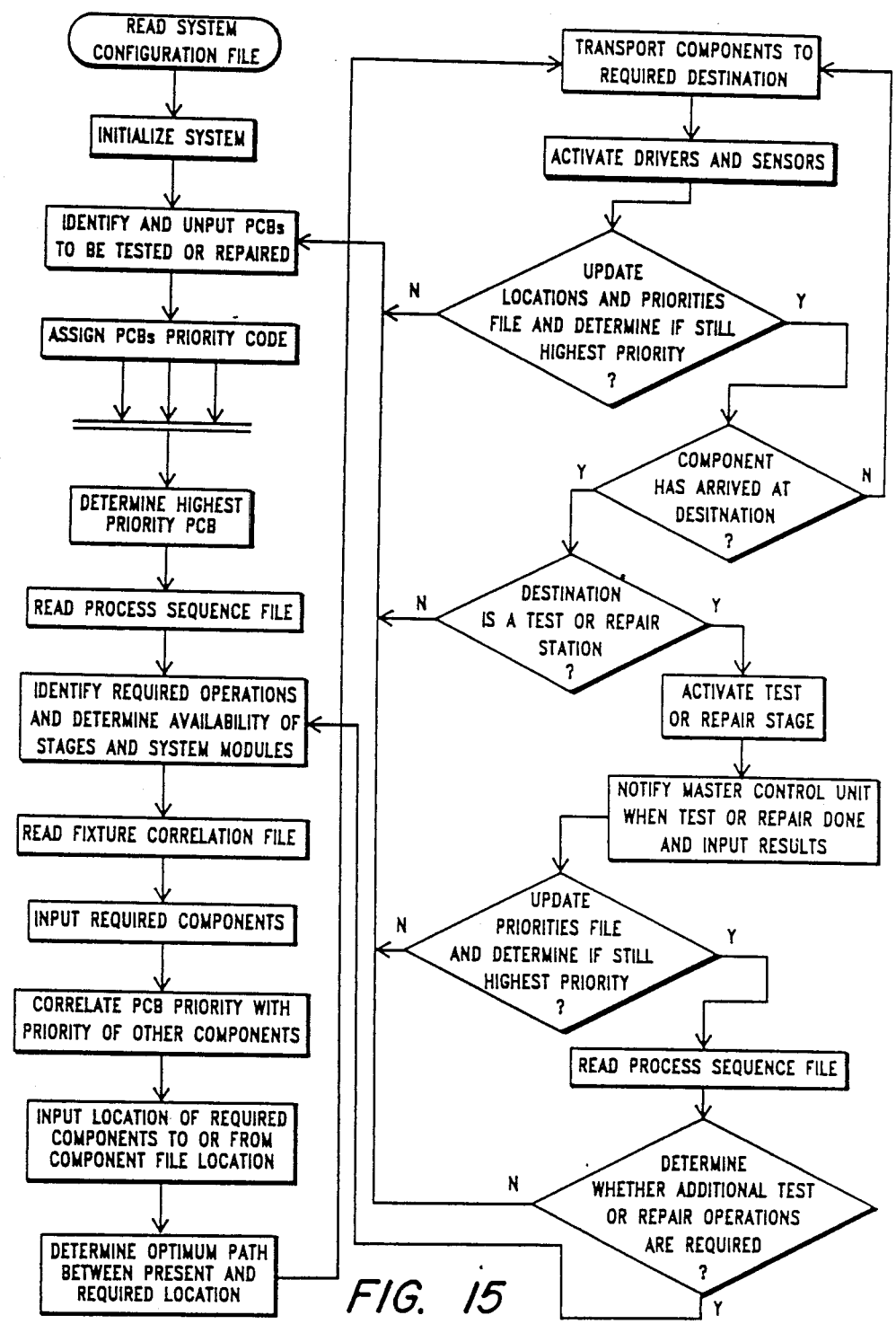
Figure 15A:
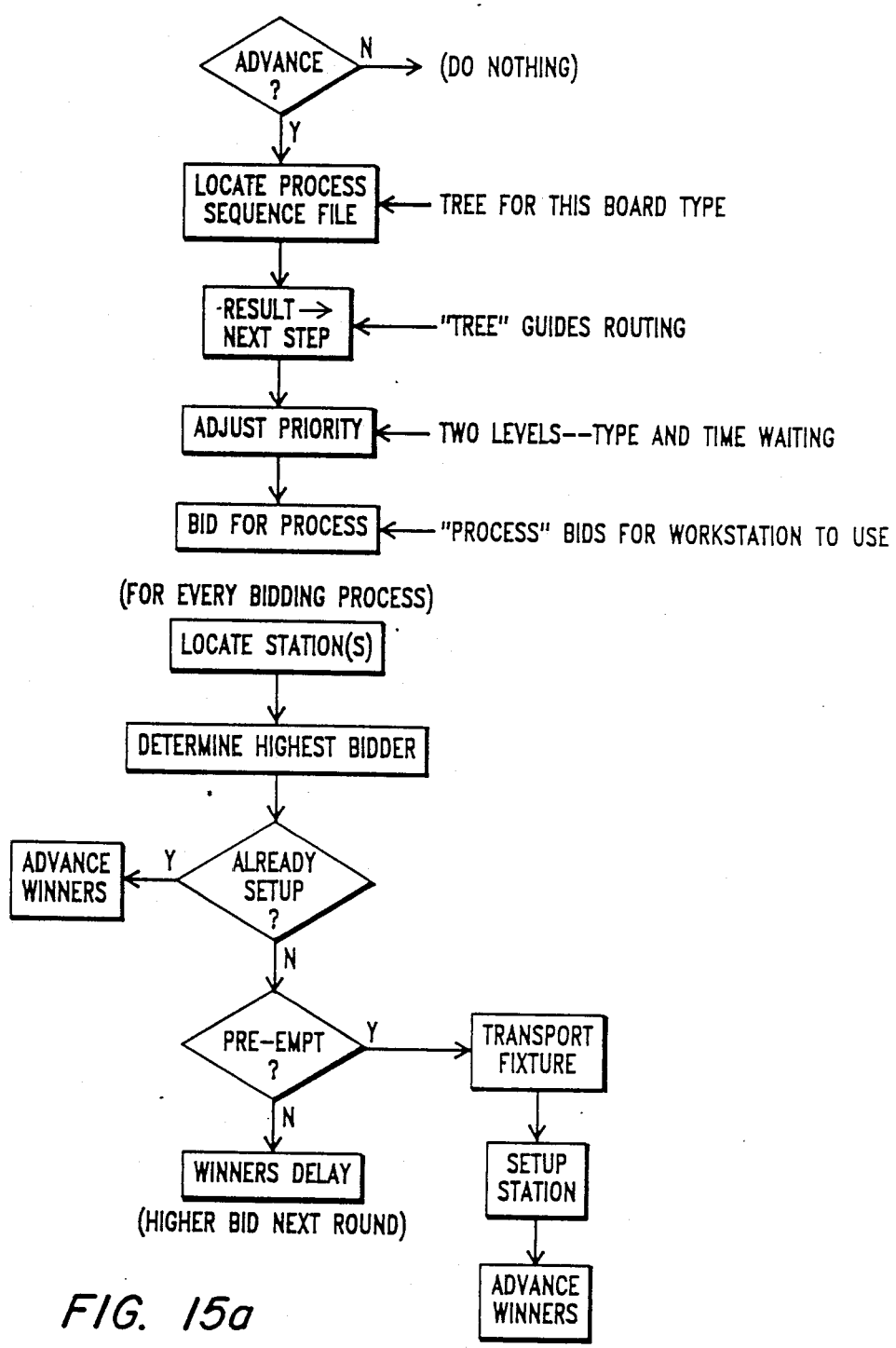

FIGS. 3 and 4 are partial sectional views taken along lines 3—3 and 4—4 respectively, of FIG. 2;

FIG. 5 is a partial end view of a conveyor unit according to the present invention;

FIG. 5a depicts a preferred component drive mechanism of a conveyor unit;

FIG. 5b presents four views of a conveyor unit of the present invention;

FIG. 5c is a partial sectional view taken along lines 5c—5c of FIG. 5;

FIG. 5d presents five views of a conveyor unit having component rotational capabilities;

FIG. 5e is a partial perspective view illustrating a component stop mechanism of a conveyor unit;

FIG. 6 is a perspective view of an automation interface according to the present invention;

FIG. 6a schematically depicts component movement in a workstation of the present invention;

FIGS. 6b, 6c and 6d are perspective views depicting sequential movement of a component into an automation interface;

FIGS. 7 and 8 are partial sectional views taken along lines 7—7 and 8—8 respectively, of FIG. 6;

FIG. 7a is an exploded view of the driven roller mechanism of an automation interface;

FIG. 7b is a top plan view of said driven roller mechanism depicting, in phantom, displacement of the roller;

FIGS. 7c and 7d are partial sectional and perspective views, respectively, depicting drive mechanisms for the guide rails of an automation interface;

FIG. 9 is a perspective view of a fixture assembly according to the present invention;

FIG. 9a presents four views of the fixture assembly of FIG. 9;

FIG. 9b is an exploded view illustrating the alignment of a stacked arrangement of components with an automation interface at a test stage;

FIG. 9c is an exploded view of the fixture assembly of FIG. 9;

FIG. 10 is a partial sectional view showing the relative positioning and location of the cover assembly, PCB, carrier, fixture assembly, and circuity connecting the same to a test stage;

FIG. 11 is a perspective view of a cover assembly according to the present invention;

FIG. 11a present a flow chart illustrating the operation of the automation interface of the present invention;

FIG. 11b is an isometric view illustrating a mechanism for varying the elevation of a cover assembly in an automation interface;

FIG. 11c illustrates the sandwiching of a PCB between two fixture assemblies;

FIG. 12 is a perspective view of a buffering stage according to the present invention;

FIGS. 12a-12c are simplified perspective views illustrating the operation of a buffering stage in a workstation;

FIG. 13 is a partial section view taken along line A—A of FIG. 12;

FIG. 13a is an elevation showing the relationship between a buffering stage and conveyor units on either side thereof;

FIG. 13b is an exploded view of a drive wheel mechanism and an idler tension wheel mechanism of a buffering stage;

FIG. 13c is a top plan view of a buffering stage;

FIG. 13d illustrates examples of a multi-station test and/or repair system constructed according to the present invention;

FIG. 14 is a functional block diagram illustrating the interconnection of the various modules according to the present invention;

FIG. 14a depicts an example of a decision tree for a type of PCB;

FIG. 14b is a block diagram of a typical control system of the present invention;

FIG. 15 is a flow chart illustrating the various steps of a method according to the present invention; and FIG. 15a is a flowchart depicting a dynamic priority rating and preemptive scheduling system of the present invention.

DETAILED DESCRIPTION OF THE INVENTION

Figure 1:
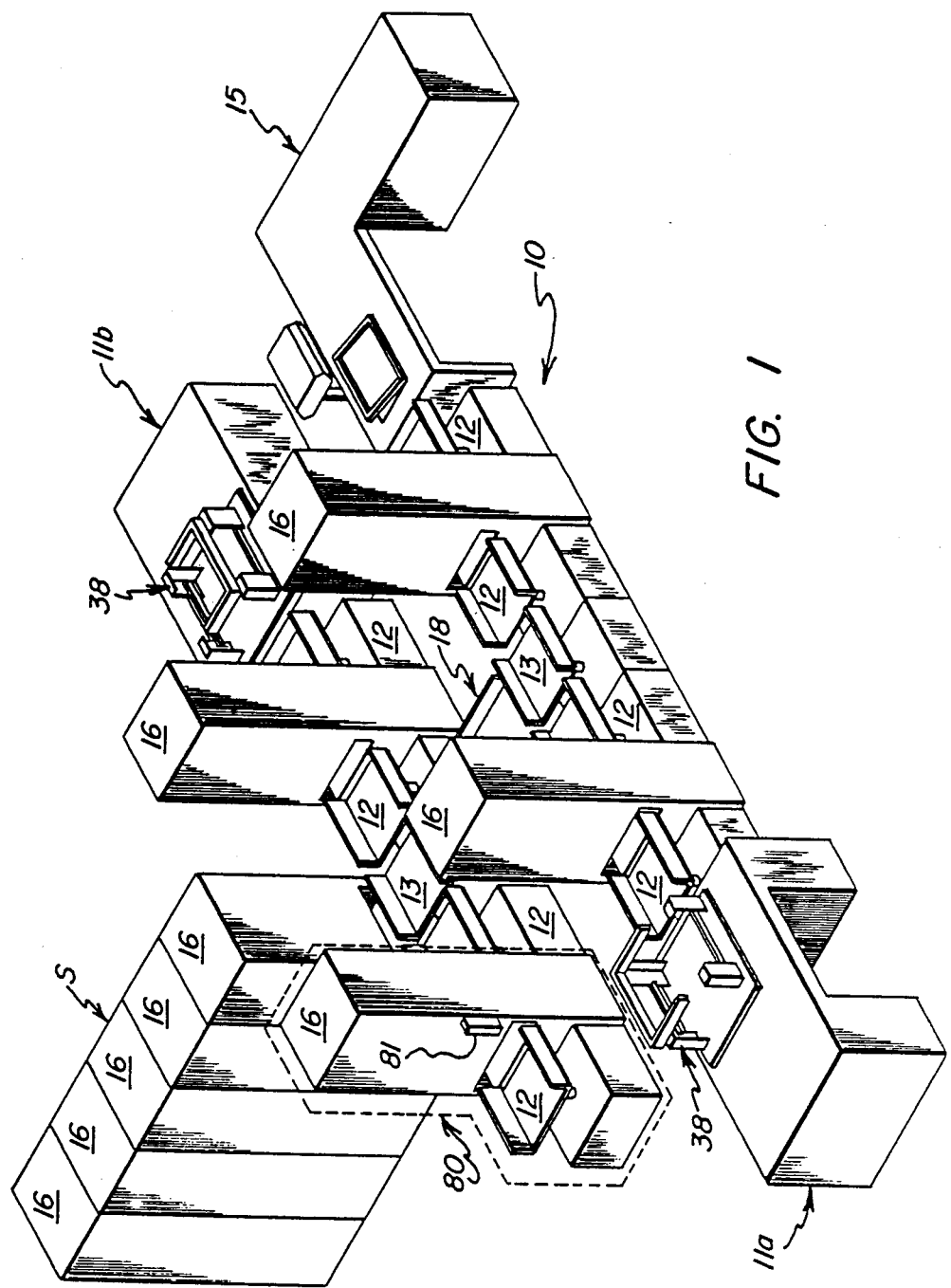
FIG. 1 is a perspective view of a testing system according to the present invention.

A perspective view illustrating various functional modules of the test system 10 according to the present invention is provided in FIG. 1. Depending upon the complexity and type of circuit or PCB being tested it may be necessary to use multiple test stages. It may also be necessary to use various combinations of test stages in different sequences to reliably locate the faults which might be present therein. As can be seen, the system 10 can include such multiple test stages, for example, stages 11a and 11b. The test stages 11 can be identical, or they can be of different types, e.g. functional, in-circuit, combinational, special device or component testers, bare board testers, etc. Such testors and the computer controllers employed to operate them are commercially available and therefor are not described in detail herein. Although FIG. 1 illustrates two test stages 11, the present invention is not intended to be limited to this number nor to the descriptions provided above. Conveyor means are provided to load and unload such PCBs and other transportable components from the test and/or repair stages and to transport such components there between. The conveyor means of the present invention employs plug together, modular conveyor units which are specifically adapted to afford flexibility in the configuration of the test system 10. Conveyor unit 12 is a linear conveyor which moves components in two directions, i.e., towards as well as away from a stage. It should be noted that such forwards and backwards motion is not commonly found in typical automated production lines which generally transport the items under process in one common direction. A more complex motion is however required to enable conveyor unit 12 to be utilized to transport components both into as well as out of a test stage 11, as is included in the present invention. To afford an even more flexible test and repair system, a conveyor unit 13 is provided incorporating the capability for the rotational movement of the components in addition to linear movement. The need for the rotational movement capability of conveyor units 13 is illustrated in FIG. 1a where an example transportable component 202 is transferred from the test station 11b to a repair station 15 (only the applicable portion of the system 10 being shown). The figure shows the progress of the transportable component 202 at intervals of time, not necessarily equal, as it is transported through the system. In FIG. 1a (iv), a conveyor unit 13 is shown as it is rotating 90 degrees counterclockwise in order to redirect the path of the transportable component 202. In FIG. 1a(vi), another conveyor unit 13 is shown rotating 90 degrees clockwise to alter the path of the transportable component 202 once again. That the conveyor units 12 and 13 transport components in two directions is apparent in that the transportable component 202 in FIG. 1a could also be transported from the repair station 15 to the test station 11b. Direct routing paths are in fact available between any two stations in a system 10. Various combinations of conveyor units 12 and 13 can be utilized to facilitate multiple arrangements of test stages 11 in order to optimize the test system 10 to the particular user requirements. Utilizing different types of conveyor units 12 and 13 not only provides increased efficiency, but additionally allows a user to reduce the cost of the test system by utilizing the less expensive linear conveyor 12 for those applications when rotational movement is not required. For example, the two conveyor units 12 labelled 200 and 201 in FIG. 1a(i) do not need to rotate, and the less expensive conveyor unit 12 can be used. It also allows the user to easily alter the configuration of the test system 10 as the requirements change.

Stages other than test stages 11 can be included within the test system 10. For example, FIG. 1 illustrates a repair stage 15, such as a model 404 repair system which is commercially available from the FACTRON/Schlumberger division of Fairchild Camera and Instrument Corporation. This repair stage 15 incorporates a repair and adjustment capability as well as a testing capability. A PCB can be diverted to stage 15 when repair (e.g. desoldering and replacement of components) or adjustments (e.g. repositioning of knobs or switches within the PCB) are required prior to completing the testing of the PCB. In addition, manual probing of the PCB may be accomplished such as may be required, for example, to trace a fault indicated as being on a common node having multiple connections thereto.

Buffering or set-up stages 16 are also included in system 10 to afford a smooth flow of components in and out of the various test or repair stages. The buffering stages 16 can also be utilized to form a storage station S for PCBs and other components and in an input/output station 80 for the test system 10. As shown, the input/output station 80 also includes a conveyor module 12 and bar code reader 81 (the operation of which will be described hereinafter) and facilitates the loading and unloading of components into and out of the test system.

As illustrated in FIG. 1, associated with each test stage 11, is an automation interface 38 which facilitates the loading and electrical engagement of test fixture assemblies and PCBs on the testor. The construction and operation of automation interface 38 will be described in detail hereinafter. As shown in the plan view of FIG. 1b(i), each test stage 11, together with its associated automation interface 38 and the immediately preceeding conveyor module 12 and buffering stage 16 define a test station TS. Similarly, repair stage 15 and immediately preceeding conveyor module 12 and buffering stage 16 define a repair station RS.

Physically interconnecting the repair (RS), test (TS), input/output (I/0) and storage (S) stations of test system 10 is a transport system, generally denoted 18, consisting of a suitable arrangement of plug together conveyor units 12 and 13. The transport system allows direct routing of PCBs and other components from any station to any other station, in either direction, under the control of a master control unit and distributed controllers. To illustrate the modularity of the system 10, alternate configurations of the system 10 are shown in FIG. 1b in which all the same stations are used in three different configurations. FIG. 1b(i) shows the configuration of the system 10 in a plan view as a reference. As an example, it may be desireable to interchange the locations of storage station S with the test station $TS_b$ in a particular application. This configuration is shown in FIG. 1b(ii). As a further example, it may be desireable to interchange the locations of the storage station S and the test station $TS_b$, and also the repair station RS and the test station $TS_a$. This configuration is shown in FIG. 1b(iii). In addition, each of the pictured configurations can be expanded to include additional conveyor units, buffering stages and/or test/repair stages, e.g. at the locations denoted "X" in FIGS. 1b(i), (ii) and (iii). A significantly expanded system is shown in FIG. 13d. In the preferred embodiment of the invention, the number, type and physical layout of stations is determined based on the number of PCBs to be tested and/or repaired, the number of test/repair stages required to process the PCBs and the physical space requirements of the application. The details of the control system and the overall operation of test system 10 will be more fully explained after a detailed description of the system hardware is presented.

To facilitate the movement of various PCBs throughout the test system 10 the present invention utilizes a carrier 20, which is best illustrated in FIG. 2. The carrier 20 is designed to be adjustable to accommodate a wide range of sizes and configurations of PCBs 19. By utilizing adjustable carriers 20 the test system 10 can accommodate various sizes and configurations of PCBs without requiring manual intervention or downtime to adjust the remainder of the test system 10 for a specific size or configuration PCB. By combining this feature with other aspects of the present invention, the test system 10 of the present invention can concurrently accommodate or intermix different PCBs 19, e.g. different shapes and sizes. This is particularly useful and cost effective for users who do not consistently test a large volume of the same PCBs 19. The carrier 20 includes a frame having interconnected members 22a, 22b, 22c and 22d circumscribing and thereby defining an interior area sufficiently large to accommodate the PCBs 19 which are intended to be tested. At least two of the interconnected members 22a and 22c are generally parallel to each other and form opposing supports for two suspension beams 23. The suspension beams 23 are mounted in a manner which facilitates the lateral adjustment of the suspension beams 23 along the members 22a and 22c (See FIG. 3). The interior surface of each of the members 22a and 22c has a longitudinal channel 24 therein which is adapted to loosely receive the distal ends of the suspension beams 23. Such distal ends include a threaded bore having a corresponding set screw 25 engaged therein. Tightening such set screw 25 against one of the side walls forming such channel 24, which side wall is extended to overlap such bore, causes the displacement of the beam 23 within the channel 24 to a position in which it is frictionally engaged with the opposing side wall of the channel 24. Loosening such set screw 25 affords the movement of the suspension beams 23 within the channels 24. The beams 23 can thus be displaced with respect to each other to accommodate varying lengths (or widths) of the PCB. One or more support brackets 26 are adjustably mounted on each of the beams 23 and adapted to engage the edges of a PCB 19. The brackets 26 (See FIG. 4) include springs 30 which can be biased toward the beams 23 to frictionally engage the beams 23 but which can also be pivoted to a position spaced from the beams 23 to release the brackets 26 from frictional engagement with the beams 23 and afford the movement of the brackets 26 along the beams 23 in order to adjust for differing sizes and shapes of PCBs. The edge of the brackets 26 which is proximate to the PCB 19 has a groove 28 therein which is adapted to receive an edge of the PCB 19. Similarly, the proximate end 31 of the spring 30 is also adapted to receive this edge of the PCB 19. The bracket 26 is designed such that the absence of a PCB 19 will allow the spring 30 to pivot toward its spaced position thereby releasing the beam 23. The insertion of a PCB 19 between the proximate end 31 of the spring 30 and the groove 28, however, biases the spring 30 to engage the beam 23. The resilience of the spring 30 also securely captures the PCB 19 between the groove 28 and the proximate end 31 of the spring 30. Since a typical PCB may have components mounted at varying positions adjacent its outer edge it is possible with the present invention to adjust the brackets 26 along the beam 23 to a position which minimizes interference with these components. The parallel side members 22a and 22c also facilitate the transport of the carrier 20 by the conveyor units 12 and 13. For this purpose at least one surface 21 of the generally parallel side members 22a and 22c of the carrier 20 is substantially planar and has a coefficient of friction promoting the transport of the carrier 20 by the conveyor units 12 or 13. Furthermore the side members 22a and 22c include a projecting ridge 29, the operation of which, as well as the operation of the planar surface 21 will become apparent as a result of the description of the conveyor units (supra). Each of the carriers 20 also contain structure to accurately locate the carriers 20 when they are positioned within any of the various stages 11 or 15 making up the system 10, as will be explained. In the embodiment illustrated the location holes 27 provide this locating structure.

As has already been discussed the conveyor unit 12 and 13 provide for the transport of components, e.g. The carriers 20 and the PCBs therein between the various stages 11 and 15 of the test system 10. Although a variety of drive means can be utilized to transport the components; the illustrated embodiment (See FIG. 5) employs driven rollers 32 which establish frictional contact with the exterior planar surface on the members 22a or 22c of the carriers 20, or similar surfaces provided on other components to be transported. The rollers 32 are driven in a conventional manner by a dc motor 34. The driven rollers 32 are supported on guiderails 91 on chassis 31 in a conventional manner and positioned adjacent both the opposing ends of the conveyor units 12 or 13 to maintain control over a transported carrier 20 as it passes in either direction into or out of one conveyor unit 12 or 13 to an adjacent conveyor unit 12 or 13, or into and out of a test stage 11 or a repair stage 15, as is applicable. The direction of travel of the rollers 32 is determined by the polarity of the dc motor 34. Guide rails 91, also supported upon the chassis 31 in a conventional manner and located adjacent opposing sides of the path of the carrier 20, contain channels 92 which are adapted to receive the projecting ridges 29 of the carriers 20 or similar projecting ridges on other transported components, thereby guiding as well as supporting the components.

In the illustrated embodiment of the drive means, (see FIG. 5a) a belt 203 and pair of sprockets 204 or similar devices are used to transfer the rotation of the dc motor 34 from a first roller 32, mounted on the rotor 33 of motor 34, to a second roller 32. Openings 205 in the guide rail 91 allow the rollers 32 to contact the exterior planar surfaces of members 22a or 22c of the carriers 20 when the projecting ridges 29 of the carrier 20 are captive inside channels 92. As described hereinafter, the same drive scheme may be advantageously employed in buffering stage 16 and automation interface 38.

FIGS. 5b(i), (ii), (iii), and (iv) show a conveyor unit 12 in side, front, and top views and in perspective, respectively. In FIG. 5b(iv), an empty carrier 20 is shown outside of the conveyor unit. This figure is included to illustrate how a carrier 20 is presented to the conveyor unit. The carrier 20 is presented to the conveyor unit 12 by an adjacent conveyor unit 12 or 13, buffering stage 16 or automation interface 38 (not shown).

FIG. 5c shows an enlarged section taken along lines 5c—5c of FIG. 5. The frictional contact between the outer periphery of rollers 32 and the planar surfaces of members 22a or 22c of carrier 20 is clearly shown. As the rotor 33 of dc motor 34 rotates, a force is applied to the carrier 20 by rollers 32 causing it to move. As shown in FIG. 5c, the carrier would move into or out of the page. The dc motor 34, rollers 32, belt 203 and sprockets 204 are supported on the guide rail 91 in conventional manner (not shown). It should be noted that although a carrier is pictured, a fixture assembly (FIG. 9) or a cover assembly (FIG. 11) could be pictured instead of the carrier and would be moved in identical fashion.

In order to change the direction of transport by other than 180 degrees, the conveyor unit 13 having component rotational capabilities, includes a stepper motor 95 and associated conventional bearing and gearing mechanisms or their equivalent (not shown), to rotate the chassis 31, supporting the rollers 32, about a vertical axis "V". FIGS. 5d(i), (ii), (iii), (iv) and (v) show side, front, top, perspective and rotated top views, respectively, of the conveyor unit 13. In FIG. 5d(v), the chassis 31 is shown rotated by some amount. The stepper motor 95 and associated bearing and gearing mechanisms or their equivalent (not shown) are used to effect the pictured rotation. The stepper motor is microprocessor controlled to allow flexibility in the orientation of the chassis 31 and consequently the path along which components are transported. The necessity for flexibility in the path for components was previously described in conjunction with FIG. 1a. The speed and polarity of the dc motor 34 and therefore the driven rollers 32, are microprocessor controlled to afford controlled, bi-directional motion, in the path along which a given component is transported. Conveyor unit 12 and conveyor unit 13 are substantially identical except that conveyor unit 12 excludes the stepper motor 95 and its associated mechanism. Each of the conveyor units 12 and 13 also includes appropriate sensors (see FIG. 14) to determine the presence and location of a carrier 20 or other transported component therein. Similarly sensors also determine the relative positioning of the chassis 31 of the rotatable conveyor unit 13. The position of the chassis 31 of conveyor unit 13 can be sensed, for example, when the chassis is rotated to 0, 90, 180 and 270 degrees from a reference orientation. This can be accomplished with mechanical, optical, magnetic, capacitive, or other type of conventional sensors. If the test system 10 requires a conveyor unit to stop or hold the transport of a carrier 20 or other transported component, stop solenoids are also provided at the entrance and exit ends of such conveyor units. When actuated the moveable element of such solenoids is interposed within the path of the carriers 20 to prevent further motion. FIG. 5e shows a portion of a conveyor unit 12 or 13 with a stop solenod 206. The moveable element of the solenoid 206 is shown removed from the path of motion of the fixture assembly 47 so as to allow its motion, and in phantom the moveable element is shown interposed in the path of the fixture assembly 47 so as to prevent its motion. A fixture assembly 47 is pictured to illustrate that the fixture assembly 47 is transported in a conveyor unit 12 or 13 in the same manner as a carrier (See FIG. 5c). The conveyor units 12 and 13 are adapted to be utilized in modular form. For example, one of the conveyor units 13 can contain a conveyor controller or microprocessor (See FIG. 14) which can provide control for some predetermined quantity of slave conveyor units 12. These slave conveyor units 12 can simply be plugged into the master conveyor controller and such controller can be programmed with the location and identity of the additional conveyors 12 and 13 being utilized within the test system 10 and plugged therein, thereby avoiding the need for redundant microprocessors within each of the slave conveyor units 12. Each slave conveyor unit will, however, contain drivers, sensors, and stops to the extent required, such as have been described above.

The test system of the present invention also includes an automation interface 38 (See FIG. 6) which interfaces the test stages 11 with the conveyor units 12 or 13. Similarly a suitably configured automation interface can be provided to interface repair or other stages to the transport system 18 via a buffering stage 16 (more fully described hereinafter). The automation interface 38 of the present invention is adapted to be utilized with existing testers such as are now commercially available. The automation interface 38 incorporates mechanisms to transport components by imparting a force to the side of the component via a roller (as is done in the conveyor units 12 and 13) as well as mechanisms to change the elevation of components after they are captive in the automation interface 38. These two functions are illustrated in FIG. 6a which shows a test work station. The figure shows a side view of a conveyor unit 12, buffering stage 16, and an automation interface 38 on a test stage 11a, with movement of a fixture assembly 47 shown in phantom. The fixture assembly 47 is pictured in four positions: A, B, C and D. The four positions represent locations the fixture assembly 47 would occupy at distinct intervals in time as the work station is operated. The figure illustrates that an essentially horizontal motion of the component transports the component between the buffering stage 16 and conveyor unit 12, and between the conveyor unit 12 and the automation interface 38 and that an essentially vertical motion is used to elevate the component between the operating level of the conveyor unit 12 and the operating level of the test stage 11a. The mechanisms to perform these functions will be discussed in detail hereinafter. The automation interface 38 contains a driven roller 39 similar to those utilized by the conveyors 12 and 13. The driven roller 39 is positioned to engage the exterior planar surfaces of parallel side members 22a and 22c of the carriers 20 as the carriers 20 exit from the conveyor units 12 or 13. In this manner the roller 39 can maintain control of the carriers 20 or other components when the rollers 32 of the conveyor units 12 or 13 have lost effective control. This is illustrated in FIGS. 6b, 6c and 6d where a carrier 20 is shown at distinct intervals of time during its transportation into an automation interface 38. Shown are the carrier 20 with a PCB 19, a conveyor unit 12, and relevant portions of the automation interface 38 on top of a receiver 56 and test stage 11. Much of the mechanism of the automation interface 38 is not shown so that the function of the roller 39 can be clearly seen. In FIG. 6b, a carrier 20 with a PCB 19 is shown entering the conveyor unit 12. The buffering stage 16, in the preferred embodiment of the invention, is adjacent to the conveyor unit 12 at the end opposite the automation interface 38, as shown in FIG. 6a. At the interval of time illustrated by FIG. 6b, the motion of the carrier 20 is being controlled by the conveyor unit 12, wherein the rollers 32 are engaging the carrier 20. In FIG. 6c, the carrier 20 is shown in such a position that the rollers 32 of the conveyor unit 12 no longer engage the carrier 20 and consequently have lost effective control. However, roller 39 of the automation interface is now engaging the side of carrier 20 and exercising control over carrier movement. At least one roller is always in contact with carrier 20, so that it is always under control. In FIG. 6d the carrier 20 is shown fully supported inside the automation interface 38. It is clear from FIGS. 6a through 6d that although components must be elevated between different operating levels, the roller 39 can be fixed at the operating level of the conveyor unit 12 or 13. It should be noted that although a carrier 20 and PCB 19 are shown in FIGS. 6b through 6d, a fixture assembly 47 or cover assembly 62 could have been shown. In the preferred embodiment of the invention, the components are transported to the automation interface in such a manner as to create the assembly shown in FIG. 10. The driven roller 39 is driven by dc motor 96, which is also under microprocessor control. DC motor 96 is mounted upon a supporting column 97 by a bracket 98. See FIG. 7a. The supporting column 97 is in turn rotatably mounted upon a bracket assembly 99 which is affixed to the frame 100 of the automation interface 38. The frame 100 is an essentially planar, rectangular surface circumscribing an essentially rectangular opening, upon which the structure and mechanisms of the automation interface are mounted. Also mounted upon the bracket assembly 99 is a solenoid 101 or similar device which can be actuated to extend an arm 102 to the position indicated by 102a (as shown by dashed lines in FIG. 7). The arm 102 is pivotably connected to the supporting column 97. Therefore, the extension of the arm 102 will rotate the column 97 through the slotted extension arm 207. Such rotation of the column 97 will pivot the dc motor 96 to a position 96a where the driven roller 39 passes through an opening 208 within the rails. 44 and frictionally engages the carriers 20. The rotation of column 97 and subsequent displacement of the roller 39 to a position labelled 39a is illustrated in the top view of FIG. 7b. The purpose of this displacement will be discussed later. The opening 208 in the rails 44 is illustrated in FIGS. 6b through 6d. Similarly the retraction of the arm 102 will disengage the driven roller 39 from the carriers 20. The automation interface 38 further contains elevator means 40 (See FIG. 7c and 8) which is adapted to raise and/or lower the components with respect to the operating level of the conveyor units 12 or 13. In the preferred embodiment the elevator means 40 comprise two spaced rails 44 which are substantially parallel to each other which elevate at the same rate such that the two spaced rails 44 remain essentially parallel, and that the plane defined by the two spaced rails 44 remains essentially horizontal throughout the travel of the rails 44. Each of the rails 44 contains a longitudinal channel 45 therein which is adapted to receive and support the projecting ridge 29 extending along the side members 22a and 22c of the carriers 20. This is illustrated in FIGS. 6b-6d. The rails 44 are themselves supported on air cylinders 43 or the like which afford the relative movement of the rails 44 from a position supporting the carriers 20 to a position where the rails 44 are spaced from the carriers 20. This motion is illustrated in FIG. 7c. The rails 44 are shown spaced from a fixture assembly 47, and in phantom in a position where they would be supporting the fixture assembly 47. The necessity for this motion is apparent in that in order to deposit a component and/or elevate the rails 44 to some other operating level, they must be spaced from the side of the fixture assembly. The necessity to elevate the rails 44 to some other operating level arises from the need to stack components as shown in FIG. 10. The air cylinders 43 are in turn supported by the shuttle members 42 of lead screw mechanisms 41, and the lead screw mechanisms 41 are driven by a stepper motor 36 which is microprocessor controlled. A drive belt 35 in combination with various pulleys are driven by motor 36 and in turn drive lead screw mechanisms 41 located at each of the opposing corners of the rails 44. Rotation of the multiple lead screw mechanisms 41 by the motor 36 will raise or lower the rails 44 in a controllable manner. This is shown schematically in FIG. 7d. The rails 44 can therefore be positioned at the operating level of the conveyors 12 and 13, and the air cylinders 43 can be actuated to move the rails 44 to the position at which they can support the carriers 20. In addition solenoid 101 can be actuated to bring the driven roller 39 into frictional engagement with the carrier 20 through the opening 208 in the rail 44, since the roller 39 and rails 44 are at the operating level of the adjacent conveyor unit 12 or 13. The purpose of the solenoid 101 and pivotably mounted bracket 97 shown in FIGS. 7 and 7a is now clearly visible. Since the rails 44 are elevated between the operating level of the adjacent conveyor unit 12 or 13 and a level which is below that level (as seen in FIG. 7c) the roller 39 must be removed from contacting the side of the component which is supported inside the rails 44 in order to raise or lower that component. A carrier 20 can then be transported by the driven rollers 32 of the conveyor units 12 or 13 and/or the driven rollers 39 of the automation interface 38 into the channels 45 of the rails 44 as seen in FIGS. 6b-6d. Conventional mechanical stops or solenoids (See FIG. 14) can be utilized to ensure the carrier 20 is fully transported and accurately positioned within the rails 44 as seen in FIG. 6d. The solenoid 101 can then retract the driven roller 39 and the lead screw mechanisms 41 can be driven to raise or lower the carrier 20 from the operating level of the conveyor unit 12 or 13 to the operating level of the test stage 11. The automation interface also includes appropriate sensors (See Fig. 14) similar to those described with regard to the conveyor units to determine the presence of a carrier 20 or other transported component therein. Similarly, sensors are also available to determine the positioning of the elevator means 40 and the rails 44.

As has already been stated, PCB testers traditionally use fixturing assemblies to achieve electrical contact with the PCBs under test. Traditionally, these fixture assemblies are manually loaded onto the testers and the probes therein are electrically connected to the various stimulus and measurement means included within the testers. The PCBs which are to be tested are then individually and manually placed upon such a fixture assembly and accurately located with respect to the probes. A detailed discussion of a fixturing system such as is described above is set forth in U.S. Pat. 4,352,061 (hereinafter "061 Patent"), the teachings of which are incorporated herein by reference. Such a fixturing assembly as is taught by the 061 Patent can be adapted to permit its transport by the conveyor units 12 and 13, buffering stages 16 and automation interface 38. The fixture assembly is best illustrated in FIGS. 9, 9a and 10. In FIG. 9 the fixture assembly 47 is shown in perspective with a portion cut away to expose the interior structure of the assembly. A complete picture of the fixture assembly 47 is shown in the bottom, side, front and top views, respectively, of FIGS. 9a(i), (ii), (iii) and (iv). In FIG. 10, a partial section is shown of a fixture assembly 47, a carrier 20 and a cover assembly 62 as they would be configured just prior to invoking a test. The stacked arrangement of components is shown resting on a receiver 56, which would be supported by the test station 11. It should be noted that each of the three components (fixture assembly 47, carrier 20 and cover assembly 62) would be transported to the automation interface 38 by the conveyor units 12 and 13 and buffering stages 16, as required, and that each would be lowered to an operating level by the elevator means of the automation interface so as to produce a desired stacked arrangement of components, e.g. as shown in FIG. 10. The fixture assemblies 47, adapted according to the present invention, include a frame 48 having interconnected members 48a-48d circumscribing and thereby defining an interior area sufficiently large to accommodate the larger PCBs which are intended to be tested. The frame 48 has at least 2 parallel side members 48a and 48c adapted to afford the transport of the fixture assembly 47 by the conveyor units 12 and 13, buffering stage 16 and automation interface 38. For this purpose at least one surface on each of the parallel side members 48a and 48c of the fixture assembly 47 is substantially planar and has a coefficient of friction which will promote the transport of the fixture assembly 47 by the conveyor units 12 or 13, buffering stage 16 and automation interface 38. Side members 48a and 48c also include a projecting ridge 58 which will be received by the aforementioned channels 45 of the automation interface and 92 of the conveyor units. In addition, location holes 52 similar to those described within the carrier 20 are also added to facilitate locating the fixture assembly 47 with respect to the automation interface 38. The means by which the fixture assembly 47 is located with respect to the automation interface 38 is illustrated in FIG. 9b. In the figure, distances a and b show that the location of the automation interface 38 is referenced to receiver 56 via the two columns 60. The two columns 60 also reference the fixture assembly 47, carrier assembly 20 and cover assembly 62 with respect to the receiver 56. Hence, the fixture assembly 47 is referenced to the automation interface 38. Supported within the frame 48 is a nonconductive plate 49. Typically this plate 49 is manufactured from materials having characteristics resulting in a plate 49 which is both lightweight and yet capable of withstanding substantial forces without significant deformation. One such material is manufactured and sold by General Electric Company under the designation G-10 epoxy glass cloth, although comparable glass, paper or cloth laminates are also useable. A predetermined array of electrical probes 51 are supported within and pass through this plate 49. These probes 51 are positioned in a pre-arranged pattern to correspond with selected nodes on the PCB 19 which is to be tested. As has already been described, this pattern will typically be unique for each type or model of PCB 19 which is to be tested. The array of probes 51 is electrically connected to an array of posts 53 which are supported within a contact panel plate 54. Either individual wiring or a personality or universal matrix platen concept such as is described in the 061 Patent could be utilized to provide this electrical connection. The contact panel plate 54 is also constructed from materials similar to those described with respect to plate 49, and is similarly affixed to the frame 48. Spacers 55 between plate 54 and plate 49 ensure that plates 54 and 49 remain substantially parallel and rigid. A view of a fixture assembly 47 is shown in FIG. 9c. All of the components of the assembly are shown except the means of electrical connection between the array of probes 51 and the array of posts 53. The test stages 11 contain a receiver 56 also having an array of probes 57 which correspond to the array of posts 53. The probes 57 of the receiver 56 are electrically connected to the various stimulus and measurement means included within the test stages 11. Actuating means (not shown) such as the vacuum described in the 061 Patent are utilized to draw the posts 53 of the contact panel 54 toward the probes 57 of the receiver 56 thereby establishing electrical connection between the probes 57 of the receiver 56 and the posts 53 of the fixture assembly 47. Alternative actuating means (not shown) such as electronic motors, hydraulic cylinders, lever mechanisms, camming mechanisms, etc. can also be utilized to establish this electrical connection.

In a manner already described with regard to the carriers 20, the fixture assemblies 47 can be transported by the conveyor units 12 and 13 to a desired automation interface 38 of the required stage 11. Similarly the elevator means 40 of the automation interface 38 can be used to raise or lower the fixture assembly 47 from the operating level of the conveyor units 12 and 13 to a level where the contact panel plate 54 can be brought into preliminary engagement with the receiver 56. Simultaneously the air cylinders 43 supporting the rails rails 44 can be actuated to cause the rails 44 to release the projecting side members 58 of the fixture assemblies 47. The exact positioning of the fixture assemblies 47 with respect to the stages 11 is achieved by including guide columns 60 within the test stages 11a and 11b. These guide columns 60 cooperate with the location of the location holes 52 within the fixture assembly 47 to accurately position the fixture assemblies 47. See FIG. 9b. Preferably either the columns 60 or the holes 52 are tapered to ensure engagement.

A PCB 19, positioned within a carrier 20, can then be transported to the test stage in a manner already described and positioned upon the fixture assembly 47. See FIGS. 9b and 10. Once the PCB is loaded upon a fixture assembly 47, the test systems' actuating means, e.g. a vacuum, is utilized to draw the PCB 19 and the fixture assembly 47 toward the receiver 56 and thereby compress the spring loaded probes of the fixture assembly 47 to ensure electrical connection between the fixture assembly 47 and the conductive paths of the PCB 19. To ensure that a vacuum can be drawn between the PCB 19 and the fixture assembly 47 the preferred embodiment of the present invention utilizes a cover assembly 62 (See FIG. 11) which includes a frame 64 having interconnected members 64a-64d circumscribing and thereby defining an interior area sufficiently large to accommodate the PCBs 19 which are intended to be tested. At least two of the interconnected members 64a and 64c have at least one surface which is substantially planar and which has a coefficient of friction promoting the transport of the cover member 62 by the conveyor units 12 and 13, buffering stage 16 and automation interface 38. Side members 64a and 64c also include a projecting ridge 63. Frame members 64b and 64d contain location holes 61 analogous to those of the carrier and fixture assembly. Suspended across within the frame 63 is a sealing diaphragm 65 which is constructed of a resilient material such as that utilized in the construction of surgical gloves. This diaphragm 65 is supported within the frame 64 in a manner restricting passage of the atmosphere between the frame 64 and the diaphragm 65. The diaphragm 65 is adequately elastomeric such that it is capable of enveloping the PCB 19 in a manner similar to shrink wrap packaging, without damaging the components on the PCB or without itself becoming damaged. The use of such cover assembly 62 affords the elimination of custom edge seals and gaskets which are required by conventional fixtures. In a manner already discussed, the cover assembly 62 can be transported by the conveyor units 12 and 13, buffering stage 16 and automation interface 38 to an appropriate stage 11a or 11b.

Since the cover assemblies 62 are not PCB specific and will function with practically all PCBs 19 and fixture assemblies 47, the automation interface 38 of the present invention is adapted to include separate lifting means (See FIGS. 6 and 11b) for the cover assemblies 62. These lifting means include a lifting carriage 85 having interconnected members forming a substantially U-shaped configuration. Two legs of the carriage 85 are substantially parallel and have solenoids 87 (or comparable devices) mounted thereon which are adapted to engage cover support holes 88 within the frame 64 of the cover assembly 62. The lifting carriage 85 is supported on an air cylinder 89 and slide mechanism 90. Once a cover assembly 62 has been transported to a given automation interface 38, the carriage 85 can be lowered over the cover assembly 62, and the solenoids 87 can be actuated to engage the support holes 82, thereby locking the cover assembly 62 to the carriage 85. The air cylinder 89 can then be actuated to lift the cover assembly 62 within the slide 90 above the operating level of the conveyor unit, thereby clearing the path for the transport of additional carriers 20 and fixture assemblies 47 without requiring the unloading and transport of a cover assembly 62 for every change in carriers 20 or fixture assemblies 47. Obviating the need to repetitively transport a cover assembly 62 between an automation interface 38 and a buffering stage 16 further reduces the time taken by the system 10 of the present invention to test and/or repair PCBs. To facilitate the vacuum seal, either the frame 64 of the cover assembly 62 or the frame 22 of the carrier 20 contains appropriate gasket means to create a seal between the carrier 20 and the cover assembly 62 when the two are placed adjacent to one another. In the preferred embodiment the diaphragm 65 is extended over the frame 64 to provide such gasket means. Similarly either the frame 22 of the carrier 20 or the frame 48 of the fixture assembly 47 will also contain appropriate gasket means 67 to seal the space there between when the carrier 20 (and PCB 19) is placed upon the fixture assembly 47. Likewise gasket means 68 are interposed between the fixture assembly 47 and the contacting surface of the test stage 11. It is apparent to one skilled in the art that such gasket means in cooperation with the cover assembly 62 will facilitate a sealed chamber which can be evacuated in order to draw the diaphragm 65 downward in response to the greater atmospheric pressure above the diaphragm 65 resulting from the vacuum, and thereby force the PCB 19 and the fixture assembly 47 toward the receiver 56. Suitable sensors (not shown) are included with the present invention to ensure the presence of an adequate vacuum, which is also an indication that the fixture assembly 47 and the PCB have been drawn into contact.

An example is now provided showing how the automation interface 38 operates with fixture assemblies 47, carriers 20, cover assemblies 62, conveyor units 12 and buffering stages 16 in FIG. 11a. This figure illustrates the sequence of events for testing two different types of PCBs. These two types are called type A and type B. In the example, 2 PCBs of type A and 1 PCB of type B are tested. The fixture assemblies associated with each of these PCB types are called fixture A and fixture B respectively. It is assumed that all of the necessary components for the two tests are present in the buffering stage 16 adjacent to the conveyor unit 12 which is itself adjacent to the test stage 11a and 11b. (See FIGS. 1 and 6a) Discussion is provided hereinafter as to how and when the components are delivered to the appropriate buffering stage 16 and how the buffering stage 16 facilitates the transport of components. Also discussed later is the scheme used to decide which PCB type (A or B) is to be given the highest priority in terms of utilization of the test stage 11. The example illustrates only the physical operations and motions that take place in order to test the three specific PCBs in this discussion.

Generally, as shown in FIG. 11a, components required to perform the desired test are transported to, loaded into and aligned in the automation interface 38, the test is invoked, and then components no longer needed are unloaded and transported from the automation interface. In the illustrated example, the cover assembly 62 is employed to test all three boards and fixture A used in the test of both Type A PCBs. More particularly, as depicted in FIG. 11a test fixture A is first transported to automation interface 38, aligned and engaged with receiver 56. Cover assembly 62 is next transported to and loaded into the automation interface. The first Type A PCB is then transported to the automation interface and aligned with fixture A. The test is then invoked followed by unloading and transport of the first PCB Type A from the automation interface. The second PCB Type A can then be transported to the automation interface, aligned with fixture A, tested, unloaded, and transported from the automation interface. To test the Type B PCB, fixture A is unloaded and transported out of the automation interface and fixture B then transported in and aligned and engaged with receiver 56. The Type B PCB can then be transported to the automation interface, aligned with fixture B, tested, and finally unloaded and transported out of the automation interface.

In FIG. 11a, the procedure labelled (i) is expanded in FIG. 11a(i) to show the low-level operations needed to transport a component from the buffering stage 16 to the automation interface 38. Since this sequence of operations is repeated for different components, it is generalized for any component. Similarly, the low-level operations needed to load a fixture assembly onto the test stage, load a cover assembly into the automation interface, load a PCB onto a fixture assembly, invoke a test of a PCB, unload a PCB from a fixture assembly, transport components from the automation interface to the buffering stage 16, and unload a fixture from the test stage are labelled (ii) through (viii), and are detailed in FIGS. 11a(ii) through 11a(viii), respectively.

In FIG. 11a(i), the following operations take place to transfer a component from the buffering stage to the automation interface. The number designations correspond to the blocks in the FIGURE.

(1) The rails 44 of the automation interface 38 are elevated to the operating level of the conveyor unit 12.

(See FIG. 7c) The number of motor steps required to elevate the rails to this level is known by the workstation controller.

(2) The rails are extended so that the slots 45 in the rails can support the projecting ridges 58 of the fixture assembly 47, the projecting ridges 29 of the carrier 20, or the projecting ridges 63 of the cover assembly 62.

(3) The arm 98 of the assembly in FIGS. 7 and 7a is extended so that the roller 39 will contact the side of a component when it is captive in and supported by the rails 44. The sides of components include: sides 48a or 48c of the fixture assembly 47, sides 22a or 22c of the carrier 20, and sides 64a or 64c of the cover assembly 62.

(4) The dc motor 96 attached to arm 98 is energized an a controlled fashion so as to cause the component to move into the automation interface 38.

(5) The dc motor 34 in the conveyor unit 12 is energized in a controlled fashion so as to cause the component to move toward the automation interface 38. When the side of the component contacts the roller 32 in the conveyor unit 12, it is transported through the conveyor unit 12. (See FIG. 5e) (The buffering stage 16 causes the component to contact the rollers 32, but the exact method is discussed later.) When the component exits the conveyor unit 12, one of its sides contacts the roller 39, and it is driven into the automation interface. (See FIGS. 6b, 6c and 6d).

(6) The dc motor 34 is de-energized.

(7) The dc motor 96 is de-energized.

(8) The arm 98 is retracted, so that the roller 39 is not in contact with the side of the component.

In FIG. 11a(ii), the following operations take place to load a fixture onto a test stage:

(9) The rails 44, supporting the fixture assembly, are lowered by the stepper motor 36, via a system of belts, (See FIG. 7d) until the contact panel plate 54 is brought into preliminary engagement with the receiver, and the fixture assembly is supported by the receiver. The number of motor steps required to vary the elevation of the fixture assembly in this manner is known by the workstation controller.

(10) The rails 44 are retracted so that the fixture is no longer supported by the rails (See FIG. 7c).

(11) The means to establish electrical connection between the probes 57 of the receiver 56 and the posts 53 of the fixture assembly 47 is now activated. The fixture is now ready to be used for testing.

In FIG. 11a(iii) the following operations take place to load a cover assembly into the automation interface:

(12) The rails 44, supporting the vacuum cover assembly 62, are now lowered until the vacuum cover assembly 62 is supported by the fixture assembly 47. The number of stepper motor steps required to effect this motion is known by the workstation controller.

(13) The rails 44 are retracted. (See FIG. 7c)

(14) The lifting carriage 85 is lowered until it contacts the cover assembly 62.

(15) The solenoids 87 are extended, engaging the support holes 88.

(16) The lifting carriage 85 is raised, carrying the cover assembly 62, locked to it by the solenoids 87. FIG. 11b shows the cover assembly 62 locked to and raised by the lifting carriage 85.

In FIG. 11a(iv), the following operations take place to load a PCB onto a fixture assembly:

(17) The rails 44, supporting a carrier 20 and PCB 19, are lowered until the carrier 20 is resting on the fixture assembly 47. The number of stepper motor steps to do this is known by the workstation controller.

(18) The rails 44 are retracted. (See FIG. 7c)

In FIG. 11a(v), the following operations take place to invoke the testing of a PCB:

(19) The lifting carriage 85, to which the cover assembly 62 is attached, is lowered until the cover assembly rests on the carrier 20.

(20) The chamber beneath the vacuum cover diaphragm 65 is evacuated establishing electrical contact between the probes 57 of the fixture assembly and the nodes of the PCB.

(21) The test is executed. This function is carried out by commercially available equipment.

(22) The chamber beneath the vacuum cover diaphragm 65 is allowed to return to atmospheric pressure at the completion of the test.

(23) The lifting carriage 85, supporting the cover assembly 62 is raised.

In FIG. 11a(vi), the following operations take place to unload a PCB from a fixture:

(24) The rails 44 are extended. (See FIG. 7c)

(25) The rails 44, supporting a component, are elevated to the operating level of the conveyor unit 12. The number of motor steps required to effect this motion is known by the workstation controller.

In FIG. 11a(vii), the following operations take place to transport components from the automation interface 38 to the buffering stage 16. This sequence is similar to that illustrated in FIG. 11a(i) except the order is reversed.

(26) The arm 98 is extended, making contact between the side of the component and the roller 39.

(27) The dc motor 34 in the conveyor unit 12 is energized in a controlled manner so as to cause components to move toward the buffering stage 16.

(28) The dc motor 96 in the automation interface 38 is energized in a controlled manner so as to cause components to move toward the buffering stage 16.

Steps (27) and (28) cause the component to move toward the buffering stage 16. The buffering stage 16 cooperates with the conveyor unit 12 so as to move the component completely off the conveyor unit 12. This cooperation is discussed later.

(29) The dc motor 96 is de-energized.

(30) The dc motor 34 is de-energized.

The second PCB type A is then loaded onto the type A fixture in the automation interface, tested, and unloaded and transported from the automation interface. In the example, PCB types A are no longer going to be tested. Consequently, fixture A must be exchanged for fixture B on the test stage. It should be noted that in this example, the same cover assembly 62 is used with both PCB types A and B. The carriage lift assembly 85 can be used to raise the cover assembly 62 above the operating level of the adjacent conveyor unit 12, making it possible to exchange fixtures without removing the cover assembly 62 from the automation interface 38. This decreases the time required to set up the test stage for a different PCB type, and makes the operation of the system more efficient.

In FIG. 11a(viii) the following operations take place to unload a fixture assembly from a test stage so that it can be transported out of the automation interface:

(31) The rails 44 are retracted. (See FIG. 7c)

(32) The rails 44 are lowered to a height which will facilitate the engagement of the rails with the projecting ridge 58 of the fixture assembly 47. (See FIG. 7c) This height, and the number of stepper motor steps which correspond to it, are known by the workstation controller.

(33) The means to establish electrical contact between the probes 57 of the receiver 56 and the posts 53 of the contact panel 54 are deactivated.

(34) The rails 44 are extended.

(35) The rails 44, supporting fixture A, are elevated to the operating level of the conveyor unit 12. The number of motor steps required to effect this motion is known by the workstation controller.

The steps shown in FIGS. 11a(i), (ii) and (iv)–(viii) are then repeated for the type B PCB.

It should be noted that the system 10 of the present invention can also be utilized with double-sided PCBs, i.e. PCBs which have nodes on both opposing surfaces which must be accessed in order to test the PCB. In this event a second fixture assembly 47' is transported and positioned adjacent the PCB to be tested, i.e. the PCB is sandwiched between the two fixture assemblies. See FIG. 11c. In the preferred embodiment the array of probes 51' of the upper fixture assembly 47' are electrically connected to an array of posts 53'. Such posts 53' of this upper fixture assembly are, however, supported in plate 54' exterior to that portion of its surface area which is directly opposite the PCB when the PCB is positioned adjacent thereto. In addition the lower fixture assembly 47 contains an array of probes 51 which are adapted to contact the posts 53' of the upper fixture assembly when the vacuum or other actuating means draws the various components together.

It should be noted that circuit means other than the fixture assemblies 47 thus far described can be utilized as part of the present invention to achieve electrical contact with the selected nodes of the PCB to be tested.

As has previously been discussed, the present invention includes one or more buffering stages 16. The buffering stages serve as an interface which connect the various test, repair, input output, storage and other stations that make up a system to the common transport system 18. From the example illustrated in FIG. 11a, one can see that the buffering stages can be used to store (or "buffer") components that are used in the test station. Similarly, in the preferred embodiment, components can be buffered at each station. For this reason every test, repair etc. station includes and is joined to the transport system 18 through a buffering stage 16. From FIG. 1a, it is apparent that components are transported into and out of buffering stages 16. It is also apparent that only one component can be transported in a conveyor unit 12 or 13 at a time, and consequently the buffering stages 16 provide a location where components can be buffered until the conveyor units are free. (The methodology for allocating the conveyor units is discussed later.) Since the transport system 18 transports components at an elevation which can be different from the elevation in the workstations, the buffering stages provide a means to vary the elevation of components between the two levels: Such buffering stages 16 (See FIGS. 12 & 13) include a large receptacle 70 having internal wall portions 71 forming a plurality of slots or cells adapted to receive and support the carriers 20, the fixture assemblies 47 and the cover assemblies 62, in a manner permitting them to move interchangeably in or out of the receptacle 70. The receptacle 70 is supported within a frame 72 so as to be moveable in a generally upward or downward direction with respect to the operating level of the conveyor units 12 or 13.

Typically this movement is achieved by driven pinion gears 73 rotatably mounted on opposing sides (only one is shown) of the receptacle 70. The pinion gears 73 are driven by a conventional stepper motor (not shown). Corresponding slotted racks 75 which are adapted to engage such pinion gears 73 are fixed to the two adjacent sides (only one is shown) of the frame 72. In this manner the rotation of the pinion gears 73 by the stepper motor will move the receptacle 70 in either an upward or downward direction, to afford the positioning of the receptacle 70 with any preselected one of its cells at the operating level of the conveyor units 12 or 13. The operation of a buffering stage 16 as it relates to adjacent conveyor units 12 is illustrated in FIGS. 12a through 12c. In these figures, the frame structure of the buffering stage is not shown so that the functionality can be better illustrated. The dc motors, stepper motor, rack and pinion gear of the buffering stage 16 and the drive means of the conveyor units (dc motor 34, belt 203, sprockets 204 and rollers 32) are also not shown.

In FIG. 12a, a carrier 20 is shown driven partly into a conveyor unit 12 labelled "left". FIG. 12b shows the carrier partially driven into the receptacle 70, where the projecting ridges 29 of the carrier 20 are supported by the slots in the internal wall portions 71. The means by which the carrier is driven into the receptacle 70 is discussed later. In FIG. 12c, the receptacle 70 is shown elevated so that the carrier is at the operating level of the conveyor unit labeled "right", and the carrier 20 is shown as it is being transported from the buffer stage 16 to this conveyor unit. To facilitate the accurate and aligned movement of the receptacle 70 it is mounted with respect to the frame 72 by a plurality of bushings 77 slideably supported on columns 78 which are in turn affixed to frame 72. The buffering stages 16 also contain two drive wheels 76 driven by a dc motor and two idler tension wheels 210. These drive wheels 76 and idler tension wheels 210 are pivotally mounted on frame 72 at the operating level of the conveyor units 12 and 13. This is illustrated in FIG. 13a. In this figure, the two dc motors 209 are shown at the operating levels of the two conveyor units. These motors are each mounted, to a respective bracket 98' which is mounted upon a supporting column 97' (See FIG. 13b). The supporting column 97' is in turn mounted to the frame 72. The idler tension wheels 210, similarly mounted to supporting columns 97", are mounted to the opposite side of the buffering stage 16. To provide clearance for the receptable 70, so that it can be driven up and down loaded with components within the frame 72, by the stepper motor via the rack and pinion mechanism, a solenoid 79 or comparable device is used to pivot the drive wheels 76 and idler tension wheels 210 in a manner similar to that described with regard to the automation interface 38, from a position at which they are in frictional contact with the parallel side members of either the carrier 20, the cover assembly 62, or the fixture assembly 47 which is within the cell of the receptacle 70 positioned at the operating level of the conveyor units 12 and 13, to a second position which is spaced from the receptacle 70. It should be noted that the receptacle 70 contains cut out portions within the wall portions 71 to permit the drive wheels 76 and idler tension wheels 210 to intrude within the interior of the receptacle 70 so as to contact the various carriers 20, fixture assemblies 47 and cover assemblies 62 located therein. The stepper motor of the buffering stage is controlled by the workstation controller to facilitate the exact vertical positioning of the receptacle. The timely pivotal action effected by solenoids 79 and controlled rotation of the drive wheels 76 are also controlled by the workstation controller. Appropriate sensors of the types already described are included (See FIG. 14) to verify the presence of a carrier 20 or other transported article within the cells of the receptacles 70. Similarly sensors also verify the relative positioning of the receptacles 70 and the drive wheels 76, and the idler tension wheels 210.

It should be noted that buffering stages 16 are also designed to be modular, and a variety of configurations are therefore possible. For example, multiple slave buffering stages 16 can be stacked adjacent one another for mass storage of cover assemblies 62, fixture assemblies 47, and carriers 20. In this configuration it is useful to have separate drive wheel 76 and a corresponding dc motor on the side of the buffering stage 16 proximate to a conveyor unit, and separate drive wheels 76 and a corresponding dc motor oh the side of the buffering stage 16 Proximate to adjacent buffering stage 16. This affords more accurate control over the carriers 20, fixture assemblies 47, and cover assemblies 62 as they are being transported between adjacent buffering stages 16. The drive wheels 76 in buffering stages of such a storage station S are preferably all at the same vertical height. It is also possible with this configuration to utilize a master buffering stage controller or microprocessor connected to multiple slave buffering stages (See FIG. 14). This concept has already been discussed with respect to the conveyor units 12 and 13. The slave buffering stages while containing similar motors, sensors, and stops, do not require separate microprocessors. Alternatively, or in addition, buffering stages 16 can be utilized as interface devices to individual repair or test stages. This configuration can shorten overall testing and repair time since, as an example, a batch of carriers 20 containing PCBs 19 requiring the same fixture assembly 47 can be stored proximate a given test stage and immediately sequenced through that test stage as it becomes available. In this configuration it is useful to have separate drive wheels 76 and a corresponding dc motor operating at different vertical levels within the buffering stage 16. For example components could enter and exit the buffering stage 16 from or to an adjacent conveyor unit at the conveyor operating level, while at the same time entering from or exiting to an adjacent test stage at the operating level of such test stage.

When the test system 10 according to the present invention is initially installed the User will be required to identify certain information about the system configuration and the PCBs that are to be tested and/or repaired. This information includes the type of test stages 11, repair stages 15, conveyor units 12, conveyor units 13, and buffering stages 16 (hereinafter referred to generically as "modules") which will make up the system 10, as well as the relative location of each of these modules within the system 10. It is possible with this system 10 to create a large variety of different physical configurations using the standard modules as described Several example configurations are shown in FIG. 13d. It also seems very likely that an installed system may be modified from time to time for purposes such as the addition of new modules or the creation of additional or alternate paths to high volume modules, etc. In a traditional automation system these changes would require the user to experience a relatively long period of production shut-down in order to make several mechanical and/or software revisions to be able to use the newly configured system. An important benefit of the present invention is that such changes are possible with a minimum of down-time and virtually no software changes. Since this system is comprised of a relatively small set of modules whose functions are known, any configuration of the system can be reduced to a list of modules, their types, and the necessary relationship between them with regard to control and orientation. Rather than forge the user to determine the desired layout by paper and pencil methods and later input a fairly large amount of data, the present invention provides a convenient method for arranging the modules of a system and at the same time automatically capture the required data to operate the system 10. During the initial start-up the master control unit 17 presents the user with a grid pattern on a graphical display device, and a menu upon which the various potential modules are represented schematically, e.g. by icons. These icons may be selected by the user and placed on the grid. In this manner a configuration may be built up in an interactive way which represents the desired configuration of the system. The user may remove and replace modules, select new module types, and reconfigure the module orientations until the configuration appears as desired. The configuration may be an entirely new layout, or an existing configuration may be recalled and "edited" to achieve the desired result. A configuration may be "saved" at the request of the user to be used either as the default or controlling configuration file for the new system or as reference when considering more than one possible configuration for the system. Once the desired physical layout has been determined by the user a verification routine may be invoked. The verification routine applies a set of design rules regarding module placements and orientation to be certain that the proposed configuration is operable. An example would be that a corner of the transport system must contain a conveyor unit 13 with rotation capability. Should an error be located the user is informed of the conflict and the input phase is reinstated. After passing the rule check the user is then prompted for the additional data required to define the configuration which is not ascertainable from the graphic representation, such as controller ID numbers and the desired interconnections of slaves units to master controllers. Once this information is entered a user may request the system 10 to print out a configuration listing. This listing describes the configuration, for example, a list of the modules used by type, a connection list for cables (including power, logic, air, etc.) by module, etc. This listing aids the user in the actual physical connection of a new configuration. By using this interactive method new configurations may be efficiently created by the user, and the resulting data file will automatically contain the required information to allow the system 10 to be controlled without requiring any additional input or changes to the control system software.

Once the configuration is established a software routine within the operating system recognizes the icons and provides each module with a unique identity code (typically based upon the controller ID). The routine then identifies the interconnections between the modules and constructs all the possible paths between the various modules indicated and the required operation of the various modules to facilitate these paths. The operating system utilizes this information to construct a table which correlates all the ways to get from the various starting modules (e.g. buffering stage 16) at which component may be located to the various destination modules (e.g. test stage 11) to which a component will be transported. Such techniques as are required to formulate this information are commonly available as evidenced by a text entitled, "Computer Algorithms", written by Sara Baase, and published by Addison Wesley, 1978, the teachings of which are incorporated herein by reference. A file, hereinafter referred to as the system configuration file, is created containing this configuration and path information. This file is stored either in the memory associated with the master control unit 17 or a host computer interfaced with the master control unit 17, or within a disk file which can be provided as an input to the master control unit 17 when the system 10 is to be used. This modular approach of the present invention and the ease in which configuration changes can be programmed or specified, affords the user flexibility to easily adapt the configuration of the system 10, to tailor the system 10 to the particular user requirements.

Prior to testing and/or repairing PCBs with the system 10, the user is also required to input information pertaining to the various types of PCBs which are to be tested, and the testing sequence which will be required to process each PCB type. Each step in the sequence is performed by some test or repair stage which provides, as a result, a coded indicator (interpreted by the master control unit 17) to determine which of possible alternate steps of the sequence is to follow For example, a specific type of PCB might need to be tested first with a functional tester. If it fails these tests, (as indicated by the result supplied by the tester) the PCB may secondarily be tested on an in-circuit tester. Alternatively, the results may indicate that the PCB needs to be transported to a repair station instead of the in-circuit tester. After repairs and/or adjustments are made to the PCB it may be routed to the functional tester to repeat the tests which it previously failed. Similarly, certain test results may require the performance of certain tasks such as manually probing various nodes of the PCB. The PCB would therefore have to be routed to a module affording such tasks. Thus a unique process sequence is determined for each type or batch of PCB which is to be tested. This information is stored as a decision tree or similar device, where the process steps form the nodes of the tree and the coded indicators determine the branches between nodes. The sequence information and a base priority code (associated with the PCB type and used by the system in processing PCBs of this type) are stored in a file, hereinafter referred to as the process sequence file, which can be provided as input to the master control unit 17 The decision tree includes all the various sequential events which can take place in order to test that PCB type. The path through the tree for a particular PCB is dictated by the actual results of each event (i.e. process step) as they occur. As is apparent, the tree will typically have multiple branches due to the alternative results which might occur at a given ,node, e.g. pass, fail, etc. Methods for creating, storing and performing operations on such "tree" structures are readily available as evidenced by a text entitled "Data Types and Structures" by C. C. Gotlieb and Leo R. Gotlieb published by Prentice Hall in 1978 (reference chapters 6 and 7).

An example process sequence file is shown in FIG. 14a. In this figure, each node of the tree is shown as an overlapping group of labelled boxes. With each node in the tree, there are identified the process name (e.g. functional test, repair), the physical location in the system where the process can take place (e.g. test stage 11a or test stage 11b, repair stage 15) and a reference to any associated components (e.g. a particular type of fixture assembly 47) required to "set-up" and complete the process of that node. The coded indicators associated with the results of the process are indicated as triangles with internal labels. The results of each operation are used to determine which step will occur next for a particular board being processed. The results are supplied to the master control unit by the workstation controllers and are not the detailed output of the test stage. A base priority is associated with each process sequence file. The priority is used as described hereinafter to regulate resource allocation between board types. In addition, a file is created which contains a look-up table or similar device correlating a PCB type to a fixture assembly 47 which corresponds to such PCB type. This file, hereinafter referred to as a fixture correlation file, is also provided as input to the master control unit 17. Also included within the fixture correlation file is a listing of any other components such as cover assemblies 62 or upper fixture assemblies 47' which will be required to test and/or repair that PCB type. Typically the process sequence file and the fixture correlation file will correlate the PCB type to the corresponding components by utilizing a serial number located on the PCB, of which certain digits refer to the PCB model or type, and the remaining digits uniquely identify each individual PCB of that type. In the preferred embodiment, this serial number is associated with the particular carrier in which the PCB is mounted. The carrier is uniquely identified by a bar code sticker permanently affixed to the carrier which can be automatically scanned by the test system 10 according to the present invention. Thus once the bar code for a given PCB is scanned, the operating system can search the process sequence file through the master control unit 17 and ascertain the various stations within the test system which will be required to test that particular PCB 19. Similarly the fixture correlation file can also be searched to identify the other components which will be required to test that PCB. A message can be displayed to the operator to make certain that the correct fixture assemblies 47 and, depending upon the size of the batch of PCBs to be tested, an adequate number of cover assemblies 62 and fixture assemblies 47, etc., are loaded within test system 10. In the preferred embodiment, fixture assemblies 47 and cover assemblies 62 are stored within a storage station S when not in use. The carriers 20 (containing the PCBs 19 which are to be tested) can then be individually inserted into the test system 10 or these components can be stored within a buffering stage 16 and automatically transported by the conveyor means. In the preferred embodiment a file, hereinafter referred to as the component location file, is created containing component location information and is maintained by the master control unit 17. In this manner the loading and unloading of the various test stages 11 and 15 and the transport of the various fixturing assemblies 47, cover assemblies 62, and PCBs 19 can be facilitated by the master control unit 17 in conjunction with distributed controllers of the test system 10. It should be noted that the information thus far described as being required as input can be provided through standard input (e.g. keyboards, magnetic storage devices, LAN connections with another computer, etc.) interfaces (See FIG. 14) to the master control unit 17.

In the preferred embodiment of the present invention, a component input/output station 80 is included within the system 10. The basic input/output station 80 comprises a conveyor unit 12 combined with a bar code reader 81 and buffering stage 16. Since the carrier 20, the fixture assembly 47 and the cover assembly 62 all have the same outer configuration, the input/output station 80 can be utilized as a system input/output device for all components. Accordingly, a bar code can be placed on all components to provide an identity to the master control unit 17. Upon insertion of a component into the input/output station 80, the bar code reader 81 would scan the component and input the serial number associated with the component to the master control unit 17. The master control unit 17 could then ascertain a destination for the component by examining the process sequence file, e.g. an empty cell within a buffering stage 16, and direct the conveyor units to transport the component to that cell. The identifying number for the component and a code identifying the destination, e.g. the buffering stage 16 and the particular slot within that stage are stored in the component location file. As the components are processed by the system 10 this component location file is dynamically updated to provide an indication of the current location of each of the components.

Reference is now made to FIG. 14b, 15 and 15a for a description of the overall operation of test system 10. During start-up of the test system 10 the master control unit 17 reads the system configuration file to determine what modules exist within the test system 10 as well as their functions and relative locations. The master control unit 17 then initializes the system configuration by interrogating each of these various modules over the network 14 and determining whether the modules are on-line and functioning. If a particular module is not functioning the user is so informed. This module can then be mapped out of the system or the malfunction can be corrected as determined by the user. The control programs for each of the microprocessors located within the various modules are then downloaded from the master control unit 17.

FIG. 14b depicts a control structure for the system 10 of FIG. 1, in a block diagram fashion. The master control unit 17 is shown at the top of the figure with local area network 14 connecting it to the various controllers. Each station of the system 10 is equipped with a microprocessor controller. Additionally, each conveyor unit 13 contains a microprocessor controller for it and some number of slave conveyor units 12. This distributed controller approach gives the master control unit 17 control over all aspects of the system 10 without requiring that all software be executed on the master control unit.

In the preferred embodiment, the controller for storage station S is housed in one of the buffering stages 16 making up the station. This controller operates the buffering stages 16 on direction from the master control unit 17 to effect the storage and retrieval of components.

The controller for each conveyor unit 13 is housed in the base of the unit and controls the conveyor unit 13 and slave conveyor units 12 on direction from the master control unit 17. In the preferred embodiment each conveyor unit 13 in a system is equipped with a microprocessor controller. The master control unit 17 coordinates activity between the controllers of the conveyor units 13 to effect the transfer of components between stations of the system 10.

Each test station containing a test stage 11 contains a microprocessor controller. In the preferred embodiment, the controller operates the buffering stage 16, the conveyor unit 12, the automation interface 38, and the test stage 11a or 11b of the station on direction from the master control unit 17. The controller additionally ascertains, through an interface with the test stage, the result of any test which is performed. This result (for example PASS/FAIL) is later used by the master control unit 17 in routing the PCB 19 to any subseguent station.

The microprocessor controller in the repair station controls the buffering stage 16, the conveyor unit 12, the bar code reader 81, and the repair stage 15 in the repair station, on direction from the master control unit. In a manner similar to the test station, the controller in the repair station also appraises the master control unit 17 of the completion of any repair activity to facilitate the routing of the repaired PCB 19.

The input/output station 80 contains a microprocessor controller which controls the buffering stage 16, the conveyor unit 12, and the bar code reader 81 of the input/output station on direction from the master control unit 17. In the case of the input/output station 80 the microprocessor controller also appraises the master control unit 17 of the arrival of a carrier containing a PCB 19 to be processed. In the message, the bar coded identity of the carrier 20 and the PCB 19 are provided to the master control unit 17. These items of information are maintained by the master control unit 17. The master control unit 17 also maintains the process sequence file which contains routing information and a base priority for the new PCB 19. The identity information is used in accordance with the process sequence file to control the path taken by the PCB 19 in response to the results from the stations to which it is sent.

The preferred embodiment of the present invention utilizes substantially identical microprocessors in the various modules and stores the specific control programs for the various types of modules in memory or in a file which can be down loaded to the various microprocessors as required. Each of the microprocessors is equipped with a ROM based monitor program which executes on power-up and readies the microprocessor to receive commands over the network 14. The specific control programs which are downloaded are determined by the configuration of the system and the specific modules employed. This concept along with the master/slave concept already discussed with regard to the conveyor units and the buffering stages affords the user lower costs and added flexibility for easily reconfiguring the system to tailor it to the particular requirements present. Furthermore it eliminates the need for fixed memory or disk drives at each module. Once the various control programs are loaded, the moveable members of the various modules are "homed" to known positions, and the appropriate sensors are interrogated to ensure that such homing has occurred. After every module has been checked and initialized in this manner the user is informed that the system is ready for use.

Testing and/or repair of PCBs within the test system 10 is done on a priority basis, with the intent of keeping the test and repair stages occupied to the fullest feasible extent. Through one of the various input devices, the user associates a base priority code for the PCB type dependent upon production requirements. When a PCB is entered into the system 10 as previously described it is assigned the priority code which was provided as input to the master control unit 17 as part of the process sequence file for PCBs of this type.. As has been previously stated, the master control unit 17 in combination with the bar code reader has already ascertained the identity and type of the PCB being supplied to the system 10 for test and/or repair. In the preferred embodiment of the present invention this priority code is dynamic. That is, a PCB awaiting an operation to be performed at a particular stage or module will have its priority code or rating increased in and by the master control unit 17 as a function of the time it is waiting. This prevents a PCB from being held at a given stage or module in the system for an unlimited period of time such as might be the case when it is preempted by a large batch of higher priority PCBs. The PCB priority rating returns to its base priority, i.e. that taken from the process sequence file, after the required operation has been performed at that particular module or stage. Since the PCBs must share the various modules, a pre-emptive scheduling technique is employed, in which operations on PCBs having the highest priority will generally be processed first. Scheduling algorithms to implement a pre-emptive type system are readily available as evidenced by a text entitled "Operating System Principles" by Brinch Hansen, published by Prentice Hall in 1973 (reference chapter 6).

A flowchart illustrating the dynamic priority scheme for any given PCB and the preemptive scheduling technique for using the dynamic priority to schedule the use of a test/repair station is provided in FIG. 15a.

The essential purpose of the control system of the present invention is to track and control the movement of PCBs between the various workstations. A mix of different board types must be tracked and controlled simultaneously. In a fully automatic manner the PCBs are routed from station to station with any necessary setup being performed as required. The method of establishing the rules, i.e. process sequence files, used to guide the different types of PCBs through the test and repair system, was described earlier. An example of how the rules are applied by the master control unit will now be provided. It should be remembered that although PCB routing is the primary function of the master control unit, it is by no means its sole activity. Monitoring the status of workstations and conveyor units is continuous as well as providing status reports on production ad equipment to a factory HOST computer on demand.

Basically the routing control portion of the master control unit software is an infinite loop, repeatedly examining the status of each printed circuit board within the control of the system and acting on any changes provided by workstation activity. This loop can be regarded as having two sections as shown in FIG. 15a. The top section determines all PCBs which have completed a step in their processing and ascertains the next required step. The bottom section applies load balancing and priority guidelines in order to determine which PCBs will be granted workstation time to proceed and which must wait.

As earlier discussed in connection with the creation of process sequence files, PCBs which are handled by the system are regarded as progressing in a step by step fashion. At the completion of a step, the product "asks" for the next step based on the result of the first, thereby taking a "route" determined by actual events. The steps are regarded as "processes" which may be any required action at some point in the manufacturing or testing of the PCB. These processes can be performed by workstations, with perhaps several stations being able to perform a process by virtue of a "setup" change. For example, several workstations may contain test equipment which can be used to perform tests on different types of PCBs with appropriate fixtures and test programs. Workstations are regarded as the system resources with processes competing for them. The determination of which workstations are performing some process for a given PCB type and for how long, i.e. a preemptive scheduling technique, is what will now be described.

A workstation which has performed some process step on a PCB notifies the master control unit of the completion of that step and any associated results, for example, pass or fail in the case of a testing step. Those PCBs for which such a completion message has been received since the last pass through the loop are considered ready to advance. For each such PCB the appropriate process sequence file is referenced, with different CCB types perhaps having different process sequence files. From the process sequence file for each PCB a determination is made of the next step or process required for the PCB, a base priority associated with the process sequence file is relegated to the PCB, and a "bid" for that process is registered on behalf of the PCB. This sequence is repeated for all PCBs which have been deemed ready to advance with the distinction that each PCB left waiting by the last pass through the loop has an increment applied to its priority before a new bid is registered. This is done to prevent a PCB with a low base priority from waiting indefinitely for higher priority PCBs to be processed.

Once all the bids for processes have been registered, the next section (labeled as "for every bidding process" in FIG. 15a) applies the priorities of the bids in order to make a selection of which processes will be performed at workstations. The selection may be done in essentially the following manner. Each process step for which a bid has been registered has associated with its process sequence file, a list of the workstations which may be used to perform that process, and also the identity of any fixture which might be required by the station. Contention for workstation time may be resolved by granting time to the process for which the total bid is highest. That is the sum of all the bids. If the workstation in contention is currently serving the highest bidder, PCBs requiring that step are advanced and will be physically routed to that station. In the case of more than one station serving a function, PCBs are routed to the station with the least product in its station buffer to keep stations balanced.

If the workstation in contention is serving another process step, it may be preempted. This means that any fixture change required will be invoked as well as any program changes needed by the station equipment. To prevent erratic behavior, preemption preferably causes two other events to take place. First, any process which is granted a preemption on a workstation is blocked from any further grant for a period of time. At the end of such time it may be granted a preemption on an additional workstation (if more than one workstation is listed in its process sequence file) under the same priority strategy. Secondly, any workstation which is preempted is blocked from further preemption by any other process, for a period of time based on an estimate of the time required to service half of the preempting PCBs. This is designed to prevent oscillation in the case of nearly equal priority competing processes. Of course, other known preemption schemes may alternatively be employed.

These steps are repeated for all processes requesting workstation time. PCBs which cannot be serviced at the end of this section are delayed and reconsidered in the first section of the next pass through the loop as noted earlier. In its preferred embodiment the system 10 will process multiple PCBs in parallel. For simplicity and clarity purposes, the discussion which follows will view the system 10 from the perspective of a single highest priority PCB under test. It should be noted, however, that generally other high priority PCBs are being processed concurrently, i.e. in parallel. The configuration file and appropriate process sequence files for such highest priority PCB are read by the master control unit 17. These files have been provided as input to the master control unit 17 by one or more of the alternatives previously described. The master control unit 17 will determine from these files the station which is required to perform the first testing or repair operations to such highest priority PCB. Similarly, the required other components, e.g., the fixture assembly 47 and cover assembly 62 for repairing and/or testing such PCB will also be established by reading the fixture correlation file. The master control unit 17 will then read the component location file to determine if such components are within the system and the present location of the required components and the PCB. If such components are not within the system 10 the user will be instructed to input such components. These other components required to test such highest priority PCB are then automatically transported to the required module. The master control unit 17 is designed to interrogate on a periodic basis the various sensors included within the system 10 to update the location information (as contained within the component location file) for all components within the system 10 and ensure that the required components are present and accounted for and that on a real time basis two or more components (e.g. carriers 20, fixture assemblies 47 and cover assemblies 62) never try to occupy the same space at the same time. Similarly the appropriate sensors will also be interrogated for the status of each of the modules within the system 10 which form the various paths available to transport the components, to ensure that the modules are functioning, available, and properly positioned for such transport. Methods for controlling the use of resources such as conveyor units and fixture assemblies by competing tasks (PCBs in this application) are readily adaptable from methods outlined for computer peripheral control in such text as "Operating System Design, The XINU Approach" by Douglas Comer, published by Prentice Hall in 1984 (reference chapters 12 and 16). In this optimum available path to such test and/or repair stages can be established for each component and the process of transporting such highest priority components from their present location to the required test and/or repair stages will begin. From the information contained in the configuration file, the master control unit 17 can ascertain the rotations of the rotating conveyor unit 13 and the direction of rotation of the dc motors 34 in the conveyor units 12 and 13 required to transport these components to the specified stages 11 or 15 and the instructions which will be required to be issued on the network 14 to the appropriate drivers within the various modules to perform the transport. Accordingly the master control unit 17 will timely activate the appropriate drivers to perform such transport. Similarly the appropriate sensors can be activated or interrogated to ensure that the required actions have taken place. This drive and sensor information is conveyed to and from the master control unit 17 via the network 14. Concurrently the component location file is dynamically updated as a result of such sensor information to, as previously described, continually track the location of the various components within the system. The master control unit 17 is therefore kept current as to whether a required module has performed the required operation. After such operation has been performed, and depending upon its priority rating the PCB will eventually be transported to the required test or repair station according to the order specified by the process sequence file. When all the required components are present at the specified test or repair station 11 or 15, the master control unit 17 will activate the station to begin performing the required operations. In the preferred embodiment the management of test data is performed by a host computer, not part of the present invention, interfaced with the master control unit 17 via the network 14. The particular test programs which are required to test the PCB are stored within the host computer and downloaded as required. The identity of the appropriate test program is part of the process sequence file. Furthermore the host can track the test history of the PCBs being processed in order to create management reports for the user.

The completion and results of the tests of a given PCB at a given workstation (e.g. PASS/FAIL) are conveyed to the master control unit by the controller of that workstation. The master control unit 17 via the process sequence file determines the next event or operation which is to occur. Assuming an adequately high priority, the required conveyor unit activation will be analyzed and carried out according to the process as has been described to facilitate this next event or operation. The master control unit 17 will thus read the process sequence file and ascertain the next test or repair stage required. If no additional test or repair operations are required, e.g. the PCB is finally accepted or rejected, the PCB will, according to its priority rating, be transported to the buffering stage 16 of the component I/0 station 80 for removal from the test system 10 as indicated by the process sequence file for PCBs of that type. If additional test or repair operations are required, the appropriate stages and modules will be interrogated and selected. In addition, the master control unit 17 will determine the associated components which will be required and which have been specified within the fixture correlation file. These may or may not be the same components used for the first test. If the appropriate fixture assemblies 47, cover assemblies 62, etc. are already within the system, their current location will be known by an entry within the component location file, otherwise such components and the relevant location information must be provided via one of the above mentioned input devices. A priority rating is effectively given to the fixture assembly 47, cover assembly 62, etc., based upon the current priority rating of the PCB being tested. Finally, the activation of the conveyor units which will be required to transport the components to such specified test or repair stage will be determined and initiated.

This process is repeated until such time as all test and repair operations to be performed by the system 10 have been completed. In the same manner as has already been described, the completed PCBs 19 and associated components are transported to the buffering stage 16 of the component I/0 station 80 for removal. If required, the system 10 will also allow the manual removal of a PCB and associated components at a test or repair stage 11 or 15. If this is done the master control unit 17 must be informed of such removal via the miscellaneous I/0 devices discussed, e.g. a bar code reader. It should be noted that, typically, fixture assemblies 47 and cover assemblies 62 will remain at a given test station until the tests requiring such components at that station are completed or until the master control unit 17 determines that the particular station will be required to test a higher priority PCB. This may, for example, occur when the sum of the priority codes for all the PCBs 19 of the same type (i.e., a new batch) which are being entered into the system 10 exceeds the sum of the priority codes for all of the PCBs 19 of the type currently under test (i.e., the batch being tested). In this event the fixture and/or cover presently in that station may be temporarily bumped or replaced by those required for the higher priority batch, as depicted in FIG. 11a.

Thus the system 10 according to the present invention is able to concurrently and automatically process PCBs (or other products) of different types, sizes, shapes, and configurations with little or no manual intervention required. It is able to do so in an accurate, timely, and cost effective manner, with maximized throughput, thereby substantially eliminating the aforementioned limitations associated with the prior art. It must be understood that the description of the present invention as set forth above does not attempt to recite all the advantages associated therewith nor does it attempt to recite in detail all the structure employed. Furthermore, for the sake of clarity and understanding, certain operations and the detailed structure of various components, which are considered to be within the scope of one skilled in the art in light of the teachings set forth herein, have not been discussed. Having thus described several embodiments of the present invention, it must also be understood that changes may be made in the configuration, size, makeup, shape, or order of some of the parts, circuits, or methods described herein without departing from the present invention as recited in the appended claims.

What is claimed is:

1. A method for operations to be performed on a product in a system, comprising the steps of:
    associating a unique indentity to each type product to be operated upon
    identifying the particular type of product to be operated upon to a controller,
    determining the configuration of the system and the availability of stations in the system to perform such operations, as well as an available direct path between each of such stations, and providing said availability and configuration determination as an input parameter to said controller,
    determining a desired process sequence for performing such operations, said sequence identifying operations and the order in which the operations are to be performed depending upon the results of the previous operations, and providing said sequence as an input parameter to said controller,
    transporting the product to stations in the system with conveyor means adapted to interface with and interconnect such stations, under control of said controller according to the order determined by said process sequence determination, and along direct paths between available stations determined by said availability and configuration determination, and
    operatively engaging such product in such stations according to the order as identified by said process sequence.

2. The method of claim 1 wherein the step of determining the configuration the system comprises designing the configuration on an interactive graphics display and automatically generating a corresponding system configuration file.

3. The method of claim 1 wherein the step of transporting the product to the stations comprises:
    mounting the product within a carrier having protruding side ridges; and
    interconnecting the stations with bi-directional modular conveyor units adapted to support the carrier by its side ridges and to impart motion to the carrier, as directed by said controller.

4. The method of claim 1 wherein multiple products are processed by the stations of the system simultaneously and further comprising the step of: determining the order of processing of products by the system in accordance with a dynamic priority rating system and a preemptive scheduling technique.

5. An automated multistation system for performing operations upon products, at least one of said operations requiring another component, comprising:
    input/output station for loading and unloading products and other components into and out of said system;
    a plurality of work stations;
    transport system means interconnecting all said stations for transporting products and said other components directly between any selected stations in either direction; and
    control means for supervising transport of said products and other components by said transport system means, operation of said input/output station means and activation of said work stations.

6. The automated system of claim 5 wherein said transport system means comprises an arrangement of interconnected modular conveyor units, each of said units being capable of selectively imparting movement in opposite directions to a product located thereon.

7. The automated system of claim 6 wherein at least one of said conveyor units is capable of rotating a product located thereon.

8. The automated system of claim 7 wherein said control means includes a conveyor controller associated with one of said conveyor units, said conveyor controller controlling the operation of more than one of said conveyor units.

9. The automated system of claim 5 wherein said control means further comprises:
    interactive graphic means to assist in developing and visually display a desired configuration of the system, and
    means connected to said interactive graphic means for automatically generating a system configuration file identifying system interconnections and control programs for the desired displayed configuration.

10. The automated system of claim 5 wherein said transport system means is adapted to transport components and wherein said components comprise:
  a universal carrier for mounting individual products, said carrier being adaptable to accomodate a range of sizes and configurations of products; and
  other items useful in performing said operations.

11. The automated system of claim 10 wherein all of said components have in common an exterior configuration which facilitates transportation by said transport system.

12. The automated system of claim 5 wherein said control means routes a product to stations in accordance with: a process sequence identifying the operations required and the order of performance of said operations for the particular type of product being processed, and the results of prior operations on said product.

13. The automated system of claim 12 wherein multiple products are processed in parallel and wherein said control means implements a dynamic priority rating system and pre-emptive scheduling technique for the multiple products.

14. The automated system of claim 13 wherein said control means tracks the location of the products and monitors the status of the stations and transport system means.

15. The automated system of claim 5 further comprising automated buffering stage means associated with at least one of said stations, said buffering stage means being capable of temporarily storing multiple products and interfacing with said transport system means.

16. The automated system of claim 15 wherein such an automated buffering stage means is associated with each station; and further comprising a storage station comprising tandem buffering stage means.

17. The automated system of claim 16 wherein at least one of said work stations comprises a test station; said test station comprising a test stage, automation interface means for loading and unloading products on said test stage, and buffering stage means; and
  wherein said control means includes a test station controller providing coordinated control over the operation of the buffering stage means, and automation interface means, and activation of the test stage.

18. The automated system of claim 5 wherein said control means comprises a master control means and a network of distributed individual station control means and transport system control means.

* * * * *

UNITED STATES PATENT AND TRADEMARK OFFICE
CERTIFICATE OF CORRECTION

PATENT NO. : 4,850,104

DATED : July 25, 1989

INVENTOR(S) : Matrone et al.

It is certified that error appears in the above-identified patent and that said Letters Patent is hereby corrected as shown below:

Claim 1, line 51 insert --automating-- between "for" and "operations".

Claim 1, line 52 insert --multi-station-- between "a" and "system".

Claim 1, line 60 insert -- pair-- between "each" and "of".

Claim 5, line 34 insert --means-- between "station" and "for".

Signed and Sealed this

Second Day of October, 1990

Attest:

HARRY F. MANBECK, JR.

*Attesting Officer*     *Commissioner of Patents and Trademarks*